(12) United States Patent
Nagata et al.

(10) Patent No.: US 7,304,418 B2
(45) Date of Patent: Dec. 4, 2007

(54) LIGHT SOURCE APPARATUS WITH LIGHT-EMITTING CHIP WHICH GENERATES LIGHT AND HEAT

(75) Inventors: Mitsuo Nagata, Suwa (JP); Tomo Ikebe, Chino (JP)

(73) Assignee: Seiko Epson Corporation, Tokyo (JP)

( * ) Notice: Subject to any disclaimer, the term of this patent is extended or adjusted under 35 U.S.C. 154(b) by 105 days.

(21) Appl. No.: 10/967,283

(22) Filed: Oct. 19, 2004

(65) Prior Publication Data

US 2005/0110395 A1    May 26, 2005

(30) Foreign Application Priority Data

Oct. 24, 2003   (JP)   ............... 2003-365008
Oct. 24, 2003   (JP)   ............... 2003-365009
Jan. 23, 2004   (JP)   ............... 2004-015702
Jul. 2, 2004    (JP)   ............... 2004-196558

(51) Int. Cl.
*H01J 1/02* (2006.01)
*H01J 7/24* (2006.01)
*H01L 23/48* (2006.01)

(52) U.S. Cl. ............ 313/32; 313/498; 313/11; 313/30; 313/512; 257/675; 362/800

(58) Field of Classification Search ........ 313/512, 313/46
See application file for complete search history.

(56) References Cited

U.S. PATENT DOCUMENTS

| | | | | |
|---|---|---|---|---|
| 4,807,238 A | * | 2/1989 | Yokomori | ............ 372/32 |
| 5,986,885 A | * | 11/1999 | Wyland | ............ 361/704 |
| 6,339,605 B1 | | 1/2002 | Vetrovec | |
| 6,498,355 B1 | * | 12/2002 | Harrah et al. | ............ 257/99 |
| 6,614,058 B2 | | 9/2003 | Lin et al. | |
| 6,639,356 B2 | * | 10/2003 | Chin | ............ 313/499 |
| 6,646,491 B2 | * | 11/2003 | Worley et al. | ............ 327/514 |
| 6,917,143 B2 | * | 7/2005 | Matsui et al. | ............ 313/35 |
| 7,224,047 B2 | * | 5/2007 | Carberry et al. | ............ 257/676 |
| 2002/0121683 A1 | * | 9/2002 | Kelly et al. | ............ 257/675 |
| 2002/0149312 A1 | * | 10/2002 | Roberts et al. | ............ 313/495 |
| 2003/0001657 A1 | * | 1/2003 | Worley et al. | ............ 327/514 |
| 2003/0057421 A1 | * | 3/2003 | Chen | ............ 257/79 |
| 2003/0184220 A1 | * | 10/2003 | Chin | ............ 313/512 |
| 2005/0253252 A1 | * | 11/2005 | Owen et al. | ............ 257/714 |
| 2006/0082271 A1 | * | 4/2006 | Lee et al. | ............ 313/35 |
| 2007/0001564 A1 | * | 1/2007 | Park | ............ 313/46 |

FOREIGN PATENT DOCUMENTS

| | | |
|---|---|---|
| DE | 42 28 274 A1 | 3/1994 |
| DE | 43 15 580 A1 | 11/1994 |
| EP | 0 508 717 A1 | 10/1992 |
| JP | 47-033586 | 11/1972 |
| JP | 47-045186 | 12/1972 |
| JP | 51-024871 | 2/1976 |
| JP | A 55-070080 | 5/1980 |

(Continued)

*Primary Examiner*—Joseph Williams
*Assistant Examiner*—Peter Macchiarolo
(74) *Attorney, Agent, or Firm*—Oliff & Berridge, PLC

(57) ABSTRACT

A light source apparatus includes a light emitting chip which generates light and heat when energized via a first electrode and a second electrode, wherein the first electrode is a base on which the light emitting chip is directly packaged.

14 Claims, 30 Drawing Sheets

| | FOREIGN PATENT DOCUMENTS | | | JP | A-07-099372 | 4/1995 |
|---|---|---|---|---|---|---|
| JP | A 55-120081 | 9/1980 | | JP | A 09-223846 | 8/1997 |
| JP | A 57-005356 | 1/1982 | | JP | A-11-065477 | 3/1999 |
| JP | A-57-017570 | 1/1982 | | JP | A 2001-007352 | 1/2001 |
| JP | U 04-092658 | 8/1992 | | JP | A 2002-084029 | 3/2002 |
| JP | A-06-005923 | 1/1994 | | JP | 2005079150 A * | 3/2005 |
| JP | U-06009158 | 2/1994 | | | | |
| JP | A 07-007185 | 1/1995 | | | | |

* cited by examiner

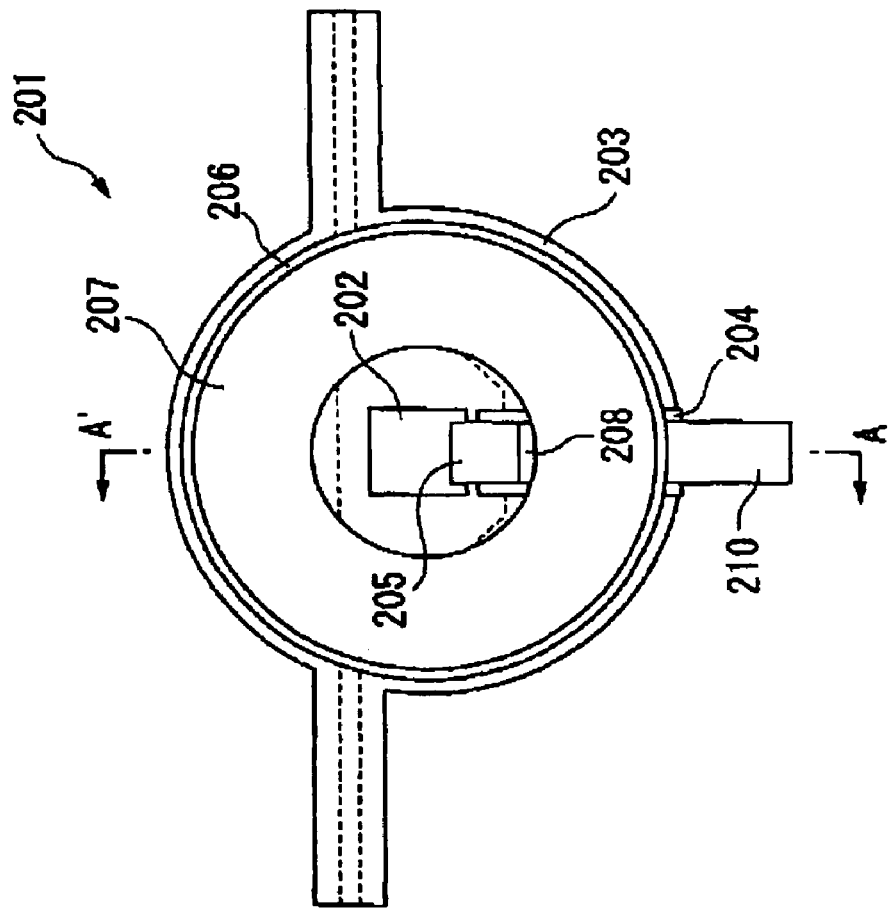
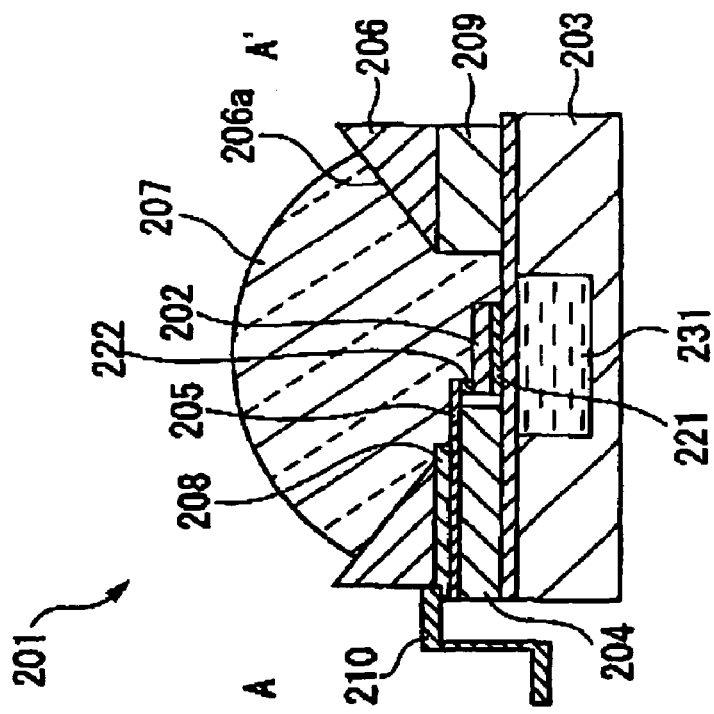
FIG.14A
FIG.14B

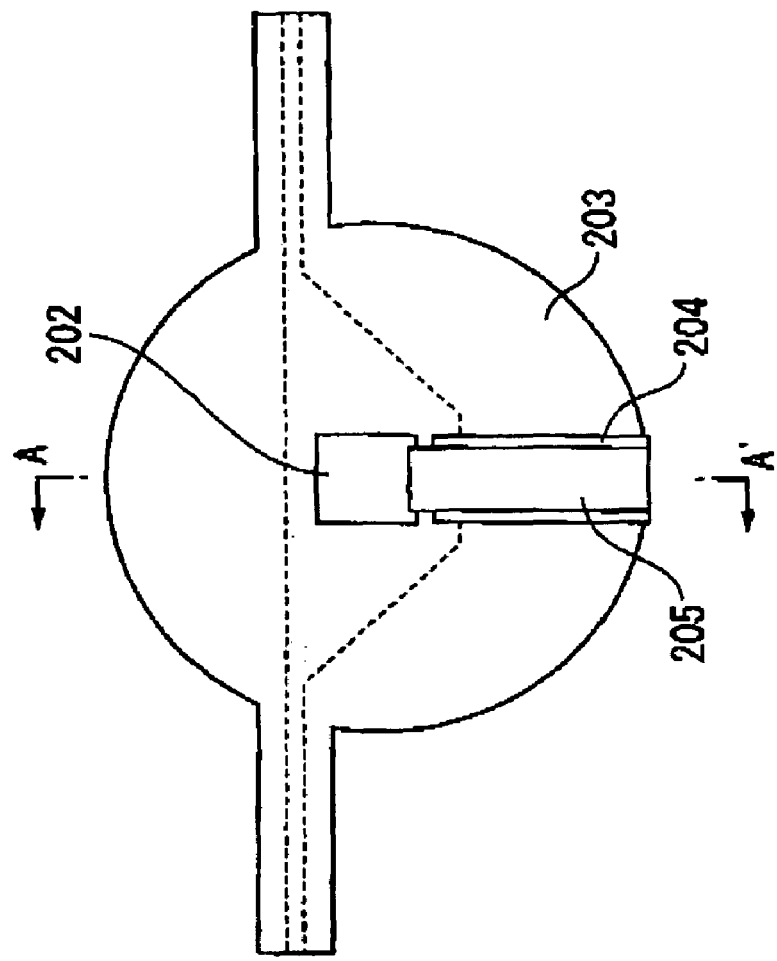
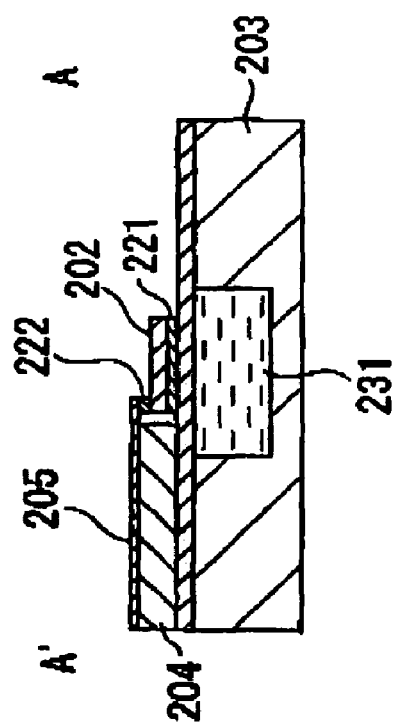
FIG.17A
FIG.17B

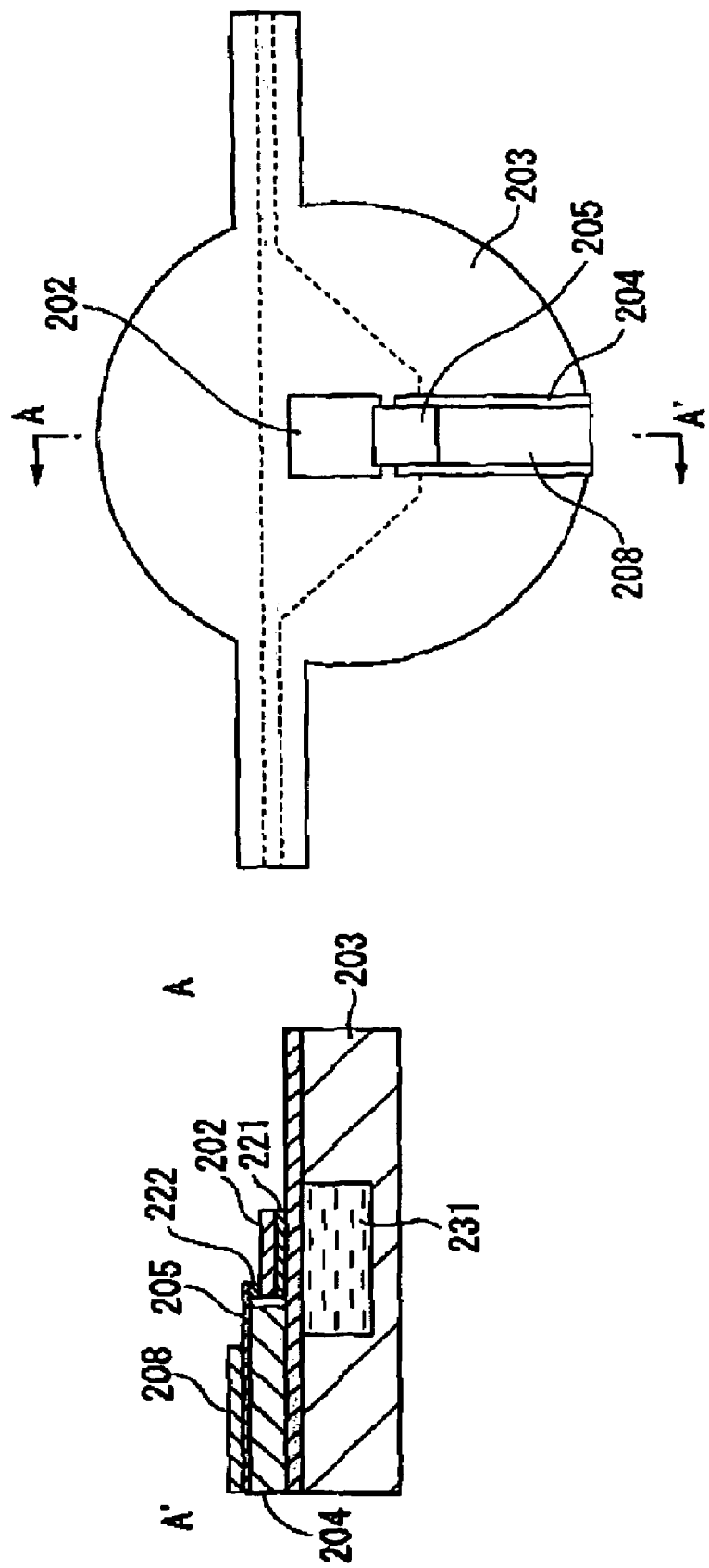

FIG.22A
FIG.22B
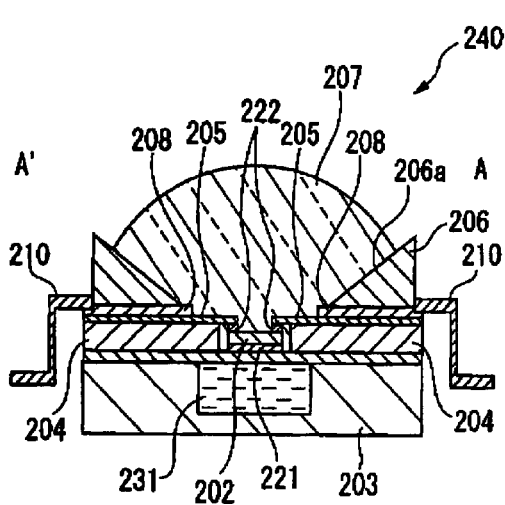
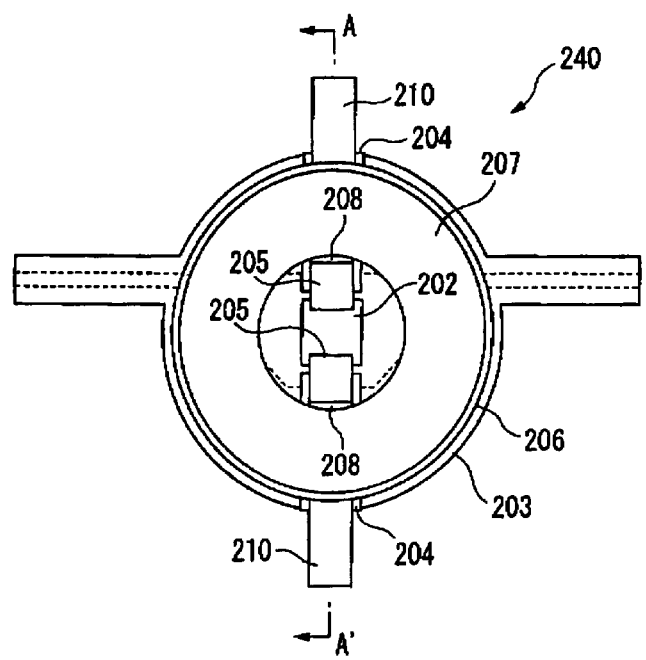

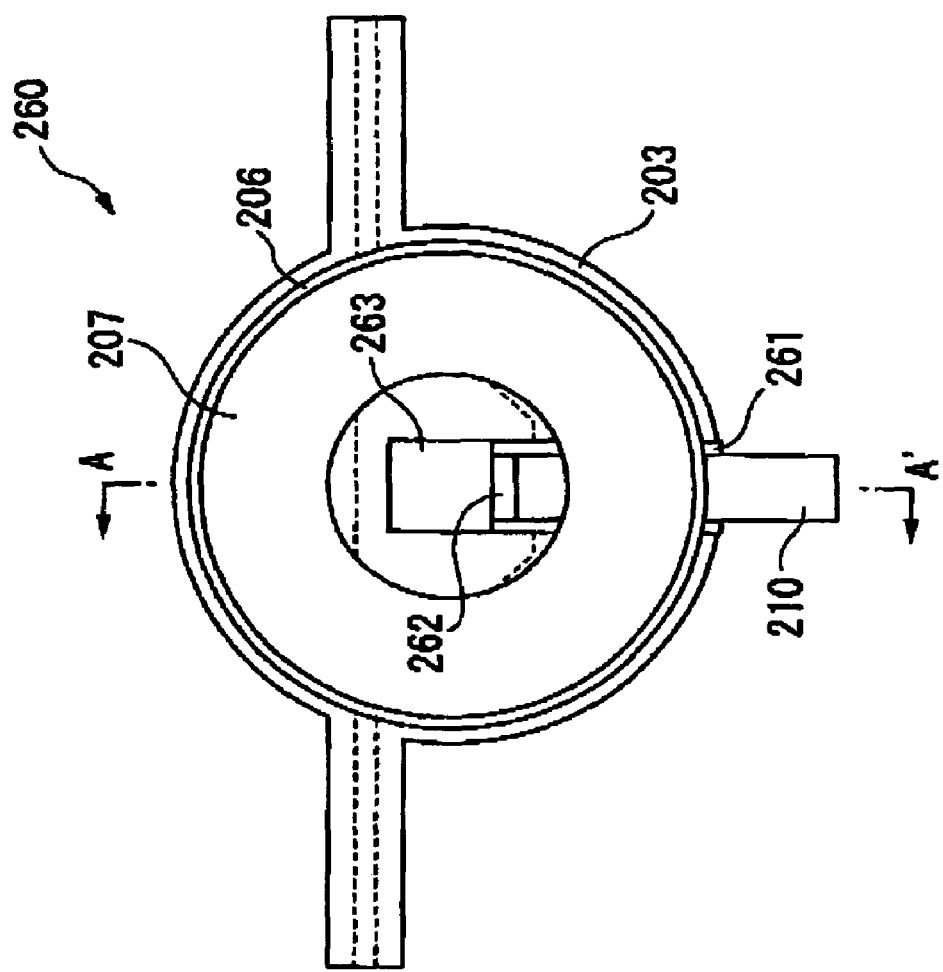
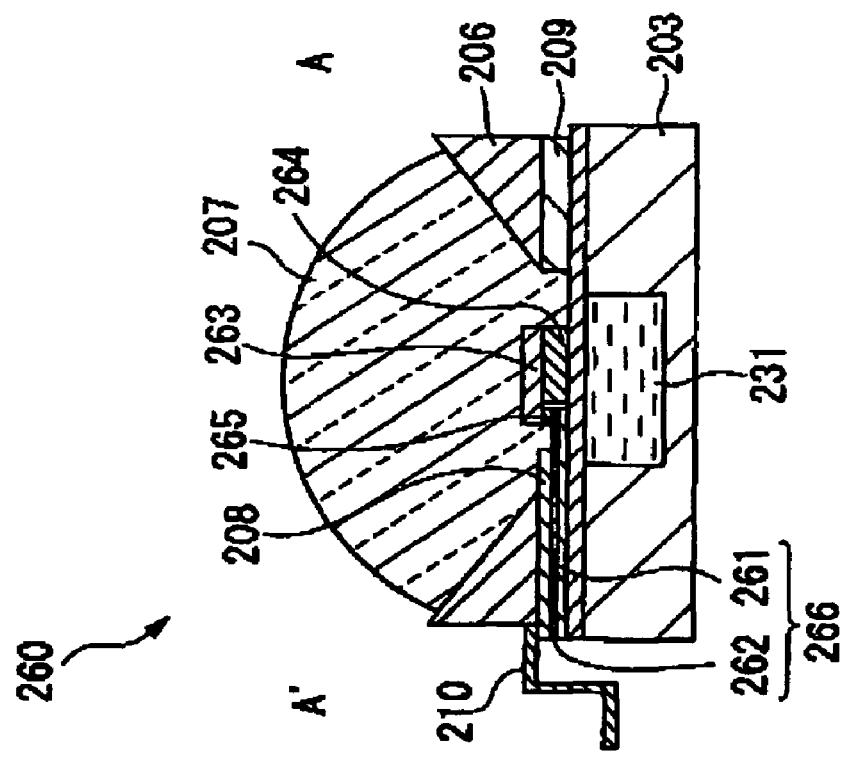

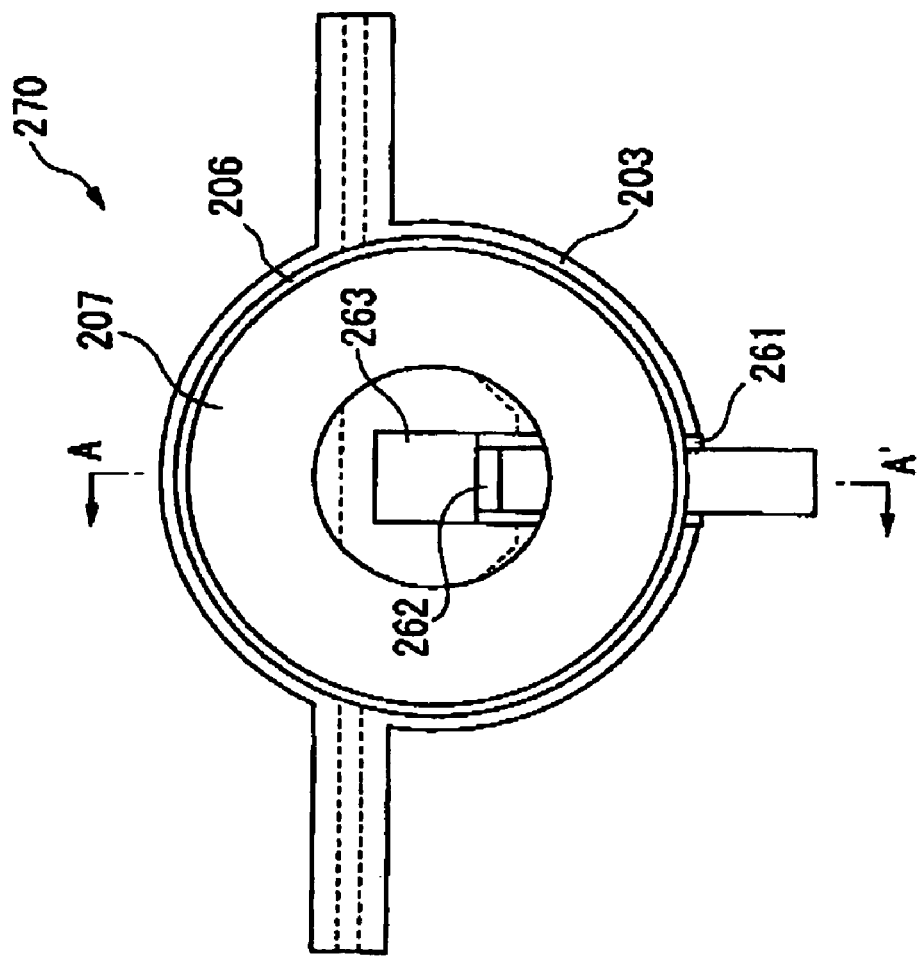
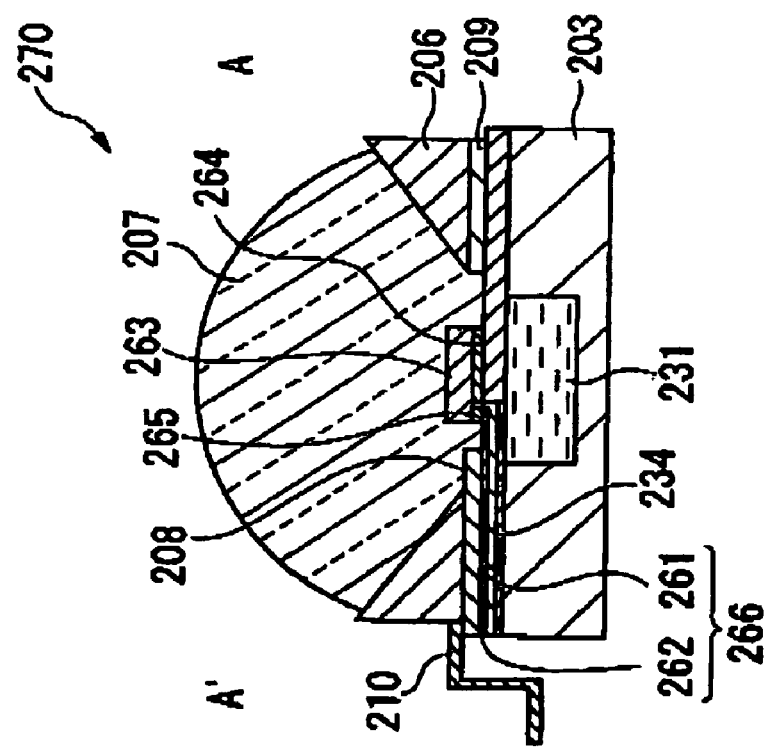

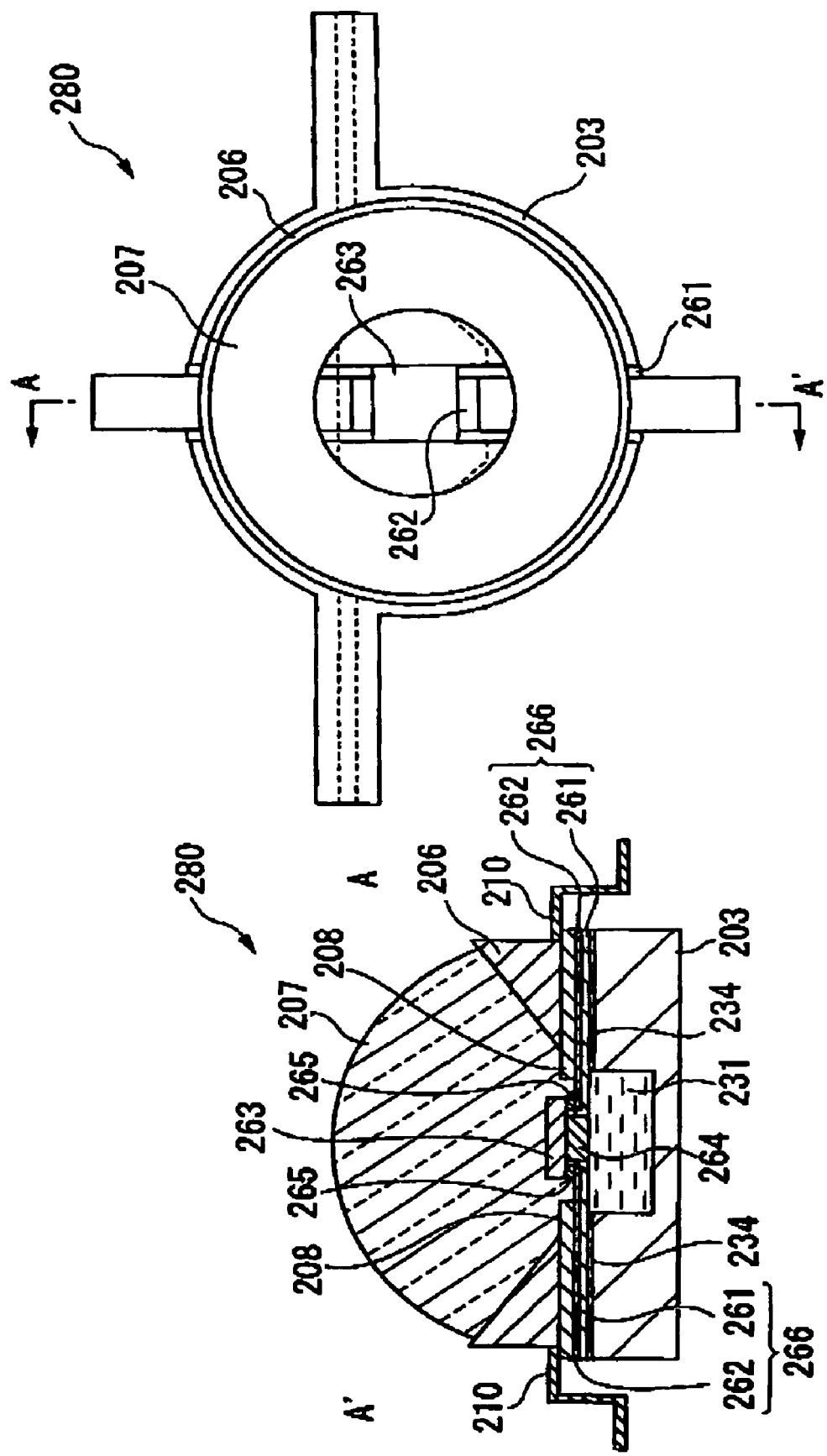

LIGHT SOURCE APPARATUS WITH LIGHT-EMITTING CHIP WHICH GENERATES LIGHT AND HEAT

BACKGROUND OF THE INVENTION

1. Field of the Invention

The present invention relates to a light source apparatus and a projector.

Priority is claimed on Japanese Patent Application Nos. 2003-365008 and 2003-365009, filed Oct. 24, 2003, No. 2004-15702, filed Jan. 23, 2004, and on No. 2004-196558 filed Jul. 2, 2004 the contents of which are incorporated herein by reference.

2. Description of Related Art

In recent years, projectors have achieved advances in miniaturization, higher levels of brightness, length of lifespan, cost reduction, and the like. For example, as regards miniaturization, the size of a liquid crystal panel (i.e., an optical modulator) has dropped from 1.3 inches diagonally to 0.5 inches diagonally, with a size reduction of slightly more than ⅙ being achieved in the surface ratio.

A reduction in the size of a projector obtained by using a light emitting diode (LED) light source, which is a solid state light source, as the light source of the projector has been proposed. LED light sources are small in size and include a power source, and have merits as light sources for projectors such as their ability to be turned on and off instantaneously, their broad color reproducibility, and their long life span. In addition, because they contain no harmful substances such as mercury, they are preferable from the standpoint of environmental protection.

However, because the brightness thereof is insufficient as a light source, in order to use an LED light source as the light source of a projector, it is necessary to secure (i.e., to increase the intensity and to reduce the etendue) a brightness of at least the level of a discharge type of light source lamp. Here, the term "etendue" refers to a numerical value that shows a spatial expanse in which luminous flux that can be effectively used is present expressed as the product of a surface area and a solid angle. Moreover, the etendue is optically preserved. As is described above, because a reduction in the size of liquid crystal panels has been achieved and the etendue of liquid crystal panels has been reduced, it is also necessary to make the etendue of the light source either equivalent or smaller.

However, as the level of brightness of LED light sources has increased, the heat output from LED light sources has also further increased. However, if the temperature of an LED light source rises, the light emission efficiency thereof deteriorates so that some type of heat output countermeasure has been required. In the forced air-cooling system using a fan that is generally employed, the cooling effect is insufficient and the noise from the fan has created problems. For this reason, methods of forcibly cooling an LED light source using a liquid have been proposed, for example, in Japanese Unexamined Patent Application, First Publication (JP-A) Nos. H06-5923 and H07-99372. From a liquid cooling method, an effect of nullifying the noise generated in the forced air-cooling system is also anticipated.

In the LED light source disclosed in JP-A No. H06-5923, by circulating a cooling material such as liquid nitrogen or the like around the LED, the LED and the cooling material are placed in direct contact with each other so as to achieve forced cooling. However, because the structure of the LED light source is complex due to an insulating case being necessary and the like, the manufacture thereof is not practical. Therefore, the problem arises that it is difficult to secure at the least the brightness level of a discharge type light source lamp.

In the LED light source disclosed in JP-A No. H07-99372, the periphery of an LED chip (i.e., the light emitting chip) is filled with an insulating inert liquid so as to cool the LED chip. However, a device for positively cooling the insulating inert liquid is not provided so that the cooling effect is low and it is difficult to cool an LED chip for an extended period of time. Consequently, the problem arises that it is difficult to secure at the least the brightness level of a discharge type light source lamp.

Moreover, when an LED light source is being driven by a large current, it is necessary to consider the electrical resistant of wiring and the like, which in a conventional LED light source has not been a problem. Specifically, in the LED light source disclosed in Japanese Unexamined Utility Model Application, First publication (JP-U) No. H06-9158, current is inject via bonding wire made of gold or the like into a light emitting chip that generates light and heat when energized. When the LED light source is driven by a large current, because of the electrical resistance of the bonding wire there is a concern that the bonding wire will generate heat and melt, resulting in a broken wire. Furthermore, small diameter wiring heats up and generates an extra load on the cooling system so that, as a result, there is a concern that the heat discharge effect for the LED light source will be worsened.

In a light source apparatus that is provided with an LED light source such as those described above, generally, in order to improve the extraction efficiency of generated light, as is shown, for example, in JP-A Nos. H07-7185 and H11-65477, generated light that is emitted in an oblique direction relative to the direction of emission from the light emitting chip is reflected in the direction of emission of the light source apparatus using reflectors that are placed around the light emitting chip. As a result of providing reflects such as these, generated light that is emitted from the light source apparatus is changed into parallel light, and it is possible to further increase the utilization efficiency of the light.

If a light source apparatus is used as the light source for a projector, it is necessary to change the generated light into parallel light and then irradiate it onto an optical modulator of the projector. However, as is described above, because the miniaturization of liquid crystal panels (i.e., of optical modulators) has advanced and the etendue of liquid crystal panels has become smaller, it has also become necessary to lower the etendue of light source apparatuses for projectors as well. Note that here the term "etendue" is a parameter given by the product of the light emitting surface area of a light source and the solid angle that can be condensed, and shows a spatial expanse in which luminous flux that can be effectively used is present. The etendue is optically preserved.

Because a conventional light source apparatus reflects generated light that is emitted in an oblique direction from the front surface of a light emitting chip is reflected by a reflector in the emission direction of the light source apparatus, it is possible to change the generated light that is emitted from the front surface of the light emitting chip into parallel light. However, generated light is also emitted from surfaces other than the front surface of a light emitting chip, and in a conventional light source apparatus, this generated light is also reflected by the reflector. Accordingly, in a conventional light source apparatus, there is a large amount of etendue, and it is difficult to change all of the generated light that is emitted from side surfaces of a light emitting chip into parallel light and this light into a miniaturized liquid crystal panel (i.e., optical modulator). As a result, a large amount of generated light that is emitted from side surfaces of a light emitting chip becomes stray light inside a projector after it has been emitted from the light source apparatus.

Moreover, in a projector, in order to improve display characteristics, it is preferable that the illumination intensity of the generated light that is irradiated onto the optical modulator is uniformly distributed. However, because it is difficult to match generated light that is emitted from side surfaces of a light emitting chip such as that described above with generated light that is emitted from the front surface of the light emitting chip, and then make this light uniform and emit it, the illumination intensity of generated light that is emitted from a light source apparatus is not uniformly distributed.

The present invention was conceived in view of the above described problems and a first object thereof is to provide a light source apparatus whose structure can be simplified and in which it is possible to efficiently cool a light emitting chip, and to further provide a projector that is bright and has an excellent display quality.

A second object of the present invention is to prevent breakages in electrode wires.

A third object of the present invention is to reduce excess load on a cooling system and to improve a heat discharge effect of an LED light source by preventing unnecessary heat output that is caused by electrical resistance of the electrode wires.

A fourth object of the present invention is to lower the etendue of a light source and to uniformly distribute the illumination intensity of generated light that is output from a light source apparatus by eliminating the generated light component that is emitted from side surfaces of a light emitting chip.

SUMMARY OF THE INVENTION

In order to achieve the above objects in a first aspect of the present invention, a light source apparatus includes a light emitting chip which generates light and heat upon being energized via a first electrode and a second electrode, wherein the first electrode is a base on which the light emitting chip is directly packaged.

According to the light source apparatus of the aspect, a light emitting chip is packaged directly on a base and this base functions as a first electrode. Accordingly, because it is not necessary to place an insulating layer having low thermal conductivity between the light emitting chip and the first electrode (i.e., base), the amount of heat that is generated in the light emitting chip is easily transmitted to the base. As a result, it is possible to improve the heat discharging capability of the light source apparatus, which enables the light emitting chip to be driven using a larger current. Furthermore, in the present invention because the light emitting chip is cooled by being directly packaged on the base, the light emitting chip can be driven by a larger current using a simple structure.

An LED chip (i.e., a light emitting chip) generates brighter light the greater the current that is used to energize it. Accordingly, by packaging the light emitting chip directly on the base, as in the present invention, a light source apparatus having a high level of brightness can be obtained.

In the light source apparatus according to the present invention, it is preferable that a passage through which a coolant flows is formed inside the base. By forming a passage inside the base through which a coolant flows in this manner, the amount of heat that is transmitted from the light emitting chip is efficiently discharged to the outside of the base. Therefore the light emitting chip can be cooled even further, and it is possible to drive the light emitting chip using an even greater current.

It is possible for a wiring substrate that is formed by stacking an insulating layer and a conductive layer to be provided on the base, and for the conductive layer belonging to the wiring substrate to be a second electrode. As a result of this, it is possible for the first and second electrodes to be connected to a bottom surface side (i.e., to the substrate side) of the light emitting chip. Accordingly, the light source apparatus according to the present invention can be what is known as a flip chip packaged type of light source apparatus.

Note that when the light source apparatus according to the present invention is a flip chip packaged type of light source apparatus, then it is preferable that a top surface of the wiring substrate and a top surface of the base are made the same height by embedding the wiring substrate in a concave portion formed in the base. By making the top surface of the wiring substrate the same height as the top surface of the base, it is easy to place the light emitting chip in a horizontal position. When the light emitting chip has connecting terminals that are connected to both the first electrode and the second electrode, if the top surface of the wiring substrate and the top surface of the base are at different heights, then in order to place the light emitting chip body horizontally, it is necessary to make the thickness of the connecting terminal that is connected to the first electrode thicker than the thickness of the connecting terminal that is connected to the second electrode. In a case such as this, because the connecting terminal that is connected to the first electrode is thick, it becomes difficult for the amount of heat that is generated in the light emitting chip body to be transmitted to the base. Accordingly, by making the top surface of the wiring substrate the same height as the top surface of the base, it is possible to further increase the heat discharge effect of the light source apparatus.

It is preferable in the light source apparatus according to the present invention that a plurality of the wiring substrates, namely, of the second electrodes are provided. By providing a plurality of the second electrodes in this manner, it is possible to reduce the amount of current that is flowing in each second electrode. Namely, because the electrical resistance of the second electrode can be reduced, it is possible to prevent heat from being generated in the second electrode.

In the light source apparatus according to the present invention, it is also preferable that the second electrode is connected to the vicinity of an end portion of the light emitting chip. By connecting the second electrode to the vicinity of an end portion of the light emitting chip in this manner, the length of the second electrode, namely, of the conductive layer can be shortened. Accordingly, it becomes possible to reduce the electrical resistance of the second electrode and to prevent heat from being generated in the second electrode.

It is also possible for the light source apparatus according to the present invention to employ a structure in which the light emitting chip has connecting terminals that are connected to each of the first electrode and the second electrode.

Next, the projector according to the present invention uses the light source apparatus according to the present aspect as a light source.

According to the light source apparatus according to the present invention, because it is possible to obtain light having a high level of brightness, then using the projector of the present invention that has the above features, it is possible to provide a projector that is bright and has an excellent display quality.

In addition, in a second aspect of the present invention, a light source apparatus includes a light emitting chip that is inserted between a first electrode and a second electrode and that generates light and heat upon being energized via the first electrode and the second electrode, a base which supports the light emitting chip, and an insulting layer which is placed on top of the base and has substantially the same thickness as the thickness of the light emitting chip, wherein the second electrode extends from a top surface of the insulating layer and is connected to a top surface of the light emitting chip.

According to the light source apparatus of the present aspect, an insulating layer having substantially the same thickness as the light emitting chip is placed on the base on which the light emitting chip is supported, and the second electrode extends from the top surface of this insulating layer and is connected with the top surface of the light emitting chip. As a result, the second electrode is able to connect with the top surface of the light emitting chip by extending substantially horizontally. Accordingly, because it is possible to easily make the second electrode thicker than conventional bonding wire, the electrical resistance of the second electrode can be decreased. As a result the generation of heat can be suppressed in the second electrode and it becomes possible to prevent wire breakages of the electrode wiring.

Because the electric resistance of the second electrode is decreased as the cross-sectional area of the second electrode is greater, it is preferable that this cross-sectional area be as large as possible. However, if connecting terminals are placed on top of the light emitting chip, then if the thickness of the second electrode is increased excessively, this is not preferable as it tends to increase the stress on the connecting terminals. Accordingly, it is preferable that the second electrode has substantially the same width as the width of the light emitting chip.

Moreover, in the light source apparatus according to the present invention, it is preferable that the second electrode is connected to the vicinity of an end portion of the light emitting chip. By connecting the second electrode to the vicinity of the end portion of light emitting chip in this manner, the extent of the top surface, namely, of the emission surface of the light emitting chip that is covered by the second electrode can be made smaller. Therefore, it is possible to provide a light source apparatus having more excellent light generation characteristics.

It is also possible in the light source apparatus according to the present invention to employ a structure in which a plurality of the second electrodes and insulating layers are provided. By providing a plurality of the second electrodes and insulating layers in this manner, it is possible to reduce the amount of current that is flowing in each second electrode. Accordingly, because it is possible to prevent heat from being generated in the second electrode, it is possible to more reliably prevent wire breakages in the electrode wiring.

It is preferable in the light emitting chip of the above described light source apparatus according to the present invention to cool the light emitting chip by efficiently discharging the amount of heat that is generated.

As is clear from Formula 1 given below, by increasing the value of S/W, the amount of heat that moves from a high heat source to a low heat source per unit time is made to increase.

Accordingly, in the light source apparatus according to the present invention, it is preferable that the base is formed from a metal material and that this base is used as the first electrode. Namely, by using the base as the first electrode, the light emitting chip (i.e., the high heat source) is directly packaged on the base (i.e., the low heat source). Consequently, the light emitting chip comes closer to a low heat source that is in contact with the base (for example, the outside air or the like), so that the value of W can be decreased. As a result the value of S/W in Formula 1 can be increased, and it becomes possible to efficiently discharge the quantity of heat in the light emitting chip.

In the light source apparatus according to the present invention, it is preferable that a passage through which a coolant flows is formed inside the base. By forming a passage inside the base through which a coolant flows in this manner, it becomes possible to use a coolant, which has a lower temperature than the outside air, as the low heat source. Accordingly, because the amount of heat that moves from the high heat source (i.e., the light emitting chip) to the low heat source (i.e., the coolant) per unit time is greater than when the outside air is used as the low heat source, it becomes possible to efficiently discharge the quantity of heat in the light emitting chip.

It is also possible for the light source apparatus according to the present invention to employ a structure in which the light emitting chip has connecting terminals that are connected to each of the first electrode and the second electrode.

Next, the projector according to the preset invention uses the light source apparatus according to the present aspect as a light source.

According to the light source according to the present invention, because wire breakages in electrode wiring that are caused by the light emitting chip being driven by a large current are prevented, the reliability of the projector according to the present invention is improved.

In a third aspect of the present invention, a light source apparatus includes a light emitting chip which generates light and heat upon being energized via a first electrode and a second electrode, and a reflective portion which is formed from a conductive material and that has a reflective surface that reflects light generated in the light emitting chip in a predetermined emission direction, wherein the second electrode is energized via the reflective portion.

According to the light source apparatus of the present aspect, the electrode is energized via a reflective portion. Because this type of reflective portion has a reflective surface that reflects light generated in the light emitting chip in a predetermined emission direction, as is described above, naturally it has a larger cross-sectional area an in the narrow metal wiring used in a conventional bonding wire or the like. Accordingly, by energizing the second electrode via this reflective portion, it is possible to prevent heat being generated in electrode wiring that is electrically connected to the second electrode. In addition, because electrode wiring can be prevented from melting due to the heat that is generated, it is possible to prevent wire breakages of the electrode wiring.

In the light source apparatus according to the present invention, it is possible to employ a structure in which there is provided a connecting material that physically and electrically connects the second electrode and the reflective portion. By providing a connecting material that physically and electrically connects the second electrode and the reflective portion in this manner, it is possible to physically and electrically connect the second electrode and the reflective portion with ease. Note that, as this type of connecting material it is possible to use any material having conductivity, however, it is particularly preferable for solder or a conductive adhesive agent whose shape can be easily changed to be used.

In the light source apparatus, it is preferable that the light emitting chip is cooled by efficiently discharging the amount of heat that is generated in the light emitting chip.

As is clear from Formula 1 given below, by increasing the value of S/W, the amount of heat that moves from a high heat source to a low heat source per unit time increases.

Accordingly, in the light source apparatus according to the present invention, it is preferable that a structure is employed in which there is provided a base that is formed from a conductive material and on which the light emitting chip is packaged, and that the base is used as the first electrode. Namely, by using the base as the first electrode, the light emitting chip (i.e., the high heat source) is directly packaged on the base (i.e., the low heat source). Consequently, the light emitting chip comes closer to a low heat source that is in contact with the base (for example, the outside air or the like), so that the value of W can be decreased. As a result, the value of S/W in Formula 1 can be increased, and it becomes possible to efficiently discharge the quantity of heat in the light emitting chip.

In the light source apparatus according to the present invention, it is preferable that a passage through which a coolant flows is formed inside the base. By forming a passage inside the base through which a coolant flows in this manner, it becomes possible to use a coolant, which has a lower temperature than the outside air, as the low heat source. Accordingly, because the amount of heat that moves from the high heat source (i.e., the light emitting chip) to the low heat source (i.e., the coolant) per unit time increases, it becomes possible to efficiently discharge the quantity of heat in the light emitting chip.

In the light source apparatus according to the present embodiment, it is also possible to employ a structure in which a wiring substrate that is formed by stacking an insulating layer and a conductive layer is provided on the base, and the second electrode is a conductive layer belonging to the substrate. By employing a structure such as this, it is possible, for example, by making the insulating layer thinner and connecting the conductive layer to the bottom surface of the light emitting chip, to apply the light source apparatus according to the present invention to what is known as a flip chip packaged type of light source apparatus. In addition, by making the insulating layer thinner, and extending the conductive layer so that it is connected with a top surface of the light emitting chip, it is possible to energize the top surface of the light emitting chip without using a wire.

When the light source apparatus according to the present invention is used as a flip chip packaged type of light source apparatus, it is preferable that, by embedding the substrate in a concave portion that is formed on the substrate, a top surface of the wiring substrate and a top surface of the base are made the same height. By making the top surface of the wiring substrate the same height as the top surface of the base, it is easy to place the light emitting chip in a horizontal position.

Moreover, in the light source apparatus according to the present invention, it is preferable that a plurality of the wiring substrates, namely, of the second electrode are provided. By providing a plurality of the first electrodes in this manner, is possible to reduce the quantity of current that is supplied to each second electrode, and to reduce the electrical resistance of the second electrode. As a result, it is possible to further suppress the generation of heat in the second electrode.

In the light source apparatus according to the present invention, it is preferable that the second electrode is connected to a vicinity of an end portion of the light emitting chip. By connecting the second electrode to the end portion of the light emitting chip in this manner, the length of the second electrode, namely, of the conductive layer can be made shorter. Accordingly, it becomes possible to reduce the electrical resistance of the second electrode and to further suppress the generation of heat in the second electrode. When the second electrode is connected to the top surface of the light emitting chip, then by connecting the second electrode to the vicinity of the end portion of the light emitting chip, it is possible to secure a broad light emitting region for the light emitting chip.

Next, the projector according to the present invention uses the light source apparatus according to the present aspect as a light source.

According to the light source apparatus according to the present invention, because the unnecessary generation of heat that is caused by electrical resistance in the electrode wiring is prevented, any excess load on the cooling system is reduced, and it is possible to improve the heat discharge effect of the light emitting chip. Accordingly, the amount of light that is emitted from the light emitting chip can be increased and the brightness of the projector according to the present invention is improved. In addition, according to the light source apparatus according to the present invention, because breakages of the electrode wiring that are due to the light emitting chip being driven using a large current are prevented, the reliability of the projector according to the present invention is improved.

In a fourth aspect of the present invention, a light source apparatus which is provided with a light emitting chip that generates light when energized via a first electrode and a second electrode, and that emits generated light from the light emitting chip in a front surface direction of the light emitting chip, wherein there is provided a light blocking device which prevents generated light emitted from a side surface of the light emitting chip from being directly emitted in the front surface direction.

According to the light source apparatus of the preset aspect, using a light blocking device, it is possible to prevent generated light that is emitted from a side surface of the light emitting chip from being wetted directly in the front surface direction. As a result, according to the light source apparatus of the present invention, because stray light components (i.e., generated light that is emitted from a side surface of the light emitting chip) in the generated light (referred to below as illumination light) that is emitted from the light source are removed, it is possible to reduce the etendue of the light source.

Note that it is also possible to provide a recycling device that, by recycling generated light that has been blocked by the light blocking device, converts it into components that can be changed into parallel light, and emits generated light that has been emitted from a side surface of the light emitting chip indirectly to the outside of the light emitting apparatus via the recycling device. By providing this type of recycling device, it is possible to improve the extraction efficiency of generated light in the light source apparatus.

Furthermore, in the light source apparatus of the present invention, it is also possible to employ a structure in which, as a result of the light blocking device reflecting at least a portion of the light that is emitted from a side surface of the light emitting chip, it is possible to prevent generated light that is emitted from a side surface of the light emitting chip from being emitted directly in the front surface direction.

Generally, in an LED light emitting chip, the light emission efficiency deteriorates as the temperature increases. Therefore, by employing a structure such as that described above, in the light blocking device, it is possible to prevent all of the generated light that is emitted from a side surface of the light emitting chip being absorbed by the light blocking device, and in the temperature of the light source apparatus can be suppressed while a greater quantity of light can be obtained from light source apparatus.

Moreover, in the light source apparatus according to the present embodiment, it is possible to employ a structure in which the light blocking device is a conductive member that is connected to the second electrode that is placed at a front surface of the light emitting chip and that is placed so as to run around an outer peripheral portion of the light emitting chip.

In a conventional light source apparatus, generally, a second electrode is energized via a bonding wire. However, because this bonding wire is placed on the optical part of generated light, it causes the brightness distribution of illumination light to be made non-uniform. Therefore, by energizing the second electrode via a conductive member that is placed around an outer peripheral portion of light emitting chip, it is possible to prevent the brightness distribution of the illumination light being made non-uniform.

In the light source apparatus of the present invention, because this type of conductive member is used as the light locking device of the present invention, it is not necessary to provide a new, separate member as the light blocking device, and it is possible to prevent generated light that is emitted from a side surface of the light emitting chip from being emitted directly in the front surface direction.

Furthermore, because the cross-sectional area of the conductive member is considerably broader than the cross-sectional area of a bonding wire, a wider current flow path can be secured, and it is possible to supply a larger current than is the case in a conventional light source apparatus.

Note that if it is unavoidable that the second electrode is energized via a bonding wire, then it is possible to provide a non-conductive member formed from ceramic or the like instead of the conductive member of the present invention, and to use this non-conductive member as the light blocking device of the present invention.

In the light source apparatus of the present invention, it is possible to employ a structure in which there is provided an optical element that is connected to the conductive member and is placed in a front surface direction of the light emitting chip.

By placing the conductive member around the light emitting chip, the light source apparatus can be formed into a solid object. Therefore, an optical element that conventionally is placed on the projector side as a component element can be connected directly to the conductive member. As a result, it is possible to shorten the optical path of generated light compared with when an optical element that is separate from the light source apparatus is provided. Accordingly, the size of the projector can be reduced and loss of generated light can be decreased.

Note that a rod lens or polarization plate or the like can be used as the optical element.

Moreover, in the light source apparatus of the present invention, it is possible to employ a structure in which a nonconductive liquid having transparency is sealed between the optical elements and the light emitting chip.

By employing this type of structure, the generated light from a light emitting chip can be irradiated directly onto an optical element without having to pass through air where considerable loss occurs. Accordingly, it is possible to improve the extraction efficiency of generated light in the light source apparatus.

Moreover, in the light source apparatus of present invention, a structure can be employed in which a cooling device is provided that supplies a coolant to an area between the optical element and the light emitting chip.

By employing a structure such as this, because a coolant to supply to the area between the optical elements and the light emitting chip, the light emitting chip and the optical element can be positively cooled by the coolant, enabling the light generation efficiency of the light emitting chip to be improved and enabling the light emitting chip to be driven using an even larger current.

In the light source apparatus of the present embodiment, it is possible to employ a structure in which the second electrode is placed over an entire front surface of the light emitting chip, and is formed from a conductive material having transparency.

By employing a structure such as this, current is applied uniformly to the entire front surface of the light emitting chip. Accordingly, it is possible to obtain illumination light having a uniform brightness distribution from the light emitting chip. Note that, because the second electrode is formed from a conductive material having transparency, as is described above, generated light from the light emitting chip is not obstructed by the second electrode.

Furthermore, in the light source apparatus of the present invention, it is possible to employ a structure in which an insulating member is provided between the second electrode and the light emitting chip in the location where the conductive member is connected.

If the second electrode in the light emitting chip are in direct contact at the position when the conductive member is connected to the first electrode, then, for example, a large amount of current is applied to the position where the light is obstructed by the conductive member, and it is difficult for the amount of current that is applied to the front surface of the light emitting chip to be reduced. In a case such as this, light is generated in the portion that is obstructed by the conductive member, and the amount of light at the front surface of the light emitting chip is reduced.

Therefore, by placing a nonconductive member between the second electrode and the light emitting chip at the position where the conductive member is connected to the first electrode, as is described above, it is possible to prevent current being applied to the position that is obstructed by the conductive member, and it is possible to prevent the amount of light that is generated at the front surface of the light emitting chip from decreasing.

In the light source apparatus of the present invention, it is also possible to employ a structure in which there is provided a reflector that guides generated light emitted in an oblique direction from the front surface of the light emitting chip in the front surface direction.

By employing a structure such as this, illumination light that is emitted from the light source apparatus can be changed into parallel light.

In the light source apparatus of the present invention, it is also possible to employ a structure in which the reflector is formed integrally with the conductive member.

By employing a structure such as this, illumination light can be changed into parallel light without a new, separate member being provided as a reflector.

In the light source apparatus of the present invention, it is also possible to employ a structure in which there is provided a reflective film placed on a surface opposite the front surface of the light emitting chip, and formed from a conductive material.

By employing a structure such as this, generated light that is wave-guided inside the light emitting chip and is emitted towards the opposite surface from the front surface of the light emitting chip is reflected by the reflective membrane, and is once again wave-guided inside the light emitting chip and is emitted from the front surface of the light emitting chip.

In the light source apparatus of the present invention, it is also possible to employ a structure in which the first electrode supports the light emitting chip and is a base that is formed from a conductive material.

By employing a structure as this, it is possible to apply current to the light emitting chip without a new, separate member needing to be provided as the first electrode.

Moreover, if, for example, the base is formed by a member having a high thermal conductivity, then by using the base as the first electrode, because the light emitting chip and the base are in direct contact, it is possible to discharge heat generated in the light emitting chip to the base side. As a result, it is possible to prevent the light emitting chip from reaching a high temperature, and any reductions in the light generating efficiency of the light emitting chip can be prevented while enabling the light emitting chip to be driven using a larger current.

Next, the projector of the present invention uses the light source apparatus described in the present aspect as a light source.

According to the projector of the present invention having the above described features, because the brightness distribution of illumination light that is emitted from the light source has been made uniform, a projector having even more excellent display characteristics is provided.

BRIEF DESCRIPTION OF THE DRAWINGS

FIGS. 14A and 14B are schematic structural views of a light source apparatus according to the seventh embodiment of the present invention.

FIGS. 17A and 17B are views for describing a method of manufacturing the light source apparatus according to the seventh embodiment of the present invention.

FIGS. 18A and 18B are views for describing a method of manufacturing the light source apparatus according to the seventh embodiment of the present invention.

FIGS. 22A and 22B are schematic structural views of a light source apparatus according to the eighth embodiment of the present invention.

FIGS. 24A and 24B are schematic structural views of a light source apparatus according to the tenth embodiment of the present invention.

FIGS. 25A and 25B are schematic structural views of a light source apparatus according to the eleventh embodiment of the present invention.

FIGS. 26A and 26B are schematic structural views of a light source apparatus according to the twelfth embodiment of the present invention.

DETAILED DESCRIPTION OF THE INVENTION

An embodiment of the light source apparatus and projector according to the present invention will now be described with reference made to the drawings. Note that in each of the drawings used in the description given below, the dimensions of each member have been altered as is appropriate in order to make each member a recognizable size.

FIRST EMBODIMENT

Method of Cooling a High Heat Source

Firstly, a method of cooling a high heat source based on the law of thermal conduction will be described with reference made to FIG. 1.

Figure 1:
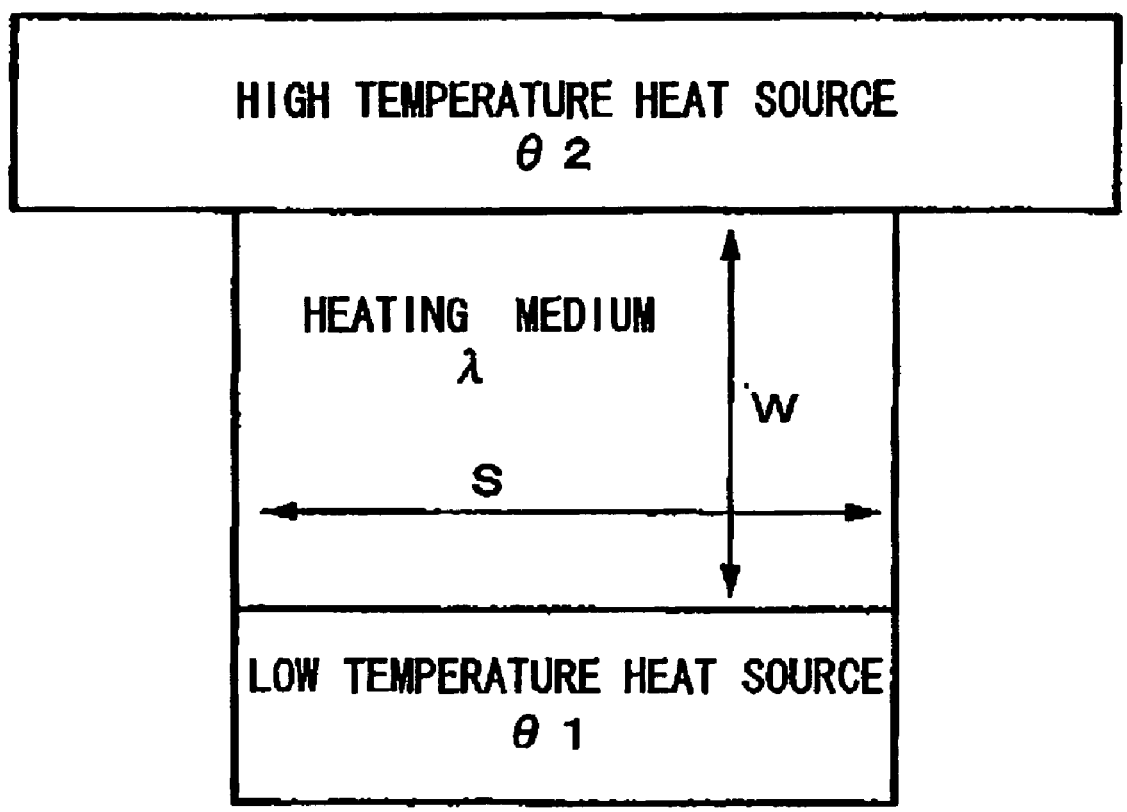
FIG. 1 is an explanatory view of the law of thermal conduction.

FIG. 1 is an explanatory view of the law of thermal conduction.

When cooling a high heat source via a heat transfer medium using a low heat source such as is shown in FIG. 1, the amount of heat movement dQ per unit time from the high heat source to the low heat source is shown by Formula 1. Note that, in Formula 1, $\lambda$ is the thermal conductivity of the heat transfer medium, S is the contact area of the low heat source, W is the distance between the high heat source and the low heat source, $\theta 2$ is the temperature of a high heat source, and $\theta 1$ is the temperature of the low heat source.

$$dQ = \lambda \frac{S}{W}(\theta 2 - \theta 1)dt \qquad \text{(Formula 1)}$$

Here, the greater the value of dQ, the greater the amount of heat movement from the high heat source to the low heat source, so that the high heat source is cooled. In addition, as can be seen from Formula 1, as a method of efficiently transferring heat from the high heat source to the low heat source, (1) a method in which the temperature $\theta 1$ of the low heat source is lowered, (2) a method in which a heat transfer medium having a large thermal conductivity $\lambda$ is used, (3) a method in which the distance W between the high heat source and the low heat source is reduced, and (4) a method in which the contact area S of the low heat source is increased may be considered. Of these (3) and (4) correspond to increasing the S/W in Formula 1.

Therefore, when also cooling the high heat source, namely, the light emitting chip of the light source apparatus according to the present embodiment, it is possible to efficiently cool the light emitting chip by increasing the S/W of the Formula.

Light Source Apparatus

Next, the light source apparatus according to the present embodiment will be described with reference made to FIG. 2.

Figure 2:
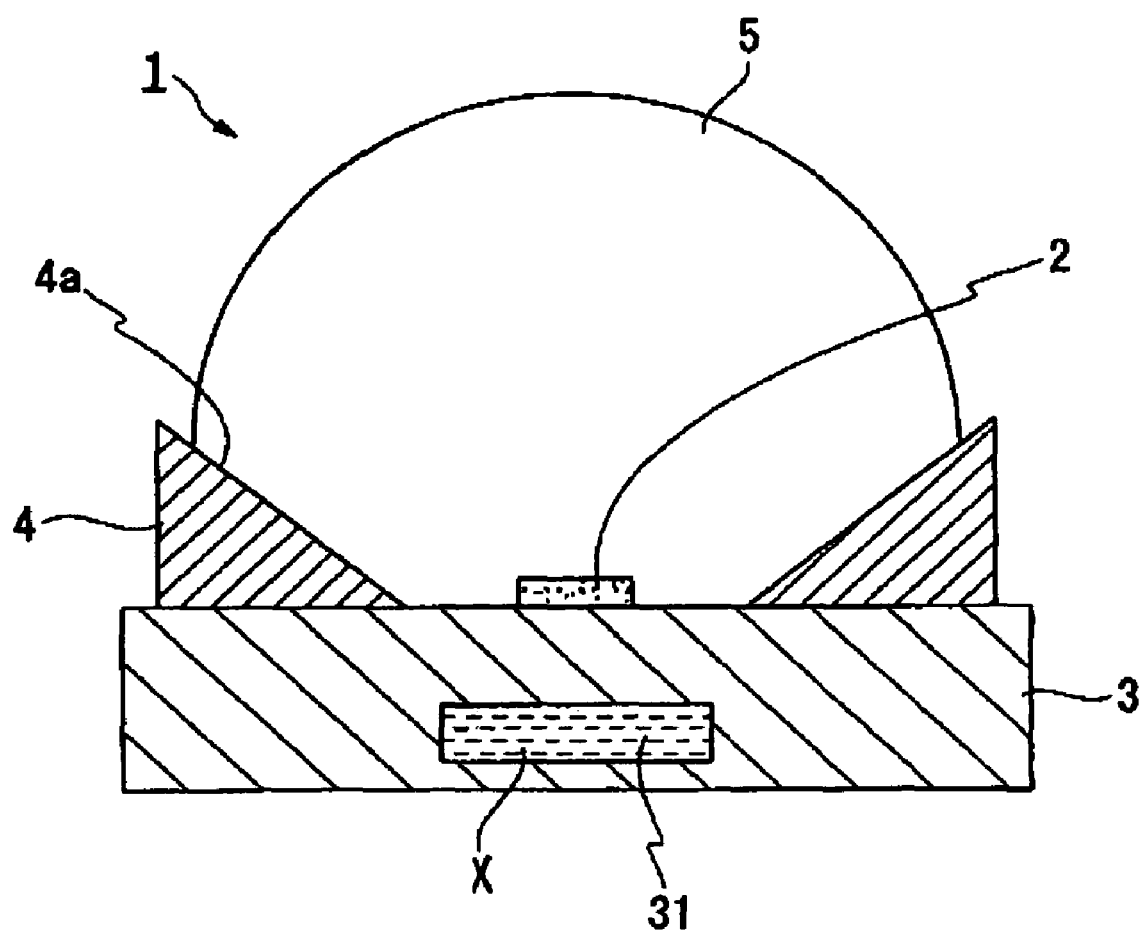
FIG. 2 is a schematic structural view of a light source apparatus according to a first embodiment of the present invention

FIG. 2 is a schematic structural view of a light source apparatus according to the present first embodiment. As is shown in FIG. 2, a light source apparatus 1 according to the present embodiment is provided with a light emitting chip 2 that emits light and heat upon being energized, and the light emitting chip 2 is directly packaged on a base 3 that is formed from a metal material.

A passage 31 through which flows a coolant X is formed inside the base 3. As is shown in FIG. 2, this passage 31 is positioned below the light emitting chip 2. Note that the passage 31 extends in a vertical direction relative to the surface of the paper showing FIG. 2, and is connected to a pump (not shown) that supplies the coolant X to the passage 31.

A toroidal reflecting mirror 4 is formed on a top surface of the base 3 so as to surround the light emitting chip 2. The reflecting mirror 4 reflects light that has been emitted towards the sides from the light emitting chip 2 in an upward direction as seen in the drawing (i.e., in the direction of light emission from the light source apparatus 1). Because of this, an inner surface 4a of the reflecting mirror 4 is formed as a sloping surface in a shape of a bank, and at least this inner surface 4a is in a mirror surface state. In addition, a lens 5 is formed so as to cover the entire top surface of the base 3. The lens 5 condenses light that is emitted radiating outwards from the light emitting chip 2 in the irradiation direction of the light source apparatus 1. Because of this, the lens 5 is formed from a transparent material such as an epoxy resin, and is formed as a concave lens that is thicker in the center portion than in the peripheral portions thereof.

The light emitting chip 2 is a diode (LED) that emits light when current is supplied to p-n junction portion thereof.

In homo-junction types of LED in which identical semiconductor materials are bonded together, because there are no barriers against carriers injected into the light emitting portion, carriers spread to the diffusion length inside the semiconductors. In contrast to this, in hetero-junction types of LED in which different semiconductor materials are bonded together, because barriers against carriers are incorporated in the structure, it is possible to greatly increase the density of carriers ejected into the light emitting portion. In particular, in a double hetero-junction type of LED in which a light emitting layer is between cladding layers, the narrower the light emitting layer the more the carrier density can be increased, and the internal quantum efficiency can be improved. On the other hand, in a homo-junction type of LED, because the material that is in contact with the exterior is the same as the material of the light emitting portion, the light generation ends up being absorbed by its own material. In contrast, in a double hetero-junction type of LED, because a light emitting layer formed from a material having a narrow bandgap is inserted between cladding layers formed from a material having a wide bandgap, it is possible to reduce self-absorption and improve the light acquisition efficiency. Accordingly, it is desirable that a double hetero-junction type of LED that has excellent light generating efficiency is used.

LED that emit blue light and green light are formed by growing GaInN based compound semiconductor crystals on the surface of a substrate such as sapphire ($Al_2O_3$) or the like. In addition, a double hetero-junction structure is employed in which a light emitting layer formed from InGaN is inserted between a cladding layer formed from n-GaN and a cladding layer formed from p-GaN. An LED that emits red light is formed by growing AlGaInP based compound semiconductor crystals on a substrate such as gallium arsenide (GaAs) or the like. Note that there is a limit as to how far the light acquisition efficiency of the LED can be improved in order for the GaAs substrate to absorb visible light. Therefore, it is desirable that the GaAs substrate is removed after the semiconductor crystals have been grown thereon, and then a gallium phosphate (GaP) substrate that is transparent in the light emission wavelength is adhered onto the GaAs substrate by applying high temperature and pressure. A double hetero-junction structure is then employed in which an AlGaInP light emitting layer is inserted between a cladding layer performed by n-Ga P and a cladding layer formed by p-GaP.

Here, the specific structure of a light source apparatus that has a light emitting chip 2a that emits blue light and green light and the specific structure of a light emitting apparatus that has a light emitting chip 2b that emits red light will be described with reference made to FIG. 3 and FIG. 4.

Figure 3A:
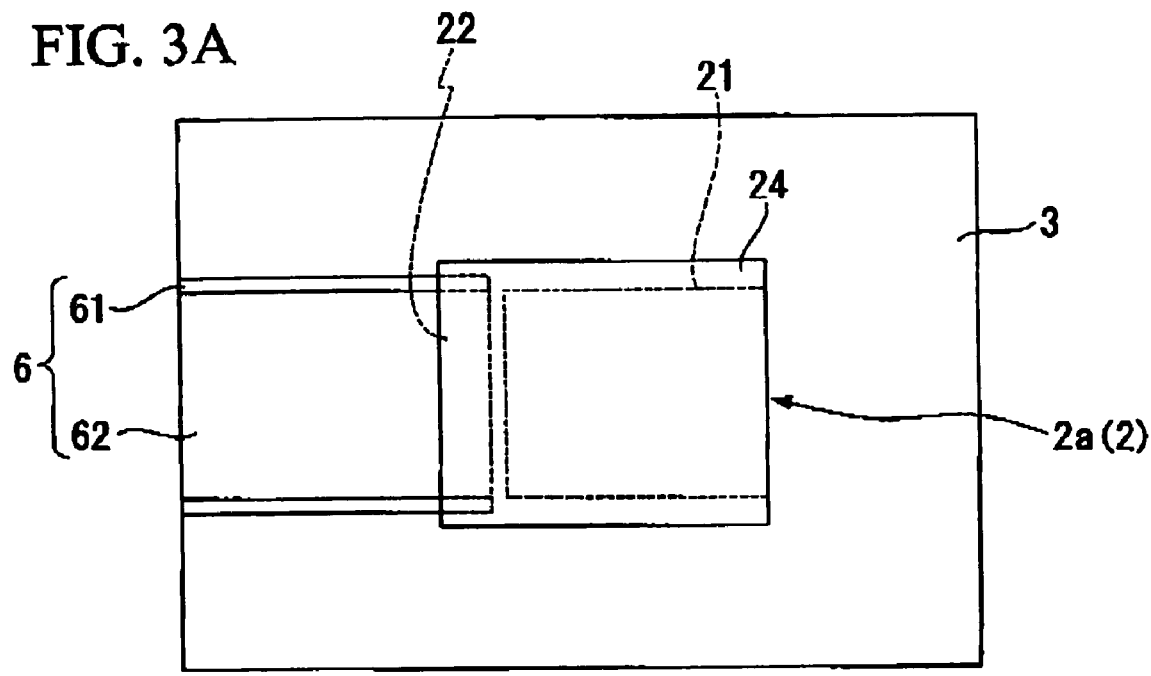
FIGS. 3A and 3B are enlarged schematic structural views of a vicinity of a light emitting chip 2a of the above light source apparatus.
Figure 3B:
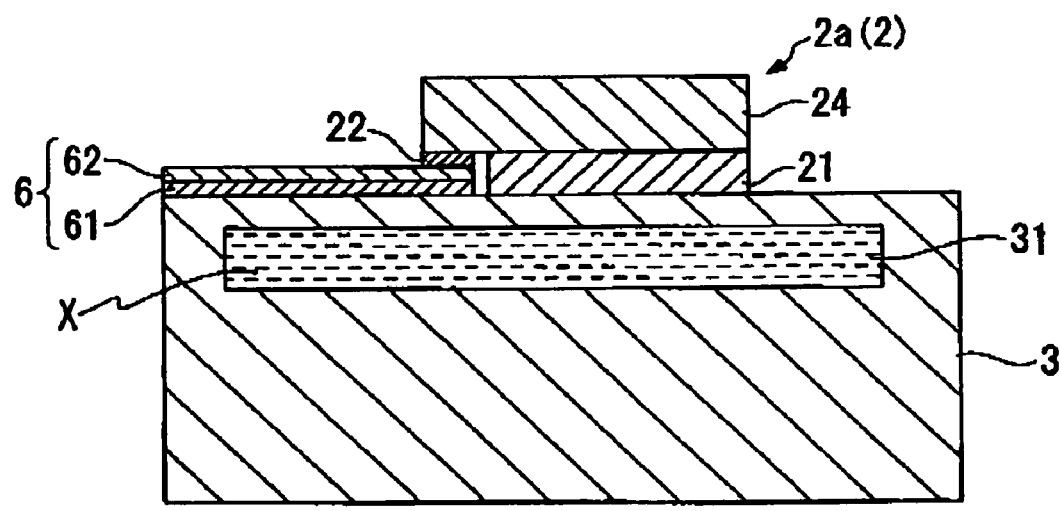

FIG. 3 is an enlarged schematic structural view showing the vicinity of a light emitting chip 2a that emits blue light and green light. FIG. 3A shows the top surface thereof while FIG. 3B shows a cross-section thereof. As is shown in these drawings, a wiring substrate 6 that is formed by stacking an insulating layer 61 and a conductive layer 62 is placed on the base 3. The light emitting chip 2 according to the present embodiment is formed by what is known as flip chip packaging on the base 3, and the light emitting chip 2a has a main body portion 24 that generates light and heat upon being energized, a first bump 21 that is used to connect the main body portion 24 to the base 3, and a second bump 22 that is used to connect the main body portion 24 to the conductive layer 62 of the wiring substrate 6.

The base 3 and the conductive layer 62 of the wiring substrate 6 are connected to a power supply apparatus (not shown), and the light emitting chip 2a generates light and heat upon being energized via the base 3 and the conductive layer 62 of the wiring substrate 6.

Namely, the base 3 (i.e., a first electrode) and the conductive layer 62 of the wiring substrate 6 (i.e., a second electrode) have the functions of electrodes, and the light emitting chip 2a is directly packaged on the base 3 which is one of these electrodes.

When this type of light emitting chip 2a is energized via the base 3 and the conductive layer 62 of the wiring substrate 6, the light emitting chip 2a (i.e., the main body portion 24) generates light and heat. The quantity of heat that is generated in the light emitting chip 2a is discharged by being transmitted to the coolant X via the base 3.

The process by which the quantity of heat that is generated in the light emitting chip 2a (i.e., the main body portion 24) is transmitted to the coolant X will now be described based on Formula 1. Firstly, in the light source apparatus 1 having a light emitting chip 2a such as that described above, the temperature of the coolant X which is a low heat source, is θ1, while the temperature of the main body portion 24 of the light emitting chip 2a, which is a high heat source, is θ2, and a system that includes the bump 21 and the base 3 forms a heat conductive medium having the thermal conductivity λ. In addition, the distance W between the high heat source (i.e., the main body portion 24) and the low heat source (i.e., the coolant X) is the distance between the bottom surface of the main body portion 24 and the top surface of the passage 31. Here, in the light source apparatus 1 having the light emitting chip 2a, because the light emitting chip 2a is directly packaged on the base 3, the distance W is very small and extremely efficient cooling is possible.

Moreover, in the light source apparatus 1 having the light emitting chip 2a, the first bump 21 and the base 3, which form the heat conductive medium, are formed from a metal material. Furthermore, the system that includes the bump 21 and the base 3 have the greatest contact area S relative to the high heat source and the low heat source. As a result, the value of the thermal conductivity λ in those locations where the heat mainly moves to increase, so that even more efficient cooling is possible. Note that a movement path is also formed by the second bump 22, the conductive layer 62, the insulating layer 61, the base 3, and the passage 31, however, in this system, because the thermal conductivity of the insulating layer 61 is small, the quantity of heat generated in the main body portion 24 is mainly transmitted via the first bump 21 and the base 3 to the coolant X.

Figure 4A:
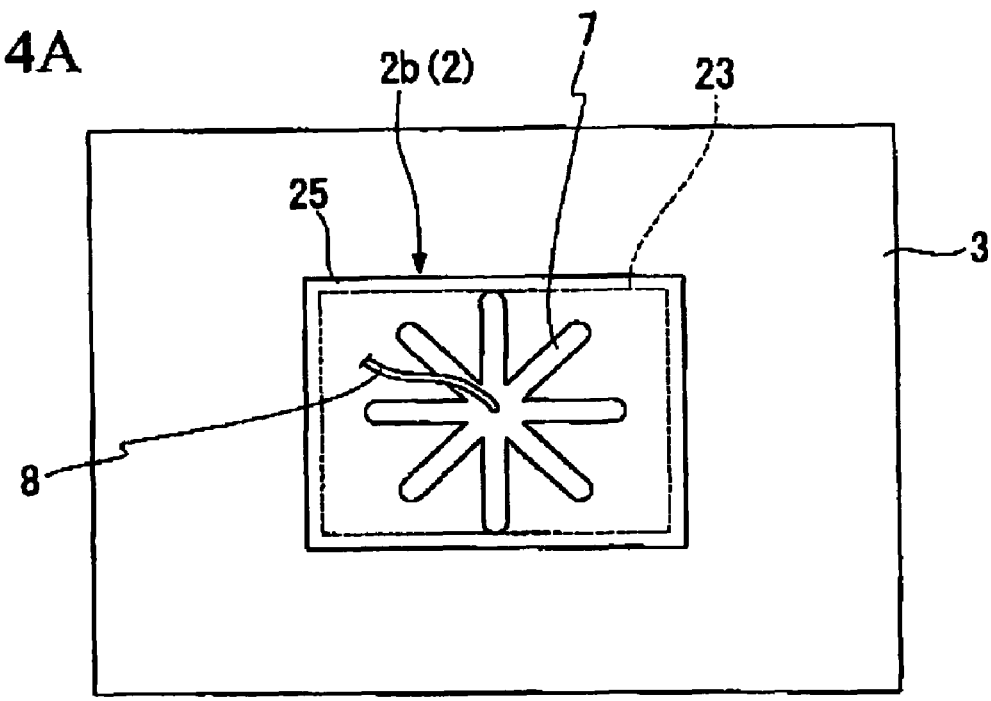
FIGS. 4A and 4B are enlarged schematic structural views of a vicinity of a light emitting chip 2b of the above light source apparatus.
Figure 4B:
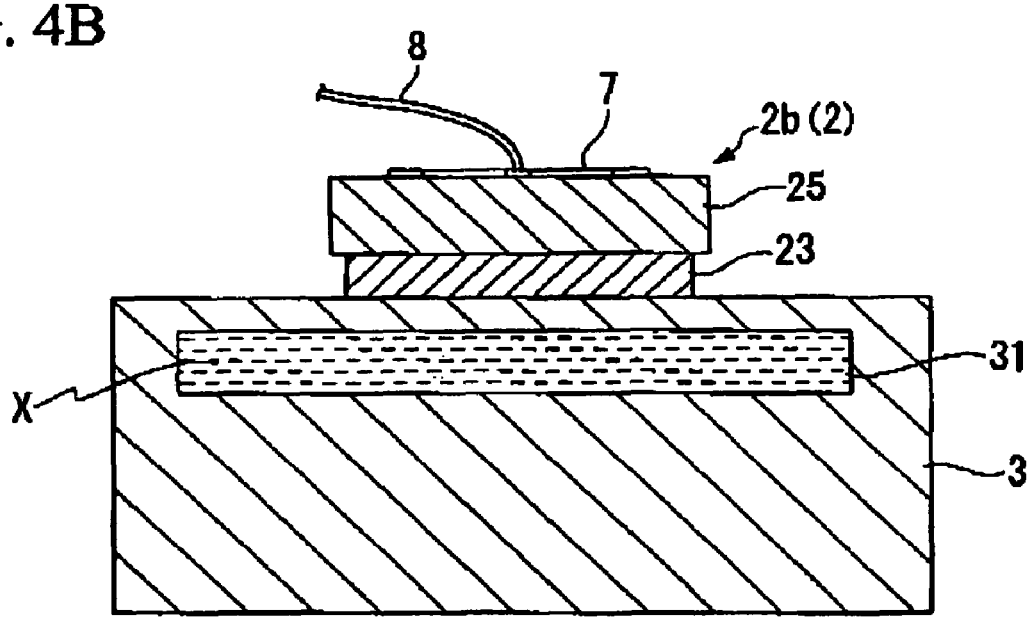

FIG. 4 is an enlarged schematic structural view of the vicinity of the light emitting chip 2b that emits red light, FIG. 4A shows the top surface thereof, while FIG. 4B shows a cross section thereof. As is shown in these drawings, the light emitting chip 2b has a bump 23 that is used to a main body portion 25 that generates light and heat upon being energized with the base 3. An electrode 7 is placed on the top surface of the main body portion 25. This electrode 7 is connected to a bonding wire 8, and the bonding wire 8 and the base 3 are connected to a power supply apparatus (not shown). The main body portion 25 of the light emitting chip 2b generates light and heat upon being energized via the base 3 and the electrode 7.

Namely, the base 3 has the function of an electrode, and the light emitting chip 2a is directly packaged on this base 3.

When this type of light emitting chip 2b is energized via the base 3 and the electrode 7, the light emitting chip 2b (i.e., the main body portion 25) generates light and heat. The quantity of heat that is generated in the light emitting chip 2b is discharged by being transmitted to the coolant X via the base 3.

In the same way as in the light source apparatus 1 having the aforementioned light emitting chip 2a, in the light source apparatus 1 having this type of light emitting chip 2b, because the light emitting chip 2b is directly packaged on the base 3, the distance W between the main body portion 25 and the coolant X is very small and extremely efficient cooling is possible. Moreover, the bump 23 and the base 3 are formed from a metal material. As a result, the value of the thermal conductivity λ in those locations where the heat moves to increases, so that even more efficient cooling is possible.

In this way, in the light source apparatus according to the present embodiment, by making the distance W between the high heat source and the low heat source extremely small in Formula 1, and by placing a heat conductive medium having a large thermal conductivity λ in an area occupying a large portion (or that occupies the entire portion) of the contact area of the heat conductive medium that is present between the high heat source and the low heat source, extremely efficient cooling is made possible, and is possible to improve the heat discharge performance of the light source apparatus 1. As a result, the light emitting chip can be driven using a larger current, and a high-brightness light source apparatus can be achieved.

Moreover, of the light that is generated in the light emitting chip 2 (i.e., 2a and 2b), light that is emitted upwards looking at FIG. 2 is emitted in its existing state via the lens 5, while light that is emitted to the sides is first reflected by the inner surface 4a of the reflecting mirror 4 and is then emitted via the lens 51, while light that is emitted downward looking at FIG. 2 is first reflected by the top surface of the base 3 and is then emitted via the lens 5.

Note that in the light source apparatus 1 according to the present embodiment, the passage 31 is formed inside the base 3 and the coolant X flowing through the passage 31 is used as a low heat source. However, the light source apparatus according to the present invention is not limited to this, and, for example, it is also possible to not form the passage 31 and use the outside air that is in contact with the base 3 as a low heat source.

Note also, that in the present embodiment, it is preferable to connect the conductive layer 62 of the wiring substrate 6 to the vicinity of an end portion of the light emitting chip 2*a* by forming the second bump 22 of the light emitting chip 2 that is connected with the conductive layer 62 of the wiring substrate 6 in the vicinity of the end portion of the light emitting chip 2. By connecting the conductive layer 62 of the wiring substrate 6 in the vicinity of the end portion of the light emitting chip 2*a* in this manner, it is possible to shorten the length of the conductive layer 62. Namely, because it is possible to lower the electrical resistance in the conductive layer 62, it is possible to prevent heat from being generated when current is being supplied to the conductive layer 62.

Projector

Figure 5:
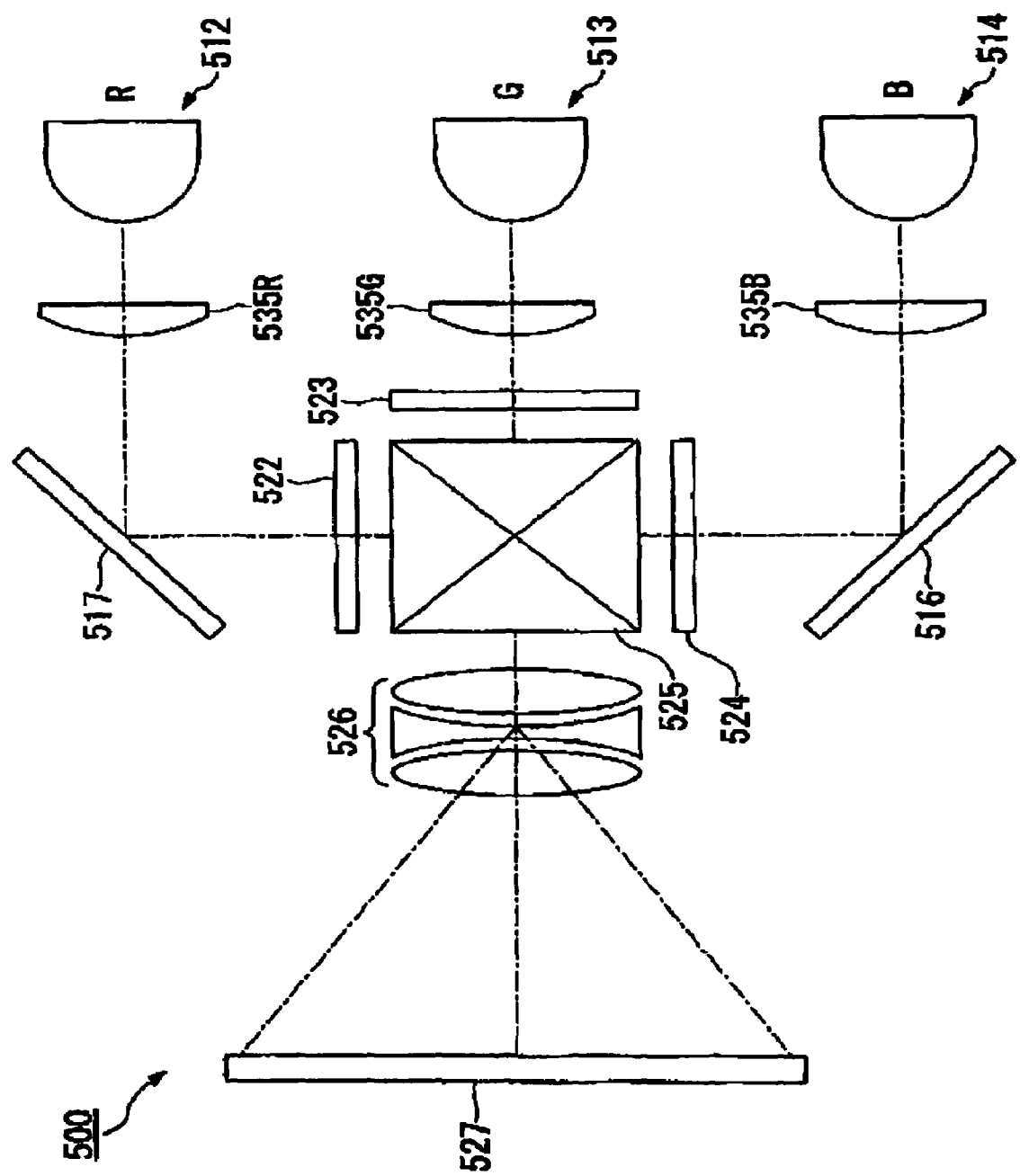
FIG. 5 is a schematic structural view of a projector provided with a light source apparatus according to the present embodiment.

FIG. 5 is a schematic structural view of a projector that is provided with the light source apparatus according to the present embodiment. In FIG. 5, the symbols 512, 513, and 514 show a light source apparatus of the present embodiment; the symbols 522, 523, and 524 show liquid crystal light bulbs (i.e., optical modulating devices); the symbol 525 shows a cross dichroic prism (i.e., a photosynthesizing device); and the symbol 526 shows a projection lens (i.e., a projection device).

The projector shown in FIG. 5 is provided with three light source apparatuses 512, 513, and 514 that are structured as is described in the present embodiment. LED that respectively emit red (R), green (G), and blue (B) light are employed in the respective light source apparatuses 512, 513, and 514. In addition, a condensing lens 535 that corresponds to each of the light source apparatuses 512, 513, and 514 is provided for each of the light source apparatuses 512, 513, and 514.

Luminous flux from the red light source apparatus 512 passes through the condensing lens 535R and is reflected by a reflecting mirror 517 so as to strike the liquid crystal light bulb 522 for red light. Luminous flux from the green light source apparatus 513 passes through the condensing lens 535G and strikes the liquid crystal light bulb 5234 green light. Luminous flux from the blue light source apparatus 514 passes through the condensing lens 535B and is reflected by a reflecting mirror 516 so as to strike the liquid crystal light bulb 524 for blue light.

Polarizing plates (not shown) are positioned on the entry side and exit side of each liquid crystal light bulb. Accordingly, only linearly polarized light in a predetermined direction from among the luminous flux from each light source passes through the entry side polarizing plate and strikes the respective liquid crystal light bulbs. It is also possible to provide a polarization transformation device (not shown) after the incident side polarization plate. In this case, it becomes possible to recycle luminous flux that has been reflected by the entry side polarization plates so as to make it strike the respective liquid crystal light bulbs, and thereby achieve an improvement in the light utilization efficiency.

The light of the three colors that has been modulated by the respective liquid crystal light bulbs 522, 523, and 524 strikes the cross dichroic prism 525. This prism is formed by bonding together four rectangular prisms, and a dielectric multi-layer membrane that reflects red light at an inner surface thereof is placed in a cross form configuration with a dielectric multi-layer membrane that reflects blue light in the rectangular prisms. Light of three colors is synthesized by these dielectric multi-layer films, so that light representing a color image is formed. The synthesized light is projected onto a projection screen 527 by the projection lens 526, which forms a projection optical system, so that an enlarged image is displayed.

In the above described light apparatus of the present embodiment, because the light emitting chip 2 can be efficiently cooled, it is possible to increase the input current so as to achieve a higher level of brightness. Accordingly, by providing the above described light source apparatus in a projector it is possible to provide a projector that is bright and has an excellent display quality.

SECOND EMBODIMENT

Next, a second embodiment of the light source apparatus according to the present invention will be described with reference made to FIG. 6.

Note that component elements that are the same as component elements in the first embodiment are given the same descriptive symbol and any description thereof is either omitted or simplified.

Figure 6A:
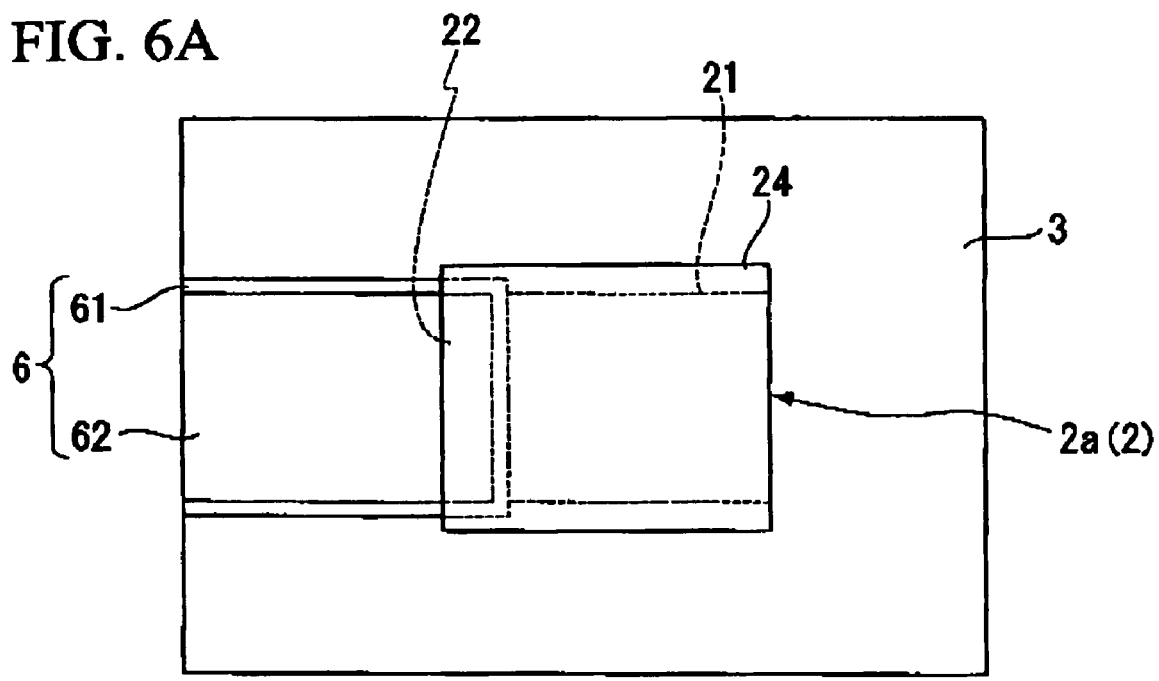
FIGS. 6A and 6B are enlarged schematic views of a vicinity of a light emitting chip 2a of a light source apparatus according to the second embodiment of the present invention.
Figure 6B:
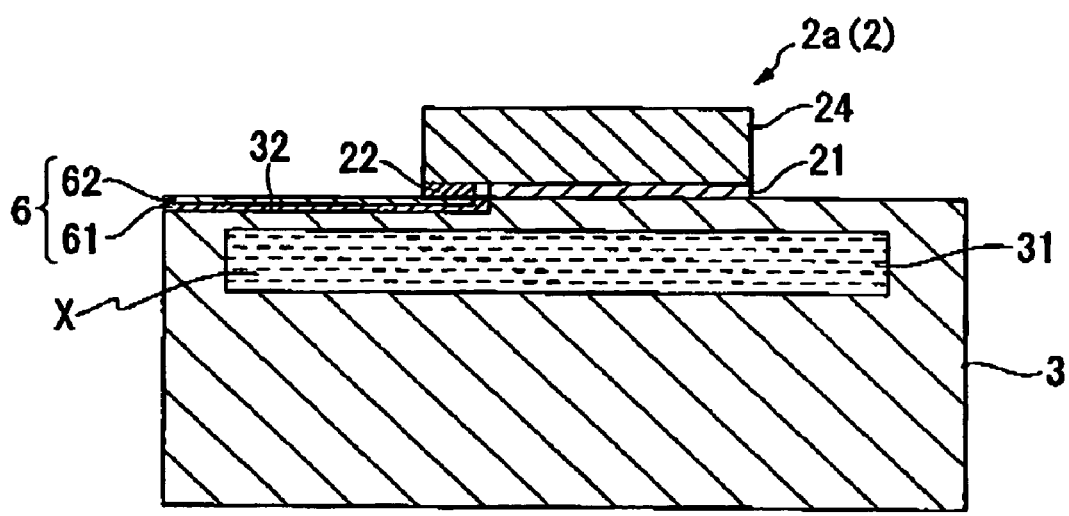

FIG. 6 is an enlarged schematic view showing the vicinity of a light emitting chip 2*a* that emits blue light and green light in the light source apparatus according to the second embodiment. FIG. 6A shows the top surface thereof while FIG. 6B shows a cross-section thereof. As is shown in these drawings, in the light source apparatus according to the second embodiment, a concave portion 32 is formed in a top portion of the base 3, and the wiring substrate 6 is embedded in this concave portion 32. As a result of this, the top surface of the wiring substrate 6 and the top surface of the base 3 are at the same height.

According to this light source apparatus according to the second embodiment, because the top surface of the wiring substrate 6 and the top surface of the base 3 are the same height, the light emitting chip 2 can be easily placed horizontally, and the thickness of the first bump 21 can be made thinner than in the light source apparatus according to the first embodiment.

The portion of the light emitting chip 2 that actually generates heat is the main body portion 24 that includes the light generating layer. Therefore, in the above described light source apparatus according to the first embodiment, the thicker the thickness of the first bump 21, the more difficult it is for a quantity of heat to be transmitted to the base 3. Accordingly, by making the thickness of the first bump 21 thinner, as in the second embodiment, a light source apparatus can be obtained that has a greater heat discharging effect.

THIRD EMBODIMENT

Next, a third embodiment of the light source apparatus according to the present invention will be described with reference made to FIG. 7.

Note that component elements that are the same as component elements in the second embodiment are given the same descriptive symbol and any description thereof is either omitted or simplified.

Figure 7A:
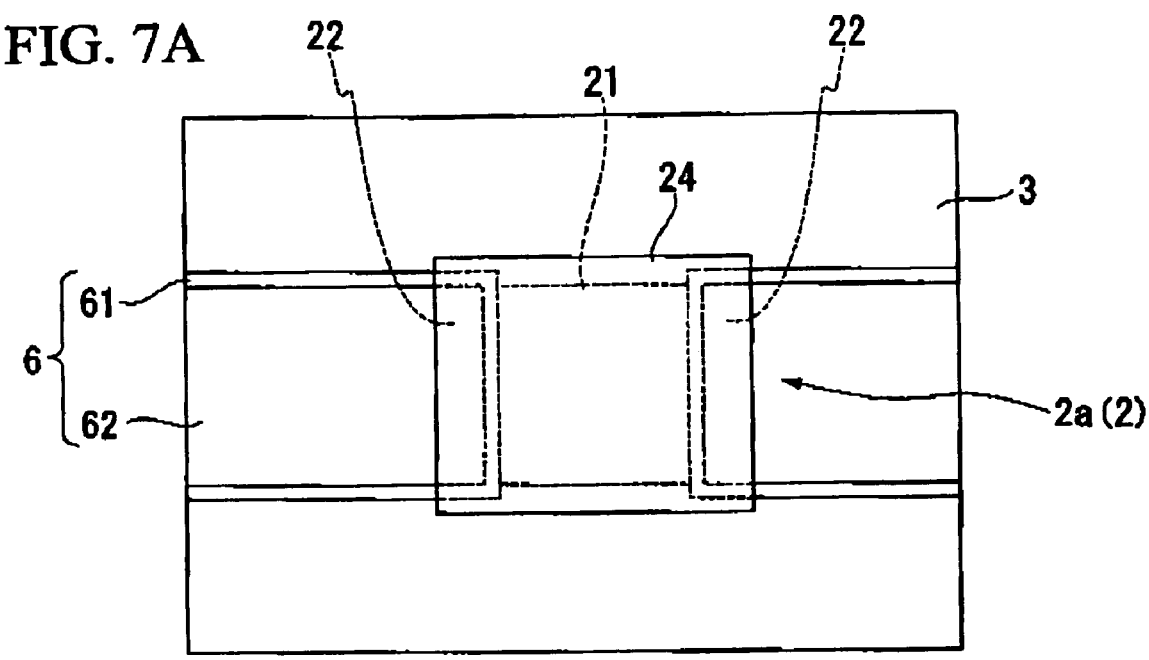
FIGS. 7A and 7B are enlarged schematic structural views of a vicinity of a light emitting chip 2a of a light source apparatus according to the third embodiment of the present invention.
Figure 7B:
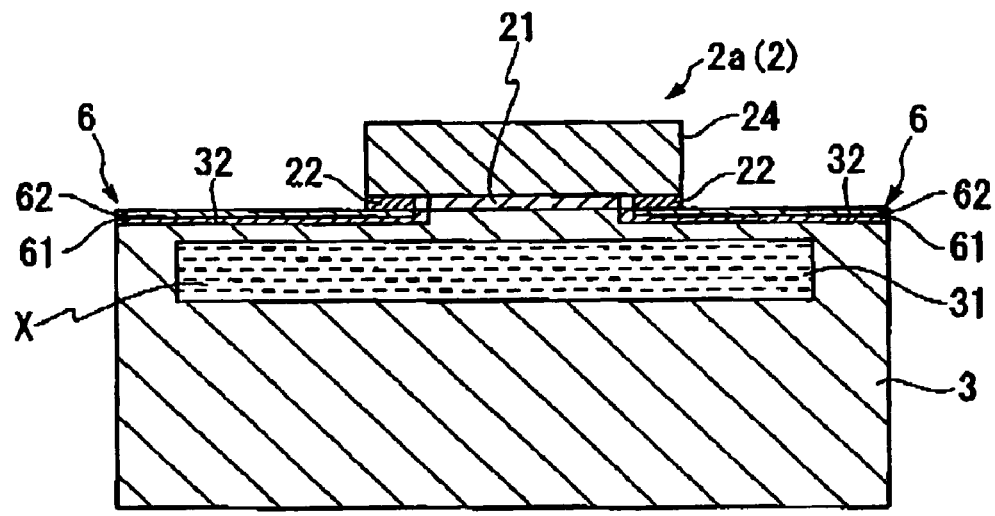

FIG. 7 is an enlarged schematic structural view showing the vicinity of a light emitting chip 2*a* that emits blue light and green light in the light source apparatus according to the third embodiment. FIG. 7A shows the top surface thereof while FIG. 7B shows a cross-section thereof. As is shown in these drawings, in the light source apparatus according to the third embodiment, two wiring substrates 6 are connected to both ends of the light emitting chip 2a. As a result of a wiring substrate 6 that is provided with a conductive layer 62 that has the function of an electrode being connected to both ends of the light emitting chip 2a in this way, it is possible to reduce the size of the current supplied to each wiring substrate 6. Namely, according to the light source apparatus according to the third embodiment, in addition to the same effects as in the above described first and second embodiments being obtained, because the electrical resistance can be reduced over the wiring substrates 6 as a whole, it is possible to prevent heat being generated in the wiring substrate 6.

Figure 8:
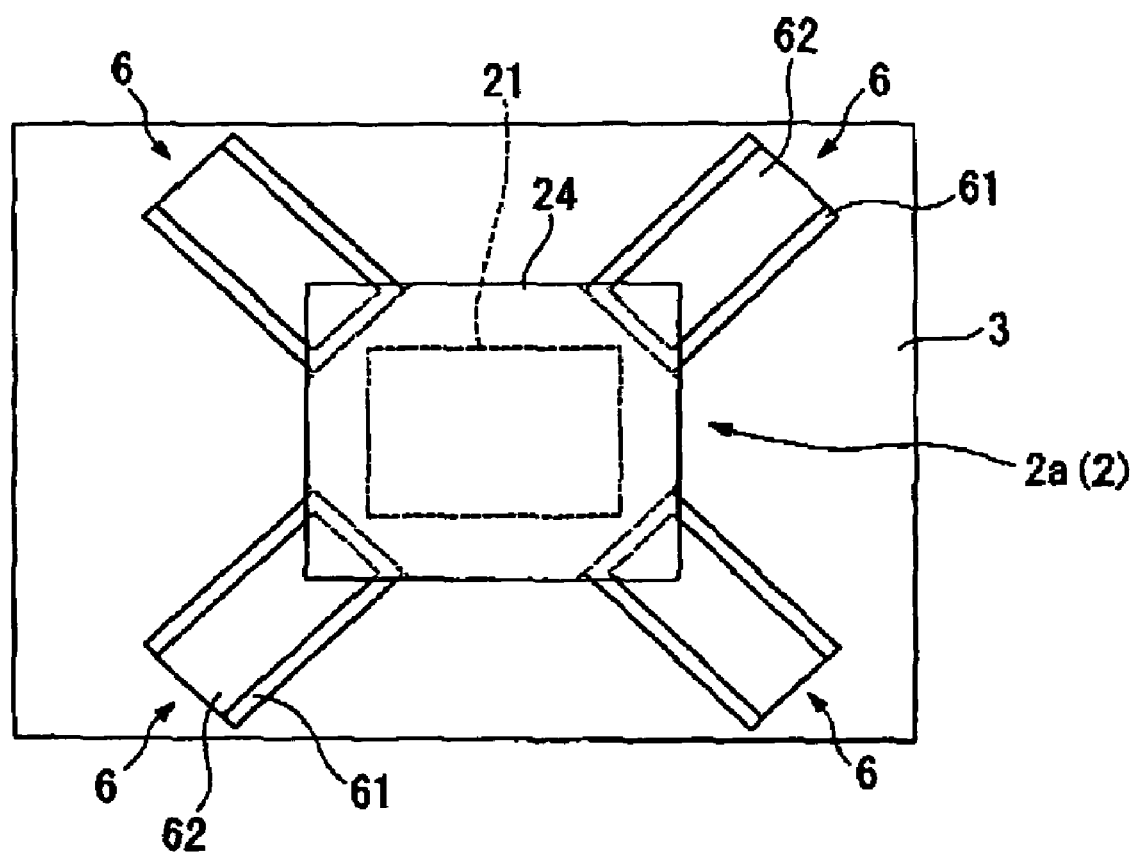
FIG. 8 is a view showing a variant example of the light source apparatus according to the third embodiment of the present invention.

Note that, as is shown in the top surface drawing in FIG. 8, it is also possible to connect a plurality of wiring substrates 6 via bumps to the vicinity of the end portions of the light emitting chip 2. In such a case as this as well, because it is possible to reduce the size of the current supplied to each wiring substrate 6, it is possible to prevent heat being generated in the wiring substrates 6.

FOURTH EMBODIMENT

Light Source Apparatus

Figure 9:
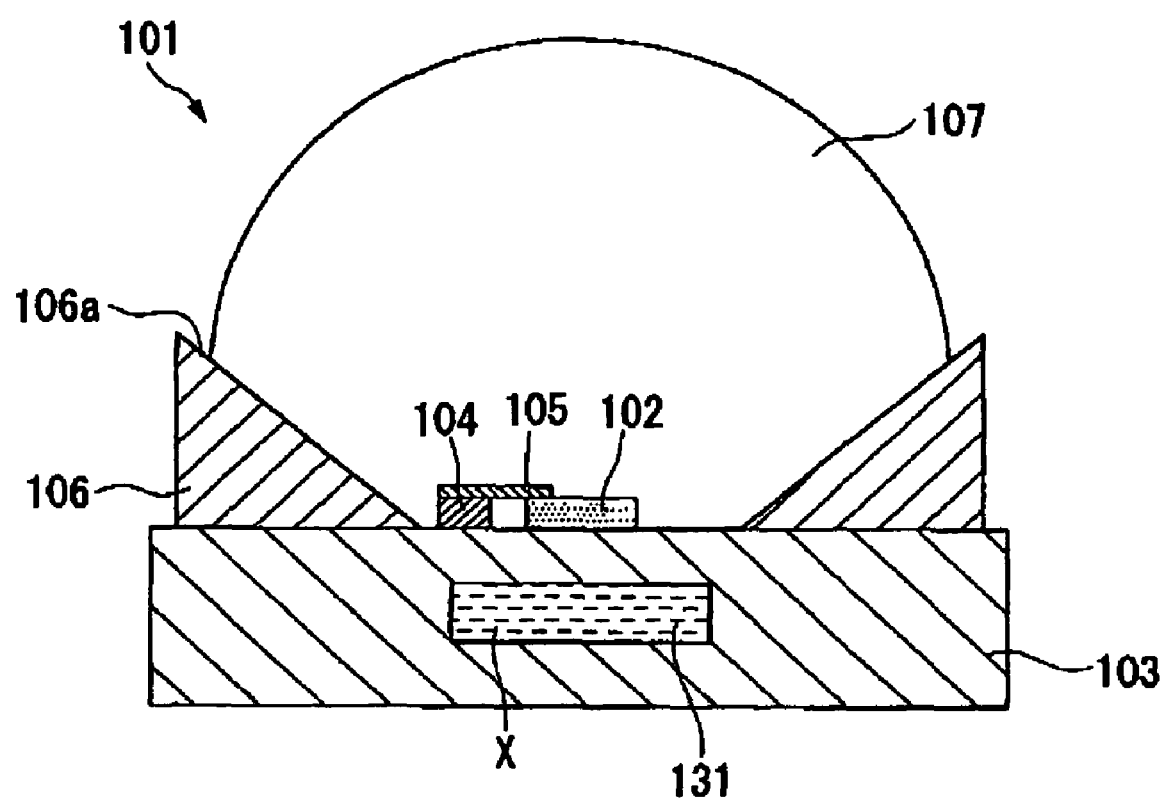
FIG. 9 is a schematic structural view of a light source apparatus according to the fourth embodiment of the present invention.

FIG. 9 is a schematic structural view of a light source apparatus according to the fourth embodiment.

As is shown in FIG. 9, a light source apparatus 101 according to the present embodiment is provided with a light emitting chip 102 that generates light and heat upon being energized. The light emitting chip 102 is directly packaged on (i.e., supported by) a base 103 that is formed from a metal material. An insulating layer 104 that has substantially the same thickness as the light emitting chip 102 is placed on top of the base 103, and an upper electrode 105 (i.e., a second electrode) that extends from a top surface of the insulating layer 104 so as to connect with a top surface of the light emitting chip 102 is placed on the top surface of the insulating layer 104.

A passage 131 through which flows a coolant X is formed inside the base 103. This passage 131 is positioned below the light emitting chip 102. Note that the passage 131 extends in a vertical direction relative to the surface of the paper showing FIG. 9, and is connected to a pump (not shown) that supplies the coolant X to the passage 131.

A toroidal reflecting mirror 106 is formed on a top surface of the base 103 so as to surround the light emitting chip 102. The reflecting mirror 106 reflects light that has been emitted towards the sides from the light emitting chip 102 in an upward direction as seen in the drawing (i.e., in the direction of light emission from the light source apparatus 101). Because of this, an inner surface 106a of the reflecting mirror 106 is formed as a sloping surface in a shape of a bank, and at least this inner surface 106a is in a mirror surface state or has high reflectance. In addition, a lens 107 is formed so as to cover the entire top surface of the base 103. The lens 107 condenses light that is emitted radiating outwards from the light emitting chip 102 in the irradiation direction of the light source apparatus 101. Because of this, the lens 107 is formed from a transparent material such as an epoxy resin, and is formed as a concave lens that is thicker in the center portion than in the peripheral portions thereof.

The light emitting chip 102 is a diode (LED) that emits light when current is supplied to p-n junction portion thereof.

In homo-junction types of LED in which identical semiconductor materials are bonded together, because there are no barriers against carriers injected into the light emitting portion, the carriers spread to the diffusion length inside the semiconductors. In contrast to this, in hetero-junction types of LED in which different semiconductor materials are bonded together, because barriers against carriers are incorporated in the structure, it is possible to greatly increase the density of carriers injected into the light emitting portion. In particular, in a double hetero-junction type of LED in which a light emitting layer is inserted between cladding layers, the narrower the light emitting layer the more the carrier density can be increased, and the internal quantum efficiency can be improved. On the other hand, in a homo-junction type of LED, because the material that is in contact with the exterior is the same as the material of the light emitting portion, the light generation ends up being absorbed by its own material. In contrast, in a double hetero-junction type of LED, because a light emitting layer formed from a material having a narrow bandgap is inserted between cladding layers formed from a material having a wide bandgap, it is possible to reduce self-absorption and improve the light acquisition efficiency. Accordingly, it is desirable that a double hetero-junction type of LED that has excellent light generating efficiency is used.

The light emitting chip 102 is formed by growing AlGaInP based compound semiconductor crystals on a substrate such as gallium arsenide (GaAs) or the like. Note that there is a limit as to how far the light acquisition efficiency of the LED can be improved in order for the GaAs substrate to absorb visible light. Therefore, in the light emitting chip 102 according to the present embodiment, it is desirable that the GaAs substrate is removed after the semiconductor crystals have been grown thereon, and then a gallium phosphate (GaP) substrate that is transparent in the light emission wavelength is adhered onto the GaAs substrate by applying high temperature and pressure. A double hetero-junction structure is then employed in which an AlGaInP light emitting layer is inserted between a cladding layer performed by n-Ga P and a cladding layer formed by p-GaP.

Figure 10A:
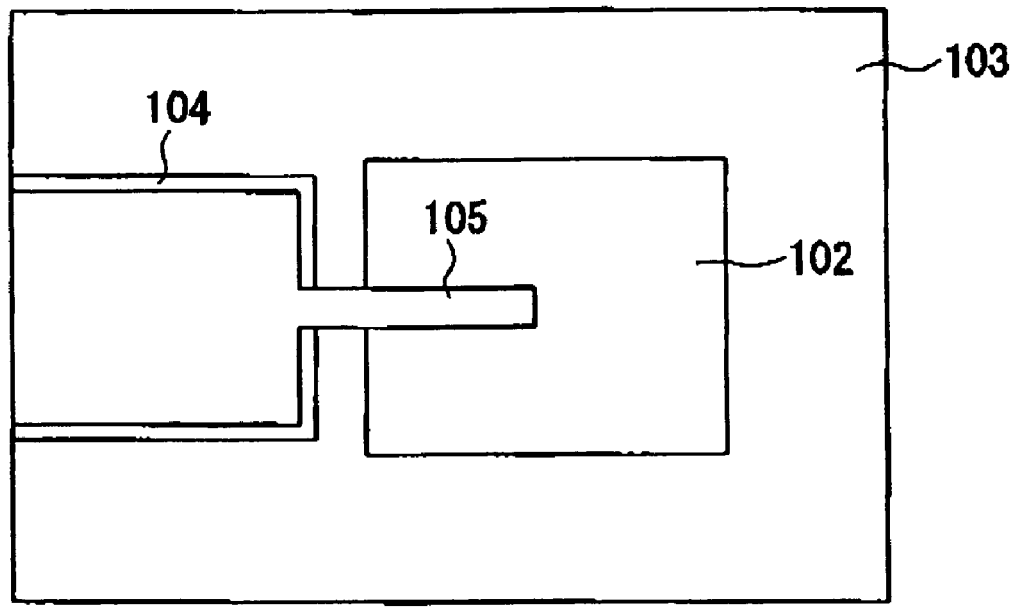
FIGS. 10A and 10B are enlarged schematic structural views of a vicinity of a light emitting chip 102 of the above light source apparatus.
Figure 10B:
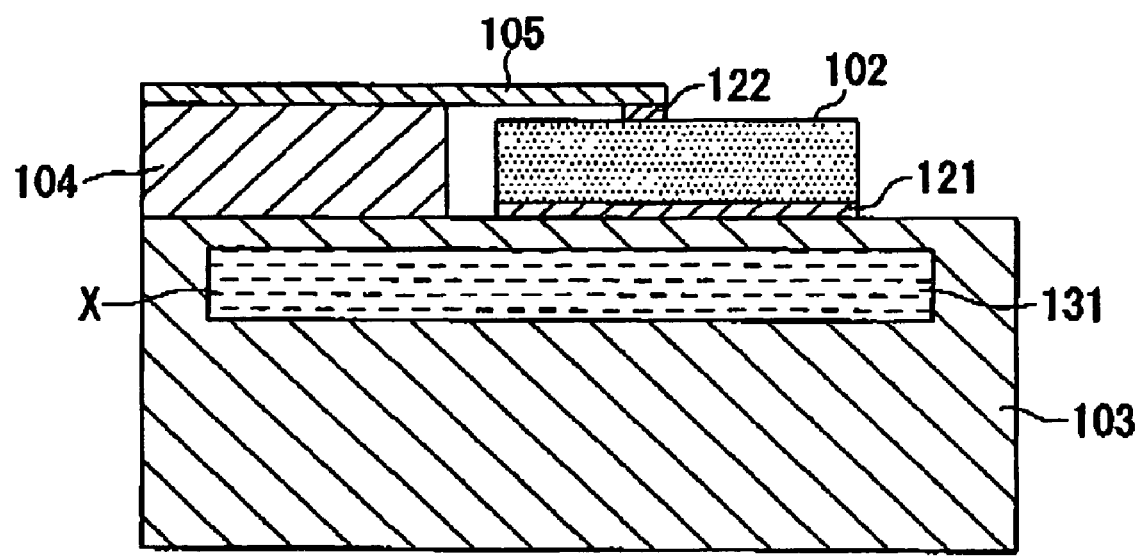

FIG. 10 is an enlarged schematic structural view showing the vicinity of a light emitting chip 102, FIG. 10A shows the top surface thereof while FIG. 10B shows a cross-section thereof. As is shown in these drawings, the light emitting chip 102 has a bump 121 (i.e., a connecting terminal) used for connecting to the base 103 and a bump 122 (i.e., a connecting electrode) used for connecting to the upper electrode 105.

The base 103 and the upper electrode 105 are connected to a power supply apparatus (not shown), and the light emitting chip 102 generates light and heat upon being energized via the base 103 and the upper electrode 105.

Namely, the base 103 has the functions of a lower electrode (i.e., a first electrode), and as a result of the light emitting chip 102 being directly packaged on this base 103, it is placed in a state of insertion between the upper electrode 105 and the base 103 (i.e., the low electrode).

The upper electrode 105 extends from the top surface of the insulting layer 104, as is described above, and is connected to the bump 122 that is placed substantially in a center portion of the top surface of the light emitting chip 102. Here, because the insulating layer 104 has substantially the same thickness as or a slightly thicker thickness than the light emitting chip 102, as is shown in the drawing, by extending the upper electrode 105 substantially horizontally from the top surface of the insulating layer 104, the upper electrode 105 can be connected to the bump 122. Accordingly, unlike a conventional bonding wire, the width of the upper electrode 105 can be easily made thicker; and the electrical resistance thereof can be lowered. Note that the same Au, Ag or Cu that is used for a conventional bonding wire can be used as the material forming the upper electrode 105. If Au is used for the material of the upper electrode 105, it is possible to prevent corrosion, for example, of the upper electrode 105 in the contact portion between the upper electrode 105 and the bump 122. However, because the upper electrode 105 according to the present embodiment is thicker than a conventional bonding wire, if Au is used as the formation material thereof, an increase in the manufacturing cost of the light source apparatus 101 may be incurred. Accordingly, it is preferable that less expensive Ag or Cu or Au plated Cu that have substantially the same electrical resistance as Au are used.

When the light emitting chip 102 of the light source apparatus 101 according to the fourth embodiment that has the above described structure is energized via the base 103 and the upper electrode 105, because the electrical resistance of the upper electrode 105 is thicker than in a conventional bonding wire, it is possible to suppress the generation of heat in the upper electrode 105. Accordingly, according to the light source apparatus 101 of the fourth embodiment, it is possible to suppress the generation of heat in the upper electrode 105, and to prevent wire breakages in the upper electrode 105.

Moreover, the light emitting chip 102 generates light and heat upon being energized via the base 103 and the upper electrode 105. At this time, because the light emitting chip 102 (i.e., the high heat source) and the low heat source are adjacent due to the light emitting chip 102 being directly packaged on the base 103, the quantity of heat that is generated in the light emitting chip 102 can be efficiently discharged. Accordingly, it is possible to improve the heat discharge effect of the light source apparatus 101. Furthermore, in the light source apparatus 101 according to the fourth embodiment, a passage 131 is formed inside the base 103, and a coolant X flows inside the passage 131. Accordingly, because this flowing coolant X is used as the low heat source, the heat discharging effect in the light source apparatus 101 can be further improved.

Of the light that is emitted by the light emitting chip 102, light that is emitted upwards looking at FIG. 9 is emitted in its existing state via the lens 107, while light that is emitted to the sides is first reflected by the inner surface 106a of the reflecting mirror 106 and is then emitted via the lens 107, while light that is emitted downwards looking at FIG. 9 is first reflected by the top surface of the base 103 and is then emitted via the lens 107.

In addition, because a conventional bonding wire is a narrow wire member, when a plurality of light source apparatuses were being manufactured, in many cases the position of the bonding wire in each light source apparatus was different. If, in this way, the position of the bonding wire in each light source apparatus is different, the brightness distribution in each light source apparatus ends up being different. Accordingly, in a conventional light source apparatus, when a plurality of light source apparatuses are being manufactured, the problem arises that the light generating characteristics of each light source apparatus are different.

In contrast to this, according to the light source apparatus 101 according to the fourth embodiment, the upper electrode 105 is thick and the position thereof and the light source apparatus 101 can be fixed at all times. Accordingly, even when a plurality of light source apparatuses 101 are being manufactured, it is possible to guarantee uniformity in the light generating characteristics of each light source apparatus 101.

Projector

The structure of the projector of the present embodiment is fundamentally the same as the projector of the first embodiment shown in FIG. 5.

Here, according to the light source apparatus of the present embodiment, wire breakages in the upper electrode 105 are prevented. Accordingly, it is possible to provide a protector having improved reliability by preventing wire breakages that are caused by driving the light source apparatus 512 with a large current.

FIFTH EMBODIMENT

Next, the fifth embodiment of the light source apparatus according to the present invention will be described with reference made to FIG. 11A and FIG. 11B. Note that component elements that are the same as component elements in the fourth embodiment are given the same descriptive symbol and any description thereof is either omitted or simplified.

Figure 11A:
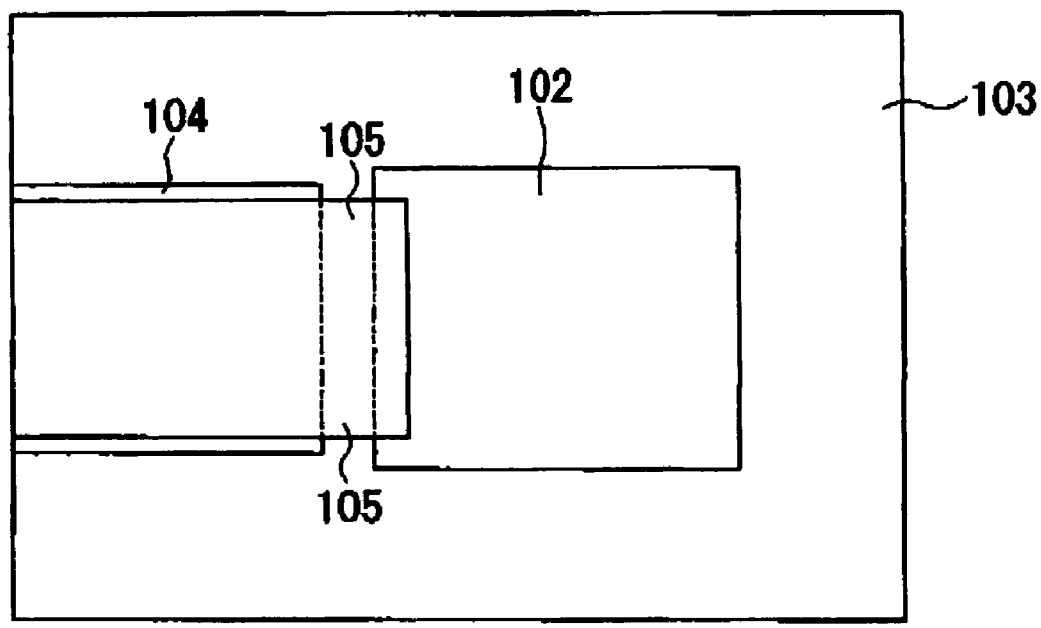
FIGS. 11A and 11B are enlarged schematic structural views of a vicinity of a light emitting chip 102 of a light source apparatus according to the fifth embodiment of the present invention.
Figure 11B:
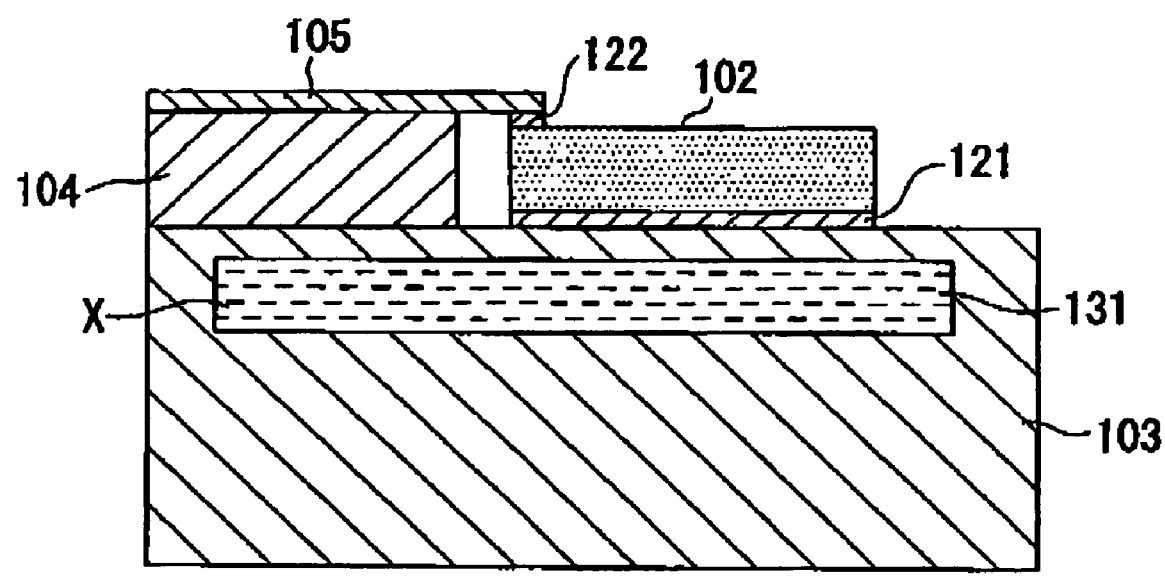

FIG. 11A and FIG. 11B are enlarged schematic structural views showing a portion of the light emitting chip 102 and the light source apparatus according to the fifth embodiment. FIG. 11A shows a top surface thereof while FIG. 11B shows a cross-section thereof. As is shown in these drawings, in the light source apparatus according to the fifth embodiment, the upper electrode 105 extends from the top surface of the insulating layer 104 in a state of having substantially the same width as the width of the top surface of the light emitting chip 102. Furthermore, the upper electrode 105 is connected to the bump 122 in the vicinity of an end portion of the light emitting chip 102.

According to the light source apparatus according to the fifth embodiment having the above described structure, because the upper electrode 105 has substantially the same width as the width of the light emitting chip 102, it is possible to lower the electrical resistance of the upper electrode 105 even more than in the fourth embodiment without the thickness thereof. Accordingly, it is possible to prevent wire breakages in the upper electrode 105 with more certainty without causing the size of the light source apparatus to be enlarged.

Moreover, because the upper electrode 105 is connected to the vicinity of an end portion of the light emitting chip 102, unlike the case in the fourth embodiment, the extent of the top surface, namely, of the emission surface of the light emitting chip 102 that is covered by the upper electrode 105 is small. Accordingly, it is possible to provide a light source apparatus that has even more excellent light generating characteristics.

SIXTH EMBODIMENT

Next, the sixth embodiment of the light source apparatus according to the present invention will be described with reference made to FIG. 12A and FIG. 12B. Note that component elements that are the same as component elements in the fifth embodiment are given the same descriptive symbols and any description thereof is either omitted or simplified.

Figure 12A:
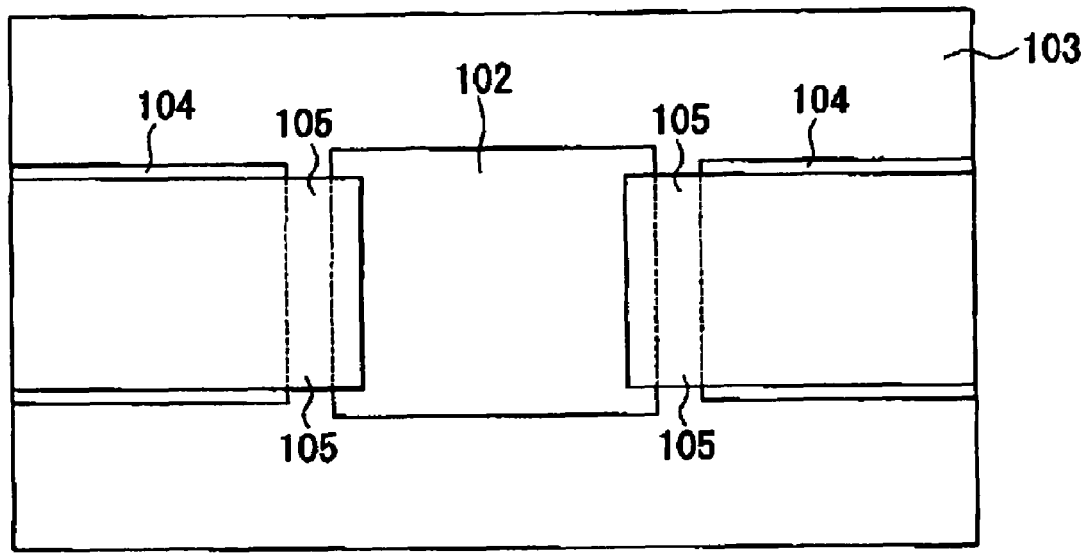
FIGS. 12A and 12B are enlarged schematic structural views of a vicinity of a light emitting chip 102 of a light source apparatus according to the sixth embodiment of the present invention.
Figure 12B:
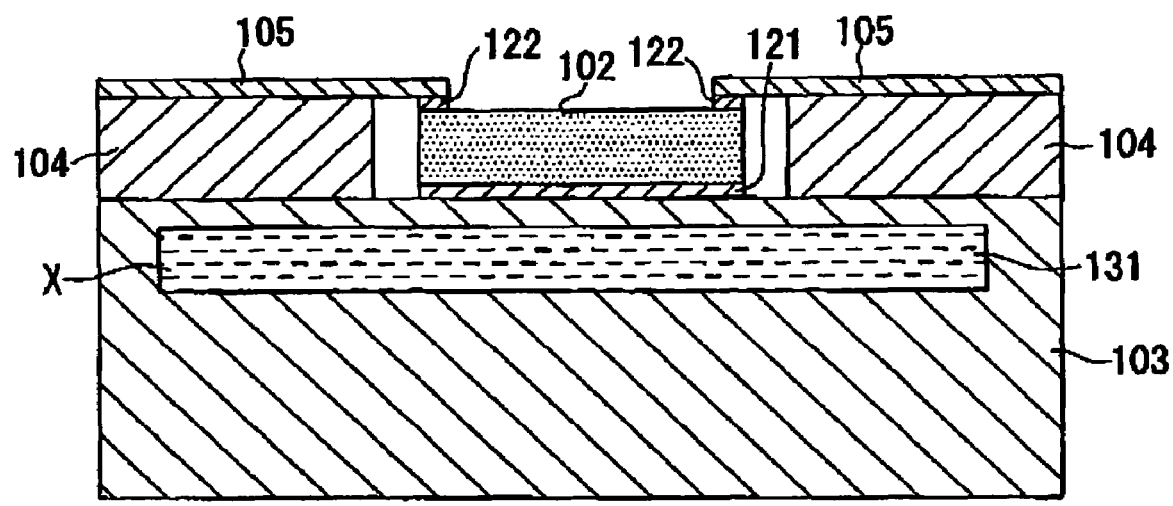

FIG. 12A and FIG. 12B are enlarged schematic structural views showing a portion of the light emitting chip 102 and the light source apparatus according to the sixth embodiment. FIG. 12A shows a top surface thereof while FIG. 12B shows a cross section thereof. As is shown in these drawings, in the light source apparatus according to the sixth embodiment, two insulating layers 104 are placed at both ends of the light emitting chip 102, and the upper electrodes that extend from each insulating layer are connected to a vicinity of end portions of the light emitting chip 102 via respective bumps 122. As a result of the upper electrodes 105 being connected to both ends of the light emitting chip 102 in this manner, it is possible to reduce the quantity of current that is flowing through each upper electrode 105. Namely, according to the light source apparatus according to the sixth embodiment, because the electrical resistance of the upper electrode 105 as a whole can be reduced more than in the fifth embodiment, it is possible to more reliably prevent wire breakages in the upper electrode 105.

Figure 13:
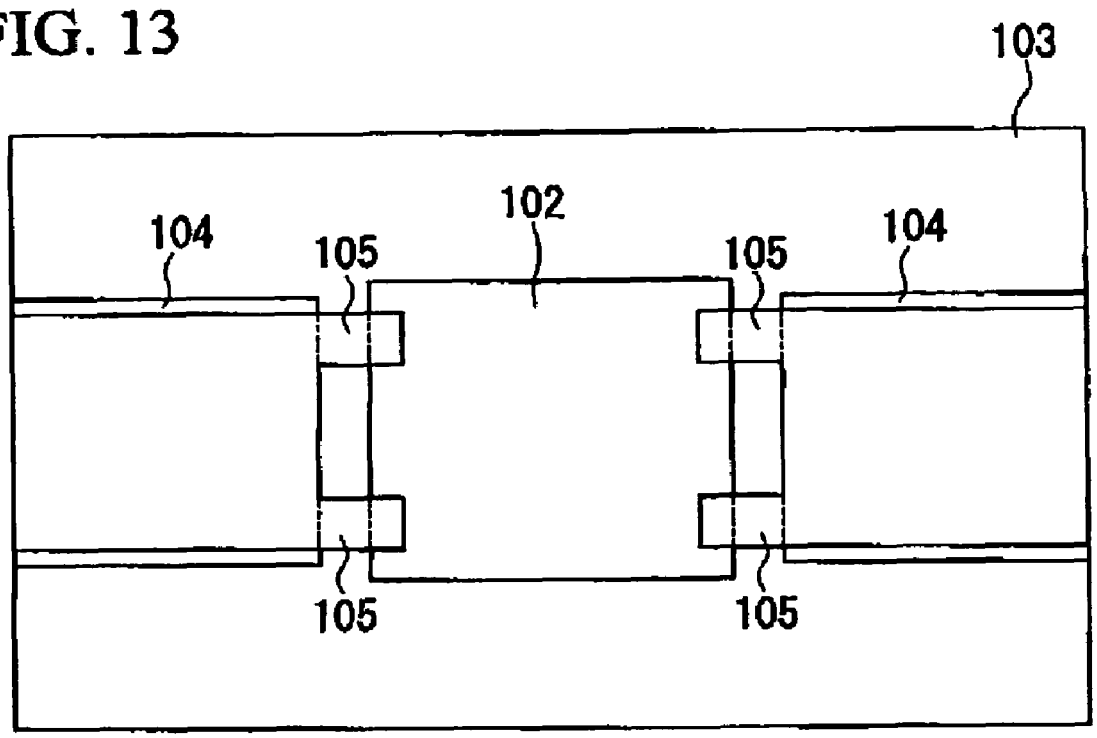
FIG. 13 is a view showing a variant example of the light source apparatus according to the sixth embodiment of the present invention.

Note that, as is shown in the top surface drawing in FIG. 13, it is also possible to divide the upper electrodes 105 that extend from the top surfaces of the insulating layers 104 into a plurality of electrodes, and connect each of these to the top surface of the light emitting chip 102. In this type of configuration, the overall electrical resistance of the upper electrode 105 is greater than in the configuration shown in FIG. 12A and FIG. 12B, however, because the extent of the emission surface of the light emitting chip 102 that is covered by the upper electrode 105 is small, it is possible to provide a light source apparatus that has even more excellent light generating characteristics.

SEVENTH EMBODIMENT

Light Source Apparatus

FIG. 14A and FIG. 14B are schematic structural views of a light source apparatus according to the seventh embodiment of the present invention. FIG. 14B is a frontal view, while FIG. 14A is a cross-sectional view taken along a line A-A' in FIG. 14B.

As is shown in FIG. 14A and FIG. 14B, a light source apparatus 201 according to the present embodiment is provided with a light emitting chip 202 that generates light and heat upon being energized. The light emitting chip 202 is directly packaged on (i.e., supported by) a base 203 that is formed from a metal material. An insulating layer 204 that has substantially the same thickness as the light emitting chip 202 is placed on top of the base 203, and an upper electrode 205 (i.e., a second electrode) that extends from a top surface of the insulating layer 204 so as to connect with a top surface of the light emitting chip 202 is placed on the top surface of the insulating layer 204. A connecting material 208 is placed on top of the upper electrode 205. Any material that has conductivity can be used as the connecting material 208, however, it is preferable for solder or a conductive adhesive agent whose shape can be easily changed during manufacturing to be used. Note that the wiring substrate of the present invention is formed by the upper electrode 205 (i.e., the conductive layer) and the insulating layer 204 in the present embodiment.

A passage 231 through which flows a coolant X is formed inside the base 203. This passage 231 is positioned below the light emitting chip 202. Note that the passage 231 extends in a vertical direction relative to the surface of the paper showing FIG. 14B, and is connected to a pump (not shown) that supplies the coolant X to the passage 231.

An insulating spacer 209 that has substantially the same top surface as the top surface of the connecting material 208 is placed on the base 203, and a toroidal reflecting mirror 206 (i.e., a reflective portion) is formed on the connecting material 208 and the spacer 209 so as to surround the light emitting chip 202. The reflecting mirror 206 has an inner surface 206a (i.e., a reflective surface) that reflects light that has been emitted towards the sides from the light emitting chip 202 in an upward direction as seen in FIG. 14A (i.e., in a predetermined emission direction). This inner surface 206a is formed as a sloping surface in a shape of a bank and is in a surface state or has high reflectance. In addition, the reflect mirror 206 is formed from a conductive material and is electrically connected to the upper electrode 205 via the connecting material 208. Namely, the upper electrode 205 is energized via the reflecting mirror 206. Moreover, a lens 207 is formed so as to cover the entire top surface of the base 203. The lens 207 condenses light that is emitted radiating outwards from the light emitting chip 202 in the irradiation direction of the light source apparatus 201. Because of this, the lens 207 is formed from a material having an optical function of allowing light emitted from the light emitting chip 202 to pass through without any of this light being lost, and is formed, for example, from a transparent material such as glass, an acrylic resin, a polycarbonate, or an epoxy resin. The lens 207 is also formed as a concave lens that is thicker in the center portion than in the peripheral portions thereof. As is shown in the drawings, an external connecting element 210 is connected to an outer side (i.e., to the non-light emitting chip side) of the reflecting mirror 206, and the reflecting mirror 206 is energized via the external connecting terminal 210.

The light emitting chip 202 is a diode (LED) that emits light when current is supplied to p-n junction portion thereof.

In homo-junction types of LED in which identical semiconductor materials are bonded together, because there are no barriers against carriers injected into the light emitting portion, the carriers spread to the diffusion length inside the semiconductors. In contrast to this, in hetero-junction types of LED in which different semiconductor materials are bonded together, because barriers against carriers are incorporated in the structure it is possible to greatly impose the density of carriers injected into the light emitting portion. In particular, in a double hetero-junction type of LED in which a light emitting layer is inserted between cladding layers, the narrower the light emitting layer the more the carrier density can be increased, and the internal quantum efficiency can be improved. On the other hand, in a homo-junction type of LED, because the material that is in contact with the exterior is the same as the material of the light emitting portion, the light generation ends up being absorbed by its own material. In contrast, in a double hetero-junction type of LED, because a light emitting layer formed from a material having a narrow bandgap is inserted between cladding layers formed from a material having a wide bandgap, it is possible to reduce self-absorption and improve the light acquisition efficiency. Accordingly, it is desirable that a double heterojunction type of LED that has excellent light generating efficiency is used.

The light emitting chip 202 according to the seventh embodiment is formed by growing AlGaInP based compound semiconductor crystals on a substrate such as gallium arsenide (GaAs) or the like. Note that there is a limit as to how far the light acquisition efficiency of the LED can be improved in order for the GaAs substrate to absorb visible light. Therefore, in the light emitting chip 202 according to the present embodiment, it is desirable that the GaAs substrate is removed after the semiconductor crystals have been grown thereon, and then a gallium phosphate (GaP) substrate that is transparent in the light emission wavelength is adhered onto the GaAs substrate by applying high temperature and pressure. A double hetero-junction structure is then employed in which an AlGaInP light emitting layer is inserted between a cladding layer performed by n-Ga P and a cladding layer formed by p-GaP.

As is shown in the drawings, the light emitting chip 202 has a bump 221 used for connecting to the base 203 and a bump 222 used for connecting to the upper electrode 205. The base 203 and the upper electrode 205 are connected to a power supply apparatus (not shown), and the light emitting chip 202 generates light and heat upon being energized via the base 203 and the upper electrode 205.

Namely, the base 203 has the functions of a lower electrode (i.e., a first electrode), and as a result of the light emitting chip 202 being directly packaged on this base 203, it is placed in a state of insertion between the upper electrode 205 and the base 103 (i.e., the lower electrode).

The upper electrode 205 extends from the top surface of the insulting layer 204, as described above, and is connected to the bump 222 that is placed in a vicinity of an end portion of the top surface of the light emitting chip 202. Here, because the insulating layer 204 has substantially the same thickness as or a slightly thicker thickness than the light emitting chip 202, as is shown in the drawing, by extending the upper electrode 205 substantially horizontally from the top surface of the insulating layer 204, the upper electrode 205 can be connected to the bump 222. Accordingly, unlike a conventional bonding wire, the width of the upper electrode 205 can be easily made thicker, and the electrical resistance thereof can be lowered. Moreover, because the upper electrode 205 is connected to the bump 222 that is placed in a vicinity of an end portion of the top surface of the light emitting chip 202, it is possible to secure a broad light emitting region for the light emitting chip 202.

Note that the same Au, Ag or Cu that is used for a conventional bonding wire can be used as the material forming the upper electrode 205. If Au is used for the material of the upper electrode 205, it is possible to prevent corrosion, for example, of the upper electrode 205 in the contact portion between the upper electrode 205 and the bump 222. However, because the upper electrode 205 according to the present embodiment is thicker than a conventional bonding wire, if Au is used as the formation material thereof, an increase in the manufacturing cost of the light source apparatus 201 may be incurred. Accordingly, it is preferable that less expensive Ag or Cu or Au plated Cu that have substantially the same electrical resistance as Au are used.

When the light emitting chip 202 of the light source apparatus 201 according to the seventh embodiment that has the above described structure is energized via the base 203 and the upper electrode 205, because the electrical resistance of the upper electrode 205 is thicker than in a conventional bonding wire, it is possible to suppress the generation of heat in the upper electrode 205. Accordingly, according to the light source apparatus 201 of the seventh embodiment, it is possible to suppress the generation of heat in the upper electrode 205, and to prevent wire breakages in the upper electrode 205.

Moreover, the light emitting chip 202 generates light and heat upon being energized via the base 203 and the upper electrode 205. At this time, because the light emitting chip 202 (i.e., the high heat source) and the low heat source are adjacent due to the light emitting chip 202 being directly packaged on the base 203, the quantity of heat that is generated in the light emitting chip 202 can be efficiently discharged. Accordingly, it is possible to improve the heat discharge effect of the light source apparatus 201. Furthermore, in the light source apparatus 201 according to the seventh embodiment, a passage 231 is formed inside the base 203, and a coolant X flows inside the passage 231. Accordingly, because this flowing coolant X is used as the low heat source, the heat discharging effect in the light source apparatus 201 can be further improved.

Of the light that is emitted by the light emitting chip 202, light that is emitted upwards looking at FIG. 14A is emitted in its existing state via the lens 207, while light that is emitted to the sides is first reflected by the inner surface 206a of the reflecting mirror 206 and is then emitted via the lens 207, while light that is emitted downwards looking at FIG. 14A is first reflected by the top surface of the base 203 and is then emitted via the lens 207.

According to the light source apparatus 201 according to seventh embodiment having the structure described above, the upper electrode 205 is energized via the reflecting mirror 206. This type of reflecting mirror 206 has a considerably broader cross sectional area than the narrow electrode wiring of conventional bonding wire and, as a result, the quantity of heat that is generated by the energizing is lower than that generated by narrow electrode wiring. Accordingly, in the light source apparatus 201 according to the seventh embodiment, because it is possible to prevent unnecessary heat generation in electrode wiring, excess load on the cooling system is reduced, and the heat discharge effect on the light emitting chip can be improved. Moreover, because melting of the electrode wiring can be prevented by suppressing the generation of heat in the electrode wiring, wire breakages in the electrode wiring can be prevented.

Figure 19A:
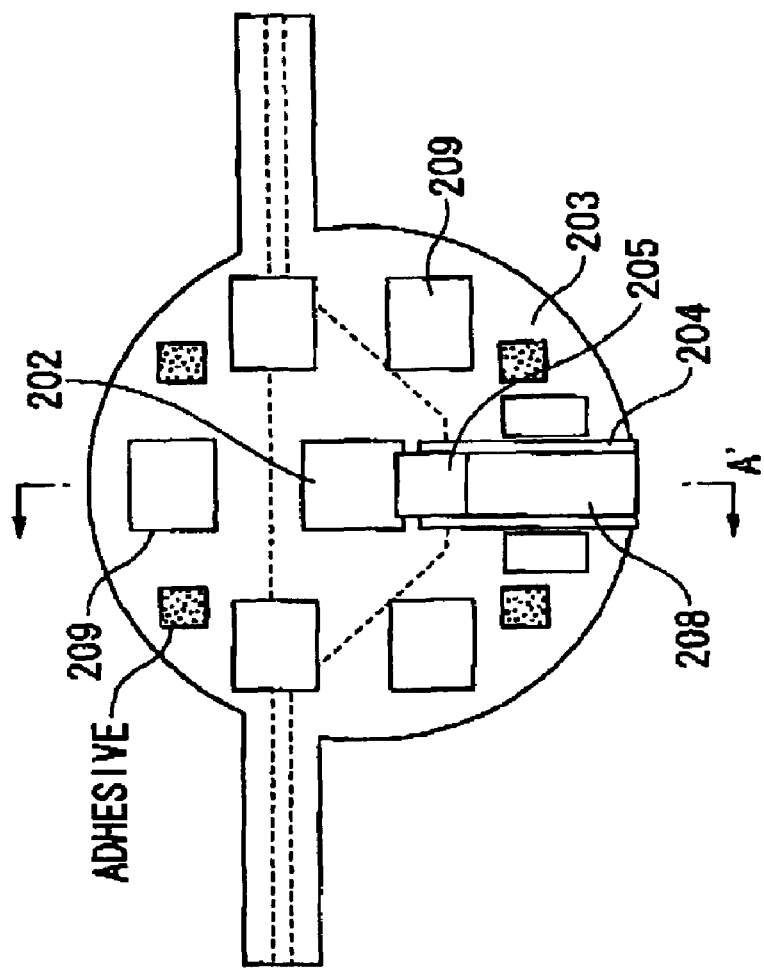
FIGS. 19A and 19B are views for describing a method of manufacturing the light source apparatus according to the seventh embodiment of the present invention.
Figure 19B:
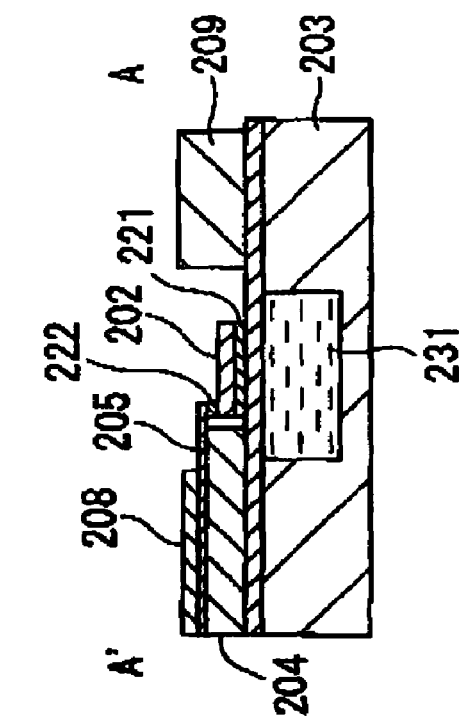
Figure 20A:
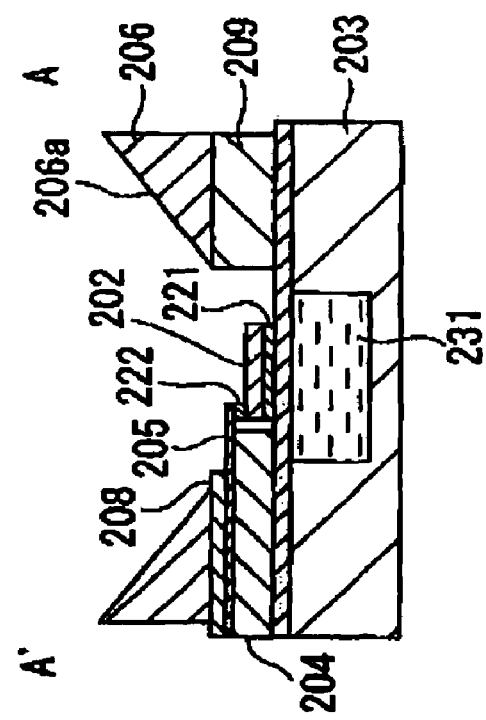
FIGS. 20A and 20B are views for describing a method of manufacturing the light source apparatus according to the seventh embodiment of the present invention.
Figure 20B:
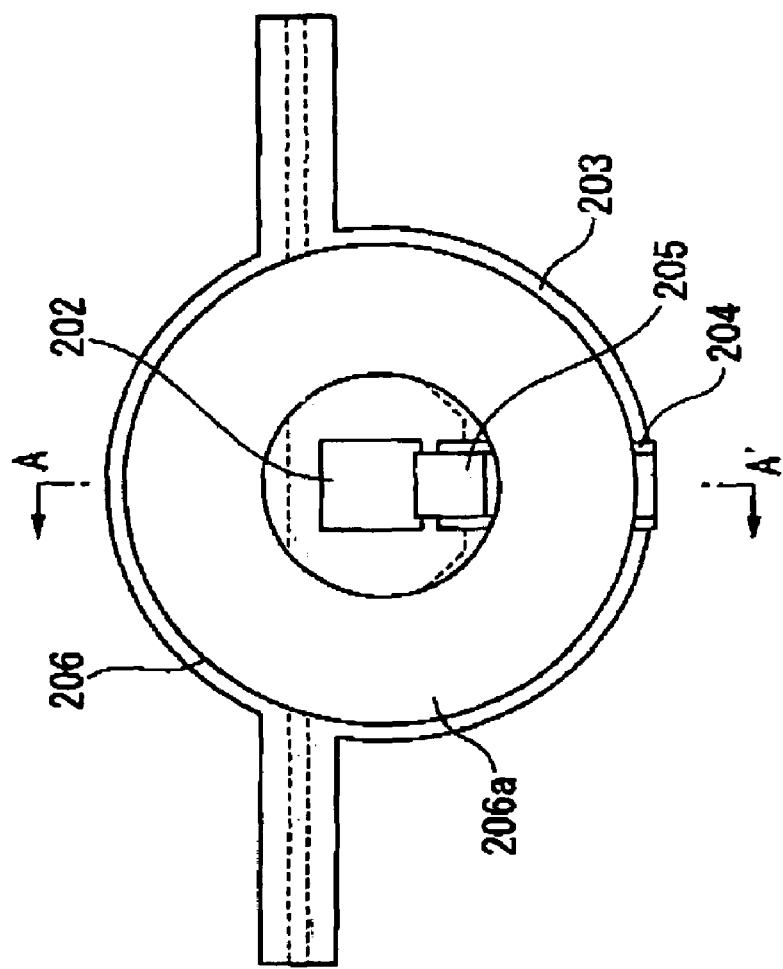
Figure 21A:
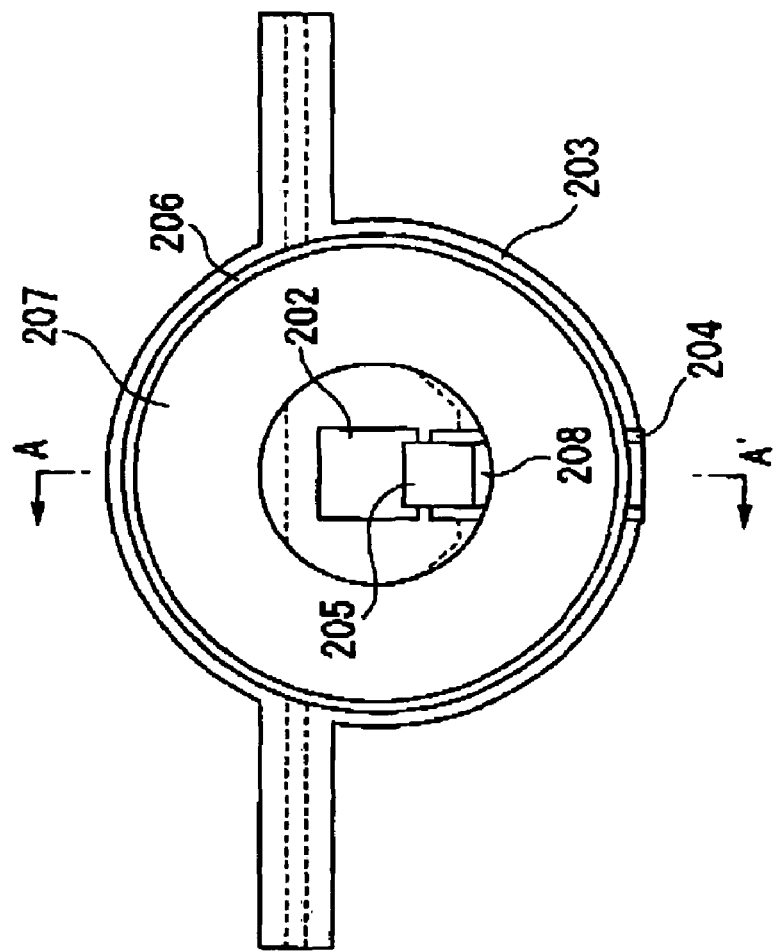
FIGS. 21A and 21B are views for describing a method of manufacturing the light source apparatus according to the seventh embodiment of the present invention.
Figure 21B:
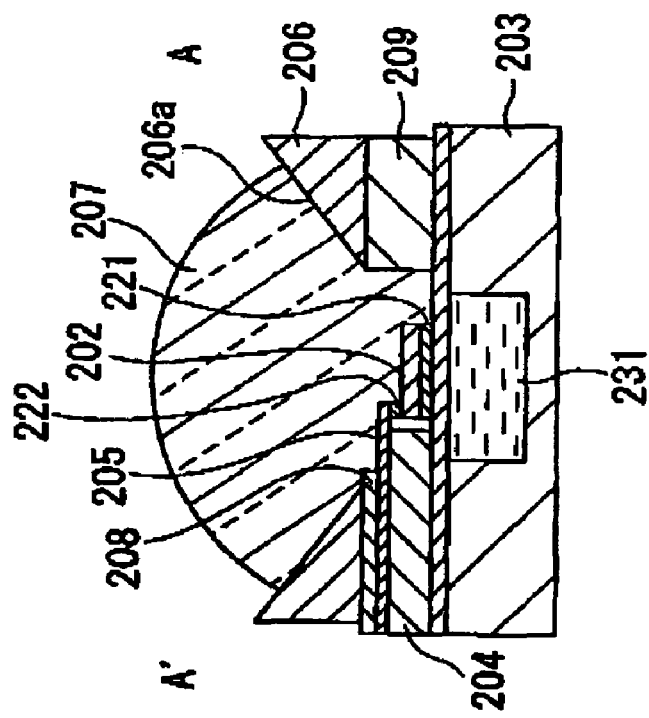

Next, a method of manufacturing the light source apparatus 201 according to the above described seventh embodiment will be described with reference made to FIGS. 15A and 15B through to FIGS. 21A and 21B. Note that in FIGS. 15A and 15B through to FIGS. 21A and 21B, FIGS. 15B, 16B, 17B, 18B, 19B, 20B, and 21B are frontal views, while FIGS. 15A, 16A, 17A, 18A, 19A, 20A, and 21A are cross-sectional views taken along the line A-A' in FIGS. 15B, 16B, 17B, 18B, 19B, 20B, and 21B.

Figures 15A, 15B:
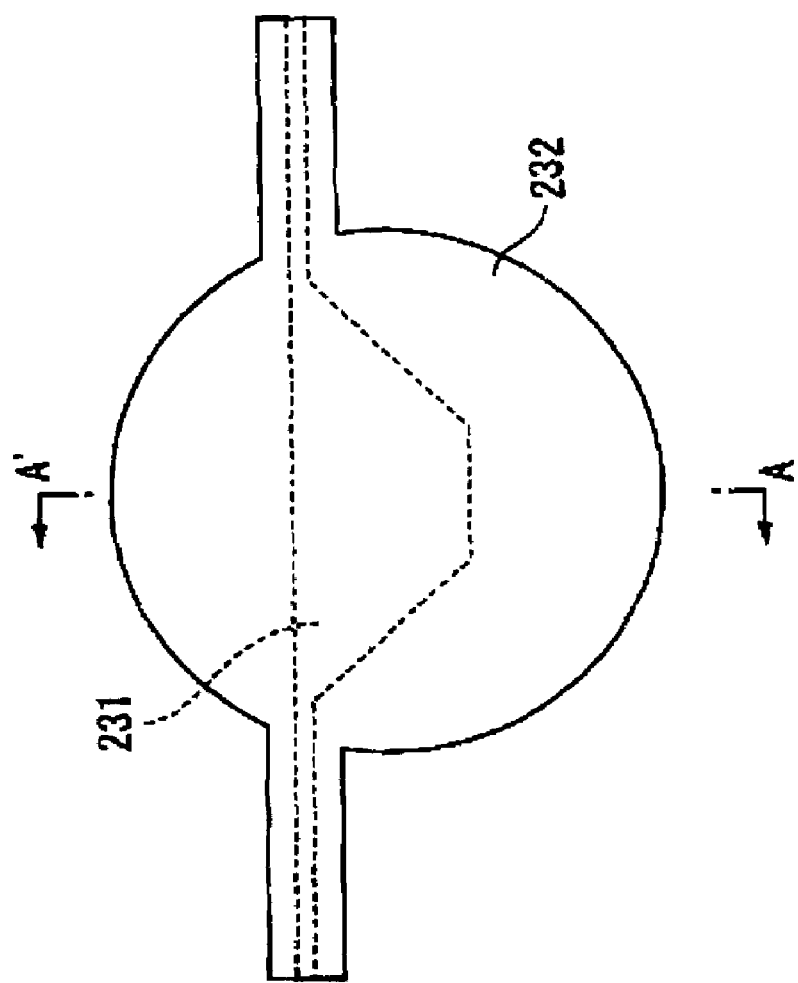
FIGS. 15A and 15B are views for describing a method of manufacturing the light source apparatus according to the seventh embodiment of the present invention.

Firstly, as is shown in FIG. 15A and FIG. 15B, a base 203 that has the passage 231 formed in the interior thereof is prepared. In order to form the base 203, a method can be employed in which, for example, a groove corresponding to the passage 231 is formed in a base main body 232, and a lid portion 233 that is formed from the same material as the main body of the base 203 is placed on top of the main body of the base 203 in which this groove is formed.

Figure 16B:
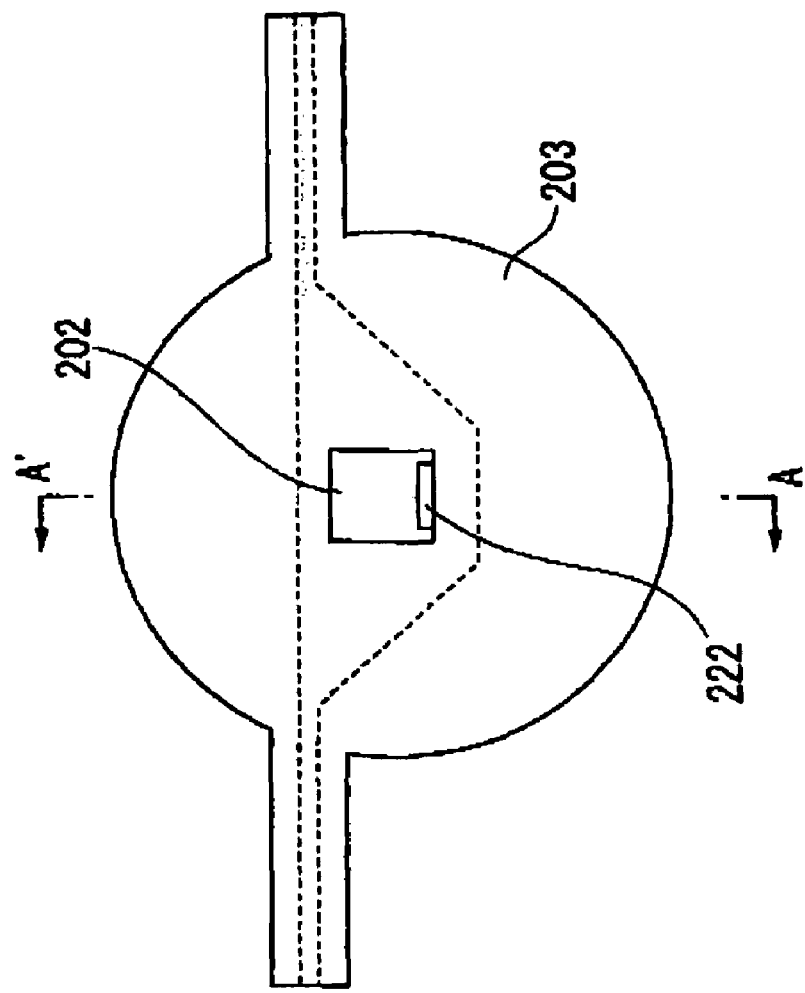
FIGS. 16A and 16B are views for describing a method of manufacturing the light source apparatus according to the seventh embodiment of the present invention.
Figure 16A:
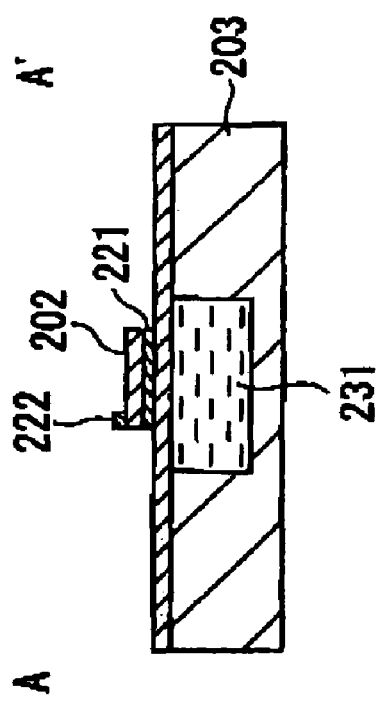

Next, as is shown in FIG. 16A and FIG. 16B, a light emitting chip 202 on which the bumps 221 and 222 have been formed is placed substantially in a center portion of a top surface of the base 203, namely, such that the bump 221 is connected with the base 203 above the passage 231. Next, as is shown in FIG. 17A and FIG. 17B, a wiring substrate formed by stacking the insulating layer 204 and the upper electrode 205 is placed on top of the base 203, and the upper electrode 205 is connected to the bump 222. Next, as is shown in FIG. 18A and FIG, 18B, the connecting material 208 is placed on top of the upper electrode 205. Next, as is shown in FIG. 19A and FIG. 19B, a plurality of spacers 209 and adhesive agent are placed on top of the base 203 around the light emitting chip 202. Subsequently, as is shown in FIG. 20A and FIG. 20B, the reflecting mirror 206 is placed on top of the spacers 209 and the connecting material 208. Note that, here, if solder or a conductive adhesive agent whose shape can be easily changed during manufacturing is used as the connecting material 208, then when the reflecting mirror 206 is being positioned, the inclination of the reflecting mirror 206 can be easily changed and micro adjustment of the angle of the reflecting mirror 206 can be easily performed, thereby simplifying the placement of the reflecting mirror 206. Continuing on, as is shown in FIG. 21A and FIG. 21B, the lens 207 is formed on top of the base 203, and thereafter, by connecting the external connecting terminal 210 to the outer side of the reflecting mirror 206, the light source apparatus 201 shown in FIG. 14A and FIG. 14B is manufactured.

Projector

The structure of the projector of the seventh embodiment is fundamentally the same as the projector of the first embodiment shown in FIG. 5.

Here, according to the light source apparatus of the present embodiment, because it is possible to prevent unnecessary heat generation that is due to electrical resistance in the electrode wiring which is caused by the light source apparatuses 512, 513, and 514 being driven by a large current excess load on the cooling system is reduced, and the heat discharge effect on the light emitting chip can be improved. Accordingly, it is possible to increase the quantity of light that is emitted from the light emitting chip, and it is possible to provide a projector with improved brightness. Moreover, because wire breakages are prevented by suppressing the generation of heat in the electrode wiring, it is possible to provide a projector having improved reliability.

EIGHTH EMBODIMENT

Next, the eighth embodiment of the light source apparatus according to the present invention will be described with reference made to FIG. 22A and FIG. 22B. Note that in the description of the eighth embodiment, component elements that are the same as component elements in the seventh embodiment are given the same descriptive symbols and any description thereof is either omitted or simplified.

FIG. 22A and FIG. 22B are schematic structural views showing a light source apparatus 240 according to the eighth embodiment. FIG. 22B shows a front view thereof while FIG. 22A is a cross-section view take along the line A-A' in FIG. 22B. As is shown in these drawings, in the light source apparatus according to the eighth embodiment, two insulating layers 204 are placed at both ends of the light emitting chip 202, and the upper electrodes 205 that extend from each insulating layer 204 are connected to a vicinity of end portions of the light emitting chip 202 via respective bumps 222. As a result of the upper electrodes 205 being connected to both ends of the light emitting chip 202 in this manner, it is possible to reduce the quantity of current that is flowing through each upper electrode 205. According to the light source apparatus 204 according to this eighth embodiment, because the electrical resistance of the upper electrode 205 as a whole can be reduced more than in the light source apparatus according to the eighth embodiment, it is possible to more reliably prevent wire breakages in the upper electrode 205.

NINTH EMBODIMENT

Next, the light source apparatus according to the ninth embodiment of the present invention will be described with reference made to FIG. 23A and FIG. 23B. Note that in the description of the ninth embodiment as well, component elements that are the same as component elements in the seventh embodiment are given the same descriptive symbols and any description thereof is either omitted or simplified.

Figure 23A:
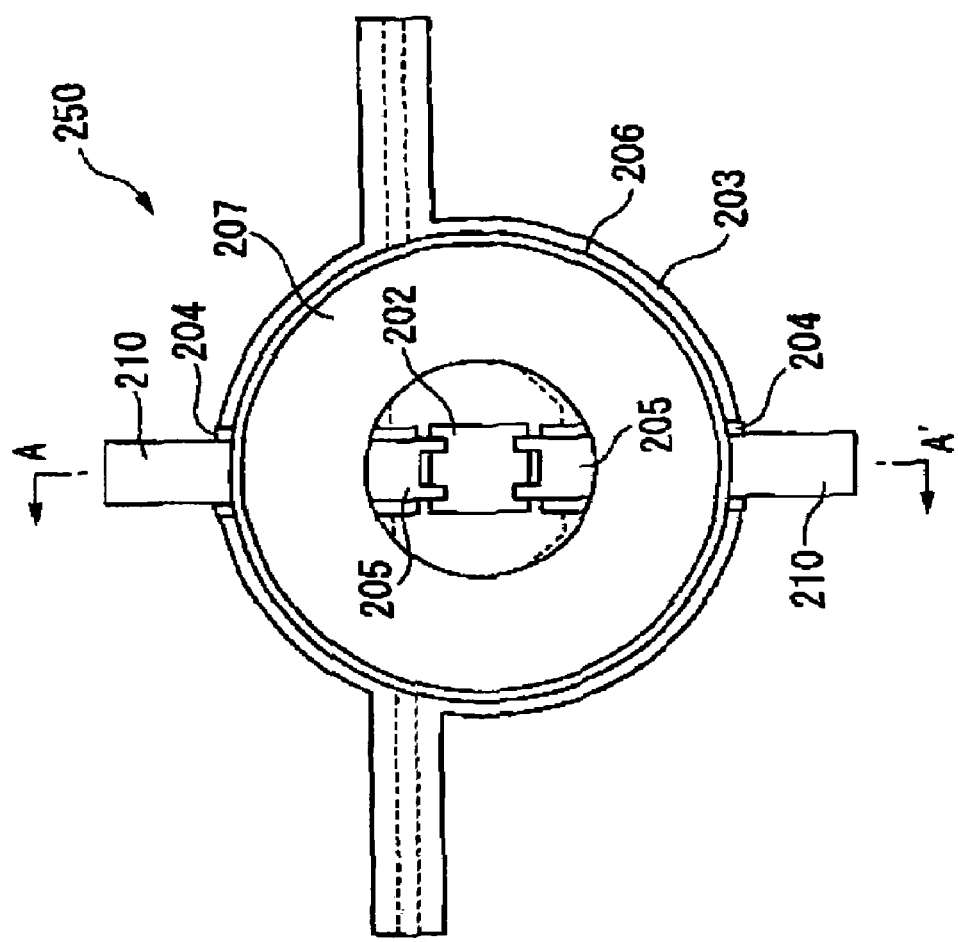
FIGS. 23A and 23B are schematic structural views of a light source apparatus according to the ninth embodiment of the present invention.
Figure 23B:
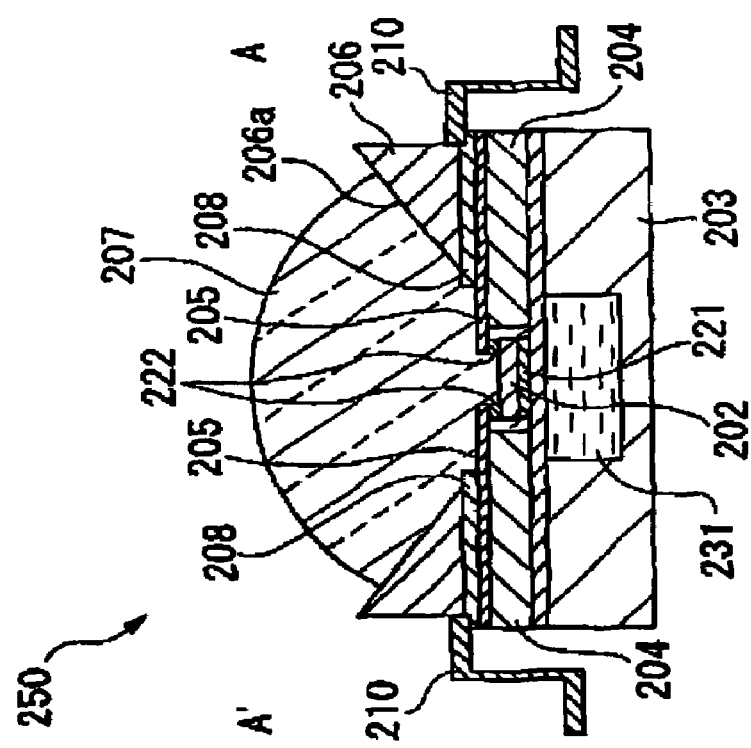

FIG. 23A and FIG. 23B are schematic views showing a light source apparatus 250 according to the ninth embodiment. FIG. 23B shows a front view thereof while FIG. 23A is a cross-sectional view taken along the line A-A' in FIG. 23B. As is shown in these drawings, in the light source apparatus 250 according to the ninth embodiment, two insulating layers 204 and upper electrodes 205 are placed at both ends of the light emitting chip 202, and furthermore, the upper electrodes 205 that extend from the top surfaces of the insulating layers 204 are further divided into a plurality of electrodes, and each of these is connected to the top surface of the light emitting chip 202. According to the light source apparatus 250 according to this ninth embodiment, the overall electrical resistance of the upper electrode 205 is greater than in the light source apparatus 240 described in the eighth embodiment, however, because the portion of the light emitting area of the light emitting chip 202 that is covered by the upper electrode 205 is small, it is possible to provide a light source apparatus that has even more excellent light generating characteristics.

TENTH EMBODIMENT

Next, the light source apparatus according to the tenth embodiment of the present invention will be described with reference made to FIG. 24A and FIG. 24B. Note that in the description of the tenth embodiment as well, component elements that are the same as component elements in the seventh embodiment are given the same descriptive symbols and any description thereof is either omitted or simplified.

FIG. 24A and FIG. 24B are schematic structural views showing a light source apparatus 260 according to the tenth embodiment. FIG. 24B shows a front view thereof while FIG. 24A is a cross-sectional view taken along the line A-A' in FIG. 24B. As is shown in these drawings, the light source 260 according to the tenth embodiment is a flip chip packaged type of light source apparatus that emits either blue light or green light.

A wiring substrate 266 that is formed by stacking an insulating layer 261 and a conductive layer 262 (i.e., a second electrode) is placed on the base 203. The wiring substrate 266 has a thickness such that a top surface thereof is positioned below a bottom surface of a light emitting chip 263. In addition, the light emitting chip 263 according to the present embodiment is packaging by what is known as flip chip packaging on the base 203. Specifically, the light emitting chip 263 has a bump 264 that is physically and electrically connected with the base 203, and a bump 265 that is physically and electrically connected with the conductive layer 262, and the light emitting chip 263 is supported above the base 203 by the bumps 264 and 265.

This light emitting chip 263 emits blue light or green light upon being energized, and is formed by growing GaInN based compound semiconductor crystals on the surface of a substrate such as sapphire ($Al_2O_3$) or the like. It is also preferable that a double hetero-junction structure is employed in which a light emitting layer formed from InGaN is inserted between a cladding layer formed from n-GaN and a cladding layer formed from p-GaN.

A connecting material 203 is placed on top of the conductive layer 262, and an insulating spacer 209 that has substantially the same top as the top surface of the connecting material 208 is placed on the base 203, and a toroidal reflecting mirror 206 (i.e., a reflective portion) is formed on the connecting material 208 and the spacer 209 so as to surround the light emitting chip 263.

The base 203 and the conductive layer 262 of the substrate 266 are connected to a power supply (not shown), and the light emitting chip 263 generates light and heat upon being energized via the base 203 and the conductive layer 262 of the wiring substrate 266. Namely, in the tenth embodiment, the base 203 and the conductive layer 262 have the function of electrodes as they inject current into the light emitting chip 263.

In the light source apparatus 260 according to this tenth embodiment as well, because the conductive layer 262 is energized via the reflecting mirror 206, it is possible to achieve the same effects as in the light source apparatus 201 according to the above described seventh embodiment.

ELEVENTH EMBODIMENT

Next, a light source apparatus 270 according to the eleventh embodiment of the present invention will now be described with reference made to FIG. 25A and FIG. 25B. Note that, in the description of the eleventh embodiment, a description of portions that are the same as in the tenth embodiment is either omitted or simplified.

FIG. 25A and FIG. 25B are schematic structural views showing a light source apparatus 270 according to the eleventh embodiment. FIG. 25B shows a front view thereof while FIG. 25A is a cross-sectional view taken along the line A-A' in FIG. 25B. As is shown in these drawings, a concave portion 234 in which the wiring substrate 266 is embedded is formed in a top portion of the base 203 of the light source apparatus 270 according to the eleventh embodiment. As a result of the wiring substrate 266 being embedded in this concave portion 234, the top surface of the conductive layer 262 and the top surface of the base 203 have the same height.

According to the light source apparatus 270 according to this eleventh embodiment, because the top surface of the conductive layer 262 and the top surface of the base 203 have the same height, the light emitting chip 263 can be easily placed horizontally. In addition, according to the light source apparatus 270 according to the eleventh embodiment, because it is possible to reduce the thickness of the bump 264 so that the light emitting chip 263 is close to the base 203, it is possible to provide a light source apparatus having an improved cooling efficiency of the light emitting chip 263.

TWELFTH EMBODIMENT

Next, a light source apparatus 280 according to the eleventh embodiment of the present invention will now be described with reference made to FIG. 26A and FIG. 26B. Note that, in the description of the twelfth embodiment, a description of portions that are the same as in the eleventh embodiment is either omitted or simplified.

FIG. 26A and FIG. 26B are schematic structural views showing a light source apparatus 280 according to the twelfth embodiment. FIG. 26B shows a front view thereof while FIG. 26A is a cross-section view taken along the line A-A' in FIG. 26B. As is shown in the drawings, in the light source apparatus 280 according to the twelfth embodiment, a wiring substrate 266 is placed at each end of the light emitting chip 263, and the conductive layer 262 of each wiring substrate 266 is connected to the light emitting chip 263 via the respective bumps 265.

By connecting the conductive layers 262 to both ends of the light emitting chip 263 in this way, it is possible to reduce the amount of current flowing in each conductive layer 262, and it becomes possible to more reliably prevent wire breakages of the electrode wiring.

THIRTEENTH EMBODIMENT (Light Source Apparatus)

Figure 27A:
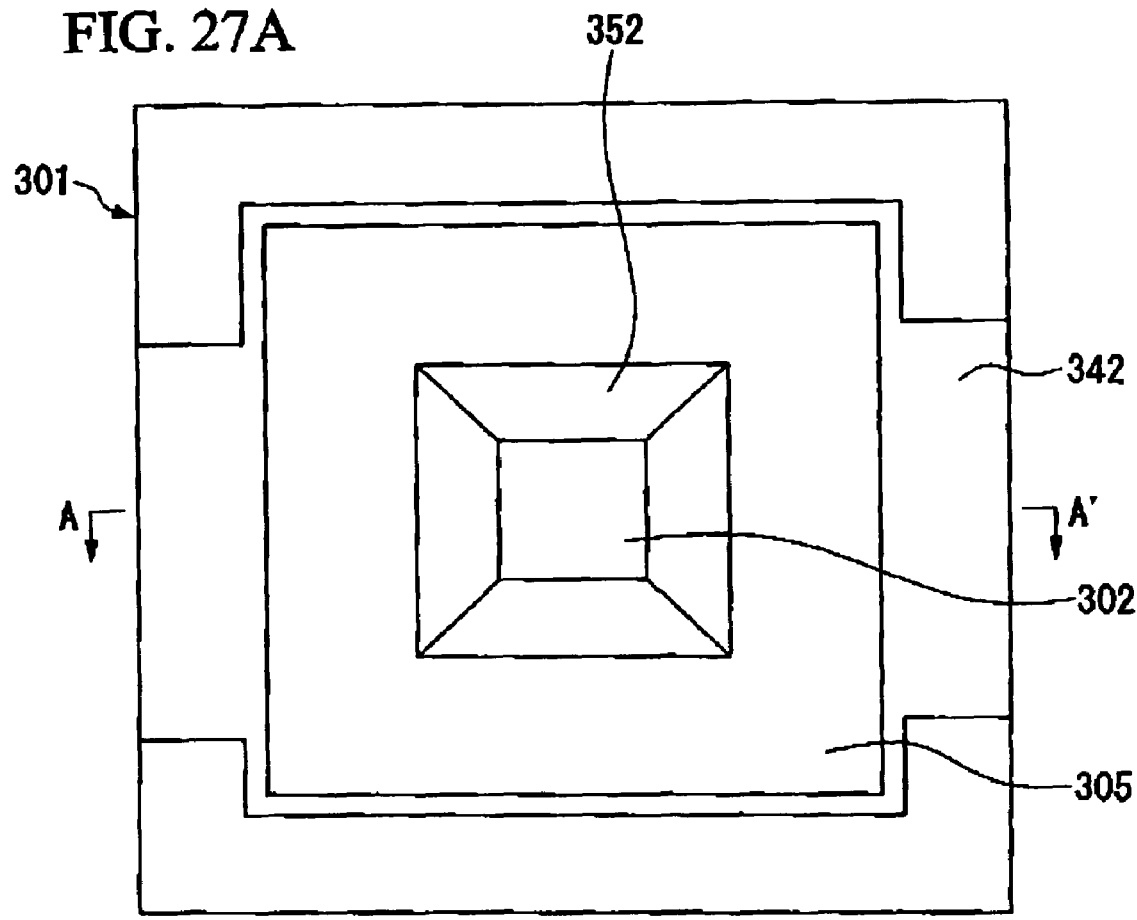
FIGS. 27A and 27B are schematic structural views of a light source apparatus according to the thirteenth embodiment of the present invention.
Figure 27B:
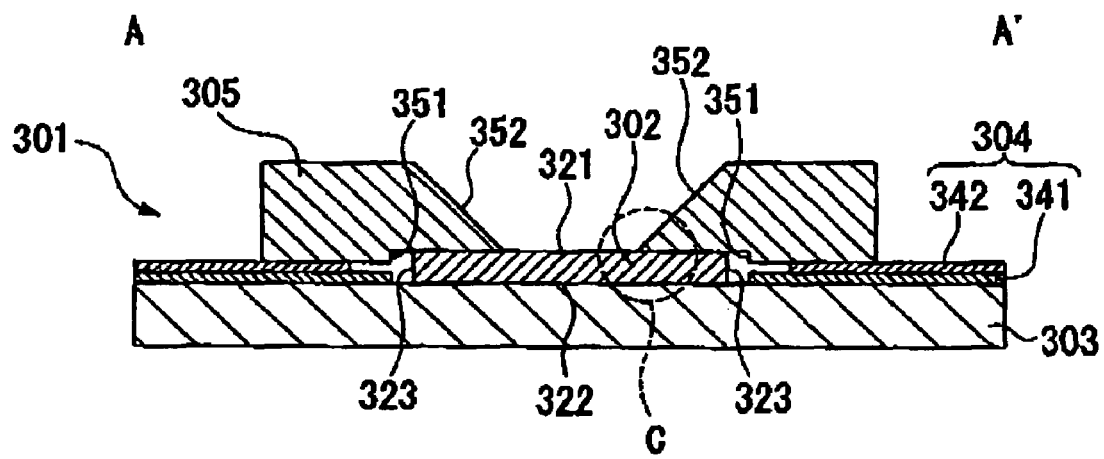

FIG. 27A and FIG. 27B are schematic structural views showing a light source apparatus 301 according to the thirteenth embodiment. FIG. 27A shows a plan view thereof while FIG. 27B is a cross-sectional view taken along the line A-A' in FIG. 27A. As is shown in FIG. 27A and FIG. 27B, the light source apparatus 301 of the thirteenth embodiment is provided with a light emitting chip 302 that generates light upon being energized. The light source apparatus 301 emits generated light from the light emitting chip 302 in a front surface direction, which is the direction faced by the top surface 321 (i.e., the front surface) of the light emitting chip 302.

The light emitting chip 302 is directly packaged on (i.e., supported by) a base 303 that is formed by a conductive member made, the example, from copper or the like. This base 303 is connected with a bottom surface 322 of the light emitting chip 302 via a conductive adhesive agent such as, for example, silver paste, and is used as a lower electrode (i.e., first electrode) that is used for applying current to the light emitting chip 302.

A flexible substrate 304 is placed on top of the base 303 so as to surround the light emitting chip 302. This flexible substrate 304 is constructed so as to be provided with an insulating layer 341 and the conductive layer 342 that is placed on top of the insulating layer 341. A state of insulation between the conductive layer 342 and the base 303 is secured by the insulating layer 341.

A conductive member 305 (i.e., a light blocking device) is placed on the flexible substrate 304 so as to run alongside an outer peripheral portion of the top surface 321 of the light emitting chip 302. The conductive member 305 is placed so as to overhang the outer peripheral portion of the light emitting chip 302 and prevents generated light that is emitted from the side surfaces 323 of the light emitting chip 302 from being emitted directly in the aforementioned front surface direction.

Moreover, a surface 351 of the conductive member 305 in the vicinity of the light emitting chip 302 undergoes a surface processing such that it reflects at least a portion of the generated light that is emitted from the side surfaces of the light emitting chip 302.

Note that the conductive member 305 may be formed from a material having conductivity and, for example, can be formed using copper or aluminum.

Figure 28:
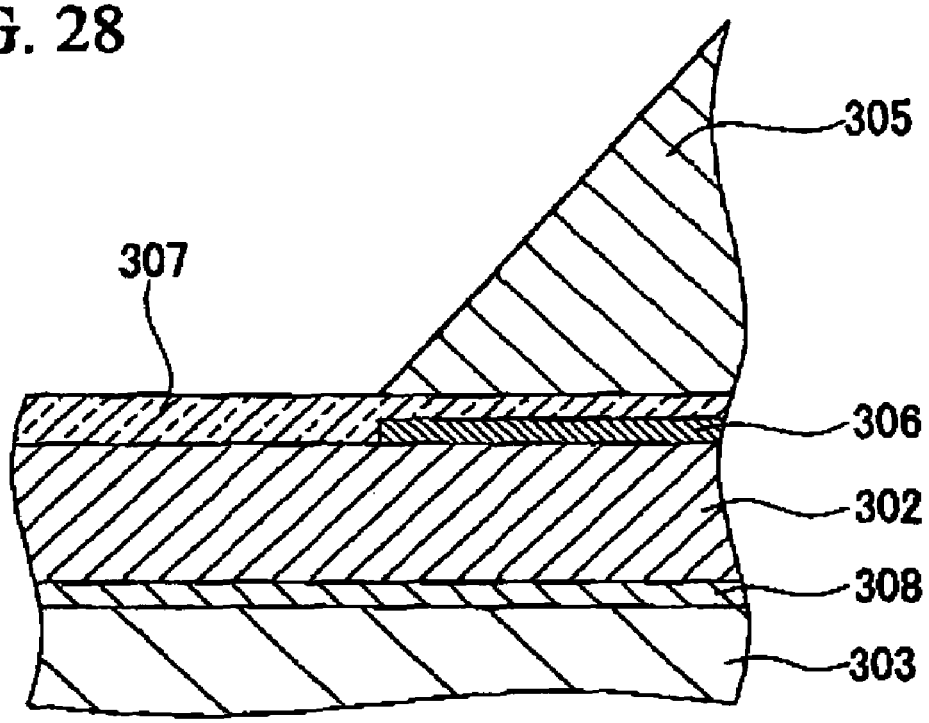
FIG. 28 is an enlarged view of the C portion in FIG. 27B.

FIG. 28 is an enlarged view of a portion A in FIG. 27B. As is shown in this drawing, an upper electrode 307 (i.e., a second electrode) that is formed from a conductive material having transparency is placed over the entire top surface 321 of the light emitting chip 302. Indium tin oxide (ITO) and the like can be used as the conductive material having transparency to form the upper electrode 307. As is shown in FIG. 28, the upper electrode 307 is connected to the conductive member 305. In addition, an insulating member 306 is placed between the upper electrode 307 and the light emitting chip 302 in the portion thereof where the conductive member 305 is connected. Furthermore, the conductive member 305 is connected to a conductive layer 342 of the flexible substrate 304. The light emitting chip 302 generates light upon being energized via the upper electrode 307 and the base 303, which serves as a lower electrode.

Returning to FIG. 27A and FIG. 27B, a side surface on the light emitting chip 302 side of the conductive material 305 forms sloping surfaces 352 (i.e., reflectors) that slope from the outside towards the inside of the light emitting chip 302. The sloping surfaces 352 are constructed as reflecting surfaces that are formed on an angle such that generated light that is emitted obliquely from the top surface 321 of the light emitting chip 302 is guided in the front surface direction. In this way, in the light source apparatus 301 of the thirteenth embodiment, the reflector and the conductive member of the present invention are formed integrally. Accordingly, according to the light source apparatus 301 of the thirteenth embodiment, it is necessary to install a new member as the reflector of the present invention.

A reflective film 308 that is formed from a conductive material is placed on a bottom surface 322 (i.e., the surface opposite the top surface 321 of the light emitting chip 302) of the light emit chip 302 as is shown in FIG. 28. Namely, in the thirteenth embodiment, the light emitting chip 302 is connected to the base 303, which is the lower electrode, via a conductive adhesive agent and the reflective membrane 308.

The light emitting chip 302 is a diode (LED) that generates light when current is supplied to p-n junction portion thereof. In homo-junction types of LED in which identical semiconductor materials are bonded together, because there are no barriers against carriers injected into the light emitting portion, the carriers spread to the diffusion length inside the semiconductors. In contrast to this, in hetero-junction types of LED in which different semiconductor materials are bonded together, because barriers against carriers are incorporated in the structure, it is possible to greatly increase the density of carriers injected into the light emitting portion. In particular, in a double hetero-junction type of LED in which a light emitting layer is inserted between cladding layers, the narrower the light emitting layer the more the carrier density can be increased, and the internal quantum efficiency can be improved. On the other hand, in a homo-junction type of LED, because the material that is in contact with the exterior is the same as the material of the light emitting portion, the light generation ends up being absorbed by its own material. In contrast, in a double junction type of LED, because a light emitting layer formed from a material having a narrow bandgap is inserted between cladding layers formed from a material having a wide bandgap, it is possible to reduce self-absorption and improve the light acquisition efficiency. Accordingly, it is desirable that a double hetero-junction type of LED that has excellent light generating efficiency is used.

If a light emitting chip that emits red generated light is used as the light emitting chip 302, then this is formed by growing AlGaInP based compound semiconductor crystals on a substrate such as gallium arsenide (GaAs) or the like. Note that there is a limit as to how far the light acquisition efficiency of the LED can be improved in order for the GaAs substrate to absorb visible light. Therefore, in the light emitting chip 302 of the present embodiment, it is desirable that the GaAs substrate is removed after the semiconductor crystals have been grown thereon, and then a gallium phosphate (GaP) substrate that is transparent in the light emission wavelength is adhered onto the GaAs substrate by applying high temperature and pressure. A double hetero-junction structure is then employed in which an AlGaInP light emitting layer is inserted between a cladding layer performed by n-GaP and a cladding layer formed by p-GaP.

If a light emitting chip that emits blue generated light or green generated light is used as the light emitting chip 302, then this is formed by growing GaInN based compound semiconductor crystals on the surface of a substrate such as sapphire ($Al_2O_3$) or the like. In addition, it is preferable that a double hetero-junction structure is employed in which a light emitting layer formed from InGaN is inserted between a cladding layer formed from n-GaN and a cladding layer formed from p-GaN.

In the light source apparatus 301 of the thirteenth embodiment having the above described structure, generated light is emitted from the light emitting chip 302 when the light emitting chip 302 is energized via the base 303 and the upper electrode 307.

Here, generated light that is emitted from side surfaces 323 of the light emitting chip 302 is prevented from being emitted directly in the front surface direction by the conductive member 305. As a result, because it is possible to remove stray light components, which are difficult to turn into parallel light, that are included in the illumination light, the brightness distribution of generated light (i.e., illumination light) that is emitted from the light source 301 can be made uniform.

Moreover, a surface 351 of the conductive member 305 in the vicinity of the light emitting chip 302 undergoes a surface processing such that it reflects at least a portion of the generated light that is emitted from the side surfaces of the light emitting chip 302. Accordingly, in the conductive member 305, it is possible to suppress the absorption of generated light that is emitted from the side surfaces 323 of the light emitting chip 302 by the conductive member 305, and is possible to suppress temperature increases of the light source apparatus 301.

As a result, it is possible to prevent any reduction in the light generating efficiency of the light emitting chip 302, and it is possible to drive the light emitting chip 302 using a larger current. It is also possible to obtain a larger quantity of light from the light source apparatus 301. Note that it is possible to recycle generated light that has been reflected by the front surface 351 of the conductive member 305 in the vicinity of the light emitting chip 302 by installing a mirror (i.e., a recycling device) that, by reflecting generated light that has been reflected by the surface 351 of the conductive member 305 in the vicinity of the light emitting chip 302, changes this light into generated light that is able to be changed into parallel light, and reflects it indirectly in the front surface direction. By employing the structure, it is possible to improve the extraction efficiency of generated light in the light source apparatus 301.

Here, current is applied to the upper electrode 307 via the conductive member 305. Because this type of conductive member 305 has a considerably broader cross-sectional area than the bonding wire provided in a conventional light source apparatus, it is possible to supply a larger current. Accordingly, according to the light source apparatus 301 of the thirteenth embodiment, it is possible to drive the light emitting chip 302 using a large current, so that the amount of light generated by the light source apparatus 301 is greater. Moreover, in the light source apparatus 301 according to the thirteenth embodiment, current is applied to the upper electrode 307 via the electrode member 305 instead of via a bonding wire, as is described above. Namely, the bonding wire that is conventionally placed on the optical path of generated light is not provided in this case. As a result is possible to prevent the brightness distribution of illumination light from becoming non-uniform.

Furthermore, in the light source apparatus 301 of the thirteenth embodiment, as is described above, generated light that is emitted from the side surface 323 of the light emitting chip 302 is prevented from being emitted directly in the front surface direction using the conductive member 305.

Therefore, it is possible to prevent generated light that is emitted from the side surface 323 of the light emitting chip 302 from being emitted directly in the front surface direction without having to provide a new separate member as the light blocking device of the present invention.

In the light source apparatus 301 of the thirteenth embodiment, because the base 303 is formed from a metal material having a high conductivity (Cu) and is used as the first electrode, the quantity of heat from the light emitting chip 302 can be efficiently discharged via the base 303. As a result, because it is possible to suppress temperature increases in the light emitting chip 302, the amount of light generated by the light source apparatus 301 is greater.

Furthermore, according to the light source apparatus 301 of the thirteenth embodiment, the upper electrode 307 is placed over the entire top surface 321 of the light emitting chip 302. Therefore, current is applied uniformly to the top surface 321 of the light emitting chip 302, and it is possible to obtain generated light having a uniform brightness distribution from the light emitting chip 302. Accordingly, the brightness distribution of illumination light of the light source apparatus 301 of the thirteenth embodiment is made more uniform.

In the light source apparatus 301 of the thirteenth embodiment, an insulating member 306 is placed between the upper electrode 307 and the light emitting chip 302 in the portion thereof where the conductive member 305 is connected. Therefore, the amount of current that is applied to outer peripheral of the light emitting chip 302 that are covered by the conductive member 305 portions (i.e., portions that are shielded from light by the conductive member 305) can be reduced, and a larger current can be applied to a center portion of the light emitting chip 302 that is not covered by the conductive member 305. Accordingly, according to the light source apparatus 301 of the thirteenth embodiment, it is possible to reduce the amount of light in the outer peripheral portions of the light emitting chip 302 where the generated light is shielded by the conductive member 305, and to increase the generated light that is emitted from the center portion of the light emitting chip 302 that is used as the illumination source of the light source apparatus 301. Accordingly, it is possible to prevent any deterioration in the extraction efficiency of the generated light.

Moreover, generated light that is emitted in the front surface direction from among the generated light that is emitted from the light emitting chip 302 is emitted in the front surface direction in its existing condition. Generated light that is emitted in an oblique direction from among the generated light that is emitted from the light emitting chip 302 is reflected by the sloping surfaces 352 of the conductive member 305 that is formed as a reflector so as to be changed into parallel light and emitted in the front surface direction. Generated light that is wave guided inside the light emitting chip 302 and is emitted from the bottom surface of the light emitting chip from among the generated light that is emitted from the light emitting chip 302 is reflected by the reflective membrane 308 that is placed on the bottom surface 322 of the light emitting chip 302, and is again wave guided inside the light emitting chip 302 and is emitted in the front surface direction.

In this way, in the light source apparatus 301 of the thirteenth embodiment, because the reflective membrane 308 is placed on the bottom surface 322 of the light emitting chip 302, it is possible to improve the extraction efficiency of generated light.

According to the light source apparatus 301 of the thirteenth embodiment having the above described structure, the brightness distribution of illumination light is made uniform by the above described variety of structures, and illumination light that has been changed into parallel light is emitted. As a result, a light source apparatus is provided that is suitable for the light source of a projector.

Figure 29:
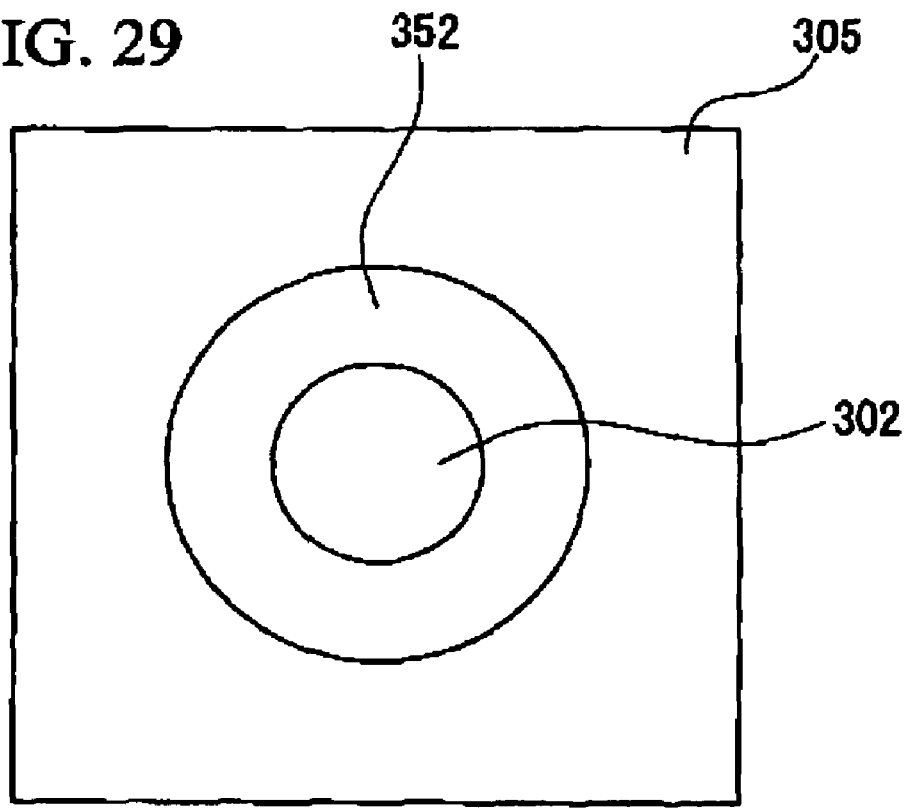
FIG. 29 is a variant example of the light source apparatus in the thirteenth embodiment of the present invention.

Note that, in the thirteenth embodiment, as is shown in FIG. 27A, a structure is employed in which the conductive member 305 has four sloping surfaces 352. However, the present invention is not limited to this and it is possible, for example, as is shown in FIG. 29, to employ a structure having a mortar-bowl shaped conductive member in which the configuration of the sloping surface 352 is circular when seen in plan view.

(Projector)

The structure of the projector in the present embodiment is fundamentally the same as the projector of the first embodiment shown in FIG. 5.

Here, according to the light source apparatus of the present embodiment, because generated light that is emitted from side surfaces of a light emitting chip is blocked, it is possible to remove stray light components that are included in the illumination light, and the brightness distribution of generated light can be made uniform. As a result, it is possible to provide a projector having excellent display characteristics.

FOURTEENTH EMBODIMENT

Next, the fourteenth embodiment of the present invention will be described with reference made to FIG. 30 and FIG. 31. Note that in the description of the fourteenth embodiment any description of portions that are the same as in the thirteenth embodiment is either omitted or simplified. In addition, the light source apparatus of the fourteenth embodiment is constructed by providing the light source apparatus of the thirteenth embodiment with a further optical element.

Figure 30:
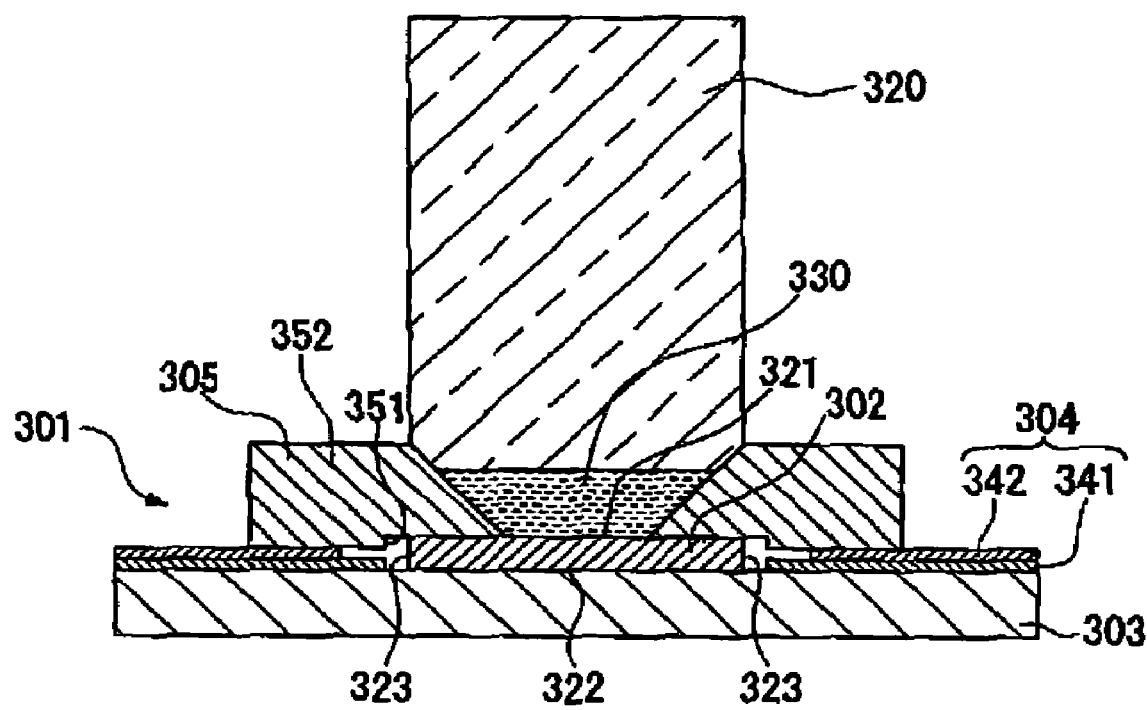
FIG. 30 is a schematic structural view of a light source apparatus of the fourteenth embodiment of the present invention.

FIG. 30 is a cross-sectional view showing the schematic structure of an example of the light source apparatus of the fourteenth embodiment. As is shown in the drawing, the light source apparatus shown in FIG. 30 is provided with a rod lens 320 (i.e., an optical element) that is connected to the conductive member 305 and is placed in the front surface direction of the light emitting chip 302. The gap between the rod lens 320 and the light emitting chip 302 is filled with an insulating liquid having transparency in the form of silicon oil 330.

According to a light source apparatus 301 such as that shown in the fourteenth embodiment, by placing the conductive member 305 around the light emitting chip 302, the light source apparatus 301 itself can be formed as a solid object. Accordingly, as in the case of the light source apparatus of the fourteenth embodiment, a light source apparatus can be obtained that is further provided with an optical element by connecting the optical element to the conductive member 305.

This type of optical element is conventionally placed as a component member on the projector side and the light source apparatus and the optical element of placed apart. Accordingly, by using the light source apparatus of the fourteenth embodiment in which an optical element is connected to the conductive member 305 as the light source for a projector, as is the case with the light source apparatus of the fourteenth embodiment, it is possible to shorten the optical path of illumination light (i.e., of generated light), and it is possible to reduce the size of the projector.

Moreover, because the optical path from the light emitting chip 302 to the optical element is shortened, the portion of the optical path of the generated light (i.e., of the illumination light) that is in air is shortened and it is possible to reduce generated light loss. Accordingly, in the light source apparatus that is provided with an optical element, it is possible to improve the extraction efficiency of generated light.

Furthermore, by using the rod lens 320 as the optical element, as is shown in FIG. 30, it is possible to make the brightness distribution of illumination light that is emitted from the light source apparatus even more uniform. Moreover, by filling the gap between the rod lens 320 and the light emitting chip 302 with the silicon oil 330, it is possible to further suppress the loss of generated light in the gap between the light emitting chip 302 and the rod lens 320, and it becomes possible to further improve the extraction efficiency of generated light.

Figure 31:
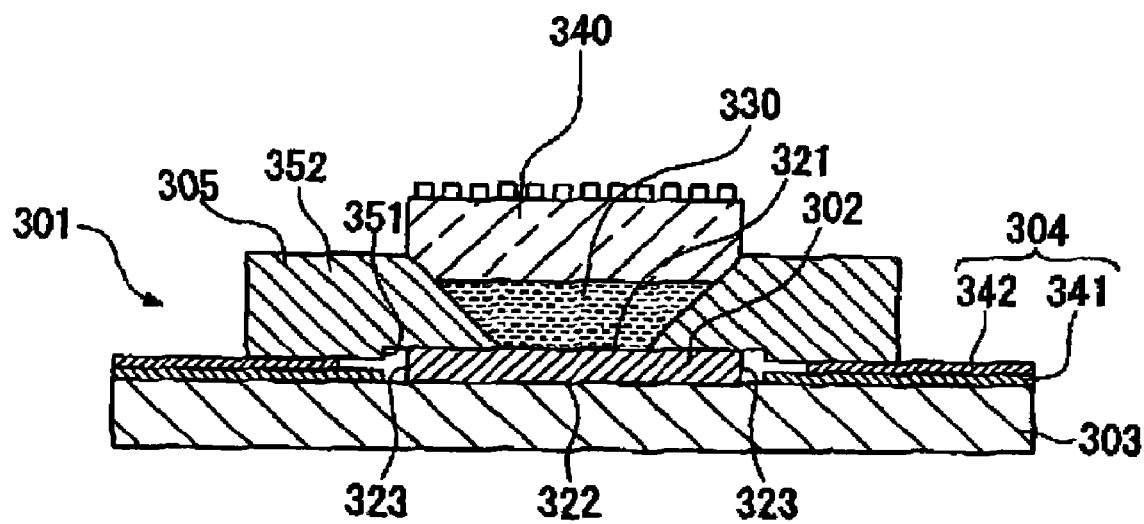
FIG. 31 is a schematic structural view of a light source apparatus of the fourteenth embodiment of the present invention.

FIG. 31 is a cross-sectional view showing the schematic structure of another example of the light source apparatus of the fourteenth embodiment. As is shown in this drawing, the light source apparatus shown in FIG. 31 is provided with an inorganic polarization plate 340 (i.e., an optical element) that is connected to the conducive member 305 and is placed in the front surface direction of the light emitting chip 302. The gap between the inorganic polarization plate 340 (i.e., the optical element) and the light emitting chip 302 is filled with silicon oil 330.

According to the light source apparatus shown in FIG. 31 having the above described structure, the effects of the light source apparatus provided with an optical element such as that described above are achieved. In addition, because the polarization plate 340 is used as the optical element, it is possible to emit only illumination light of a predetermined polarization component.

Moreover, in a projector that uses a light source apparatus having this type of polarization plate 340, for example, it is possible to do away with the polarization plate on the illumination light entry side from among the polarization plates that are conventionally installed in a liquid crystal light bulb that is used as an optical modulator.

FIFTEENTH EMBODIMENT

Next, the fifteenth embodiment of the present invention will be described with reference made to FIG. 32 and FIG. 33. Note that in the description of the fifteenth embodiment any description of portions that are the same as in the fourteenth embodiment is either omitted or simplified. The light source apparatus of the fifteenth embodiment is constructed by providing a cooling device that supplies a coolant X between the optical element (i.e., the rod lens 320 or the polarization plate 340) and the light emitting chip 302 to the light source apparatus of the fourteenth embodiment.

Figure 32:
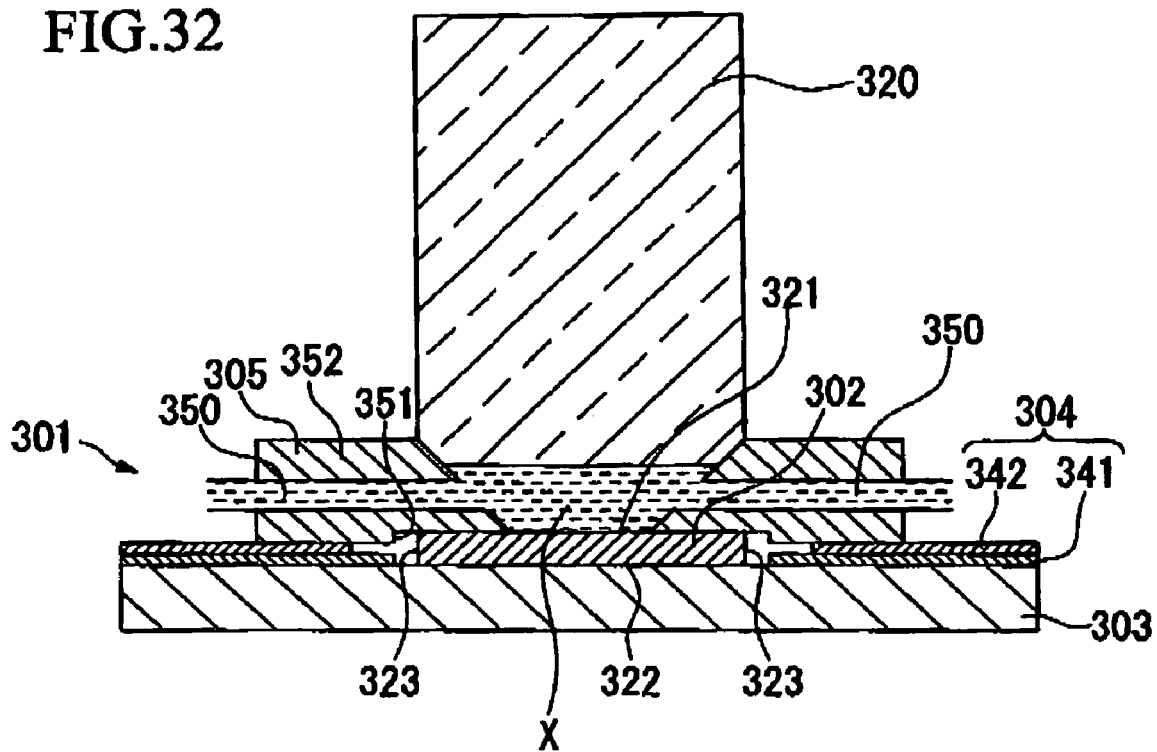
FIG. 32 is a schematic view of a light source apparatus of the fifteenth embodiment of the present invention.
Figure 33:
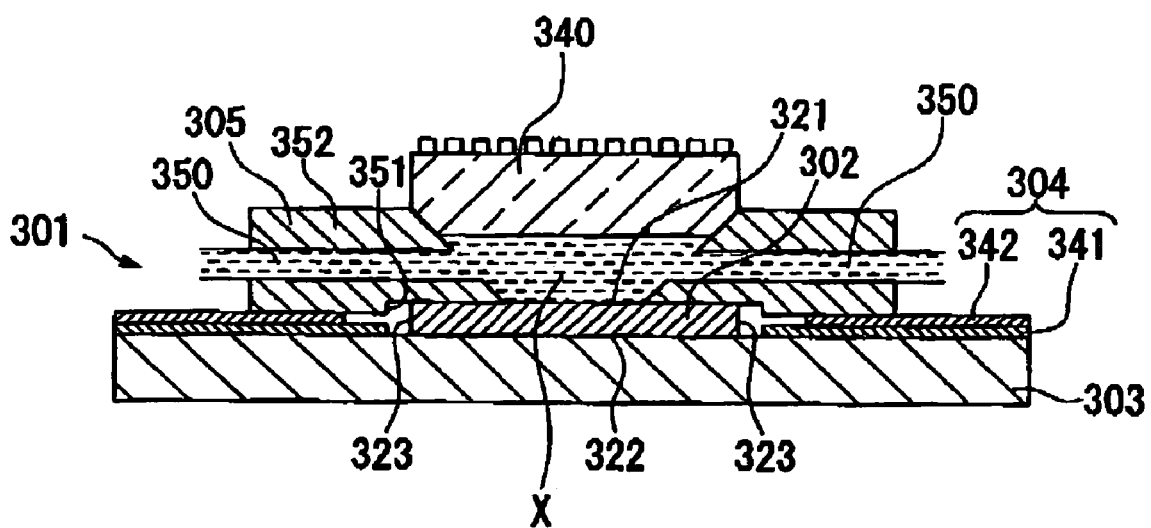
FIG. 33 is a schematic structural view of a light source apparatus of the fifteenth embodiment of the present invention.

As is shown in FIG. 32 and FIG. 33, in the light source apparatus of the fifteenth embodiment, a passage 350 is formed in the conductive member 305. This passage 350 is connected with a heat exchanger (not shown) and a circulation pump (not shown). A coolant X circulates around a circulation path that is formed by the passage 350, the heat exchanger, and the circulation pump. Note that, in the fifteenth embodiment, the cooling device of the present invention is constructed so as to be provided with the passage 350, the heat exchanger, and the circulation pump.

According to the light source apparatus of the fifteenth embodiment having the above described structure, the light emitting chip 302 is positively cooled by the coolant X. As a result, the light emitting chip 302 can be driven by an even greater current and it is possible to provide a light source apparatus that enables an even brighter illumination light to be obtained.

While preferred embodiments of the light source apparatus and projector according to the present invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

For example, in the above described embodiments, a liquid crystal light bulb is used as the optical modulator in the projector. However, the present invention is not limited to this, and it is also possible to use a micro mirror array device and the like as the optical modulator.

What is claimed is:

1. A light source apparatus comprising:
   a first electrode which is a base;
   a second electrode which is a conductive layer;
   a wiring substrate formed by stacking an insulating layer and the conductive layer, and arranged on the base;
   a light emitting chip packaged on the base directly, generating light and heat when energized via the first electrode and the second electrode; and
   a passage formed inside the base, through which a coolant flows.

2. A light source apparatus according to claim 1, further comprising a plurality of the wiring substrates.

3. A light source apparatus according to claim 1, wherein the second electrode is connected to the vicinity of an end portion of the light emitting chip.

4. A light source apparatus according to claim 1, wherein the light emitting chip has connecting terminals which are connected to both the first electrode and the second electrode.

5. A light source apparatus comprising:
   a first electrode which is a base;
   a second electrode;
   a light emitting chip which is inserted between the first electrode and the second electrode, packaged on the base directly, generating light and heat when energized via the first electrode and the second electrode;
   a passage formed inside the base, through which a coolant flows; and
   an insulating layer which is placed on top of the base, having substantially the same thickness as the thickness of the light emitting chip,
   wherein the second electrode extends from a top surface of the insulating layer and is connected to a top surface of the light emitting chip.

6. A light source apparatus according to claim 5, wherein the second electrode has substantially the same width as the width of the light emitting chip.

7. A light source apparatus according to claim 5, further comprising:
   a plurality of the second electrodes; and
   a plurality of insulating layers.

8. A light source apparatus according to claim 5, wherein the second electrode is connected to the vicinity of an end portion of the light emitting chip.

9. A light source apparatus according to claim 5, wherein the base is formed from a metal material and is used as the first electrode.

10. A light source apparatus according to claim 5, wherein the light emitting chip has connecting terminals which are connected to both the first electrode and the second electrode.

11. A light source apparatus comprising:
- a first electrode;
- a second electrode which is a base formed from a conductive material;
- a light emitting chip packaged on the base, generating light and heat when energized via the first electrode and the second electrode; and
- a reflective portion which is formed from a conductive material, having a reflective surface that reflects light generated in the light emitting chip in a predetermined emission direction, through which the first electrode is energized;
- a connecting member physically and electrically connecting the first electrode and the reflective portion; and
- a passage formed inside the base through which a coolant flows.

12. A light source apparatus according to claim 11, further comprising:
- a wiring substrate formed by stacking an insulating layer; and
- a conductive layer formed on the base, wherein
- the first electrode is the conductive layer belonging to the wiring substrate.

13. A light source apparatus according to claim 12, further comprising a plurality of the wiring substrates.

14. A light source apparatus according to claim 11, wherein the second electrode is connected to a vicinity of an end portion of the light emitting chip.

* * * * *